(12) United States Patent
Yamazaki et al.

(10) Patent No.: US 11,610,997 B2
(45) Date of Patent: Mar. 21, 2023

(54) SEMICONDUCTOR MATERIAL AND SEMICONDUCTOR DEVICE HAVING A METAL ELEMENT AND NITROGEN

(71) Applicant: Semiconductor Energy Laboratory Co., Ltd., Atsugi (JP)

(72) Inventors: Shunpei Yamazaki, Setagaya (JP); Shota Sambonsuge, Matsudo (JP); Yasumasa Yamane, Atsugi (JP); Yuta Endo, Atsugi (JP); Naoki Okuno, Yamato (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 115 days.

(21) Appl. No.: 16/759,020

(22) PCT Filed: Nov. 15, 2018

(86) PCT No.: PCT/IB2018/058981
§ 371 (c)(1),
(2) Date: Apr. 24, 2020

(87) PCT Pub. No.: WO2019/102314
PCT Pub. Date: May 31, 2019

(65) Prior Publication Data
US 2021/0119052 A1    Apr. 22, 2021

(30) Foreign Application Priority Data

Nov. 24, 2017 (JP) .............................. JP2017-225439
Dec. 1, 2017 (JP) .............................. JP2017-231456
(Continued)

(51) Int. Cl.
*H01L 29/786*  (2006.01)
*H01L 27/108*  (2006.01)
*H01L 29/22*  (2006.01)

(52) U.S. Cl.
CPC .... *H01L 29/7869* (2013.01); *H01L 27/10805* (2013.01); *H01L 29/22* (2013.01)

(58) Field of Classification Search
CPC ......... H01L 21/02565; H01L 29/78693; H01L 29/66969; H01L 29/786; H01L 29/7869;
(Continued)

(56) References Cited

U.S. PATENT DOCUMENTS 9,530,856 B2    12/2016  Miyairi
9,865,712 B2    1/2018   Okamoto et al.
(Continued)

FOREIGN PATENT DOCUMENTS

CN      105849875 A    8/2016
JP      2011-058012 A  3/2011
(Continued)

OTHER PUBLICATIONS

International Search Report (Application No. PCT/IB2018/058981) dated Feb. 12, 2019.
(Continued)

*Primary Examiner* — Thanh Y. Tran
(74) *Attorney, Agent, or Firm* — Robinson Intellectual Property Law Office; Eric J. Robinson

(57) ABSTRACT

A semiconductor material is an oxide including a metal element and nitrogen, in which the metal element is indium (In), an element M (M is aluminum (Al), gallium (Ga), yttrium (Y), or tin (Sn)), and zinc (Zn) and nitrogen is taken into an oxygen vacancy or bonded to an atom of the metal element.

20 Claims, 36 Drawing Sheets

(30) Foreign Application Priority Data

Dec. 1, 2017 (JP) .............................. JP2017-231457
Dec. 1, 2017 (JP) .............................. JP2017-231531
Dec. 1, 2017 (JP) .............................. JP2017-231532

(58) Field of Classification Search
CPC ... H01L 29/22; H01L 27/1225; C23C 14/086; C23C 14/08
See application file for complete search history.

(56) References Cited

U.S. PATENT DOCUMENTS

| | | | |
|---|---|---|---|
| 9,917,209 B2 | 3/2018 | Endo et al. | |
| 10,236,389 B2 | 3/2019 | Endo et al. | |
| 10,446,671 B2 | 10/2019 | Okamoto et al. | |
| 10,522,397 B2 | 12/2019 | Endo et al. | |
| 2015/0187898 A1 | 7/2015 | Miyairi | |
| 2016/0260822 A1 | 9/2016 | Okamoto et al. | |
| 2017/0005203 A1 | 1/2017 | Endo et al. | |
| 2017/0098689 A1* | 4/2017 | Ikeda | H01L 27/3267 |
| 2017/0278874 A1* | 9/2017 | Yamazaki | H01L 29/7781 |
| 2018/0247958 A1* | 8/2018 | Yamazaki | H01L 29/7782 |
| 2018/0337289 A1* | 11/2018 | Yamazaki | H01L 29/78648 |
| 2019/0378918 A1 | 12/2019 | Okamoto et al. | |
| 2020/0266281 A1* | 8/2020 | Yamazaki | H01L 29/517 |

FOREIGN PATENT DOCUMENTS

| | | |
|---|---|---|
| JP | 2014-056945 A | 3/2014 |
| JP | 2015-018959 A | 1/2015 |
| JP | 2015-144251 A | 8/2015 |
| JP | 2016-167584 A | 9/2016 |
| JP | 2017-017320 A | 1/2017 |
| JP | 2017-034051 A | 2/2017 |
| KR | 2016-0102196 A | 8/2016 |
| TW | 201533903 | 9/2015 |
| TW | 201707215 | 2/2017 |
| WO | WO-2015/097633 | 7/2015 |
| WO | WO-2016/139548 | 9/2016 |

OTHER PUBLICATIONS

Written Opinion (Application No. PCT/IB2018/058981) dated Feb. 12, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest'10 : SID International Symposium Digest of Technical Papers, May 23, 2010, vol. 41, No. 1, pp. 626-629.

* cited by examiner

FIG. 5A
FIG. 5C
FIG. 5B
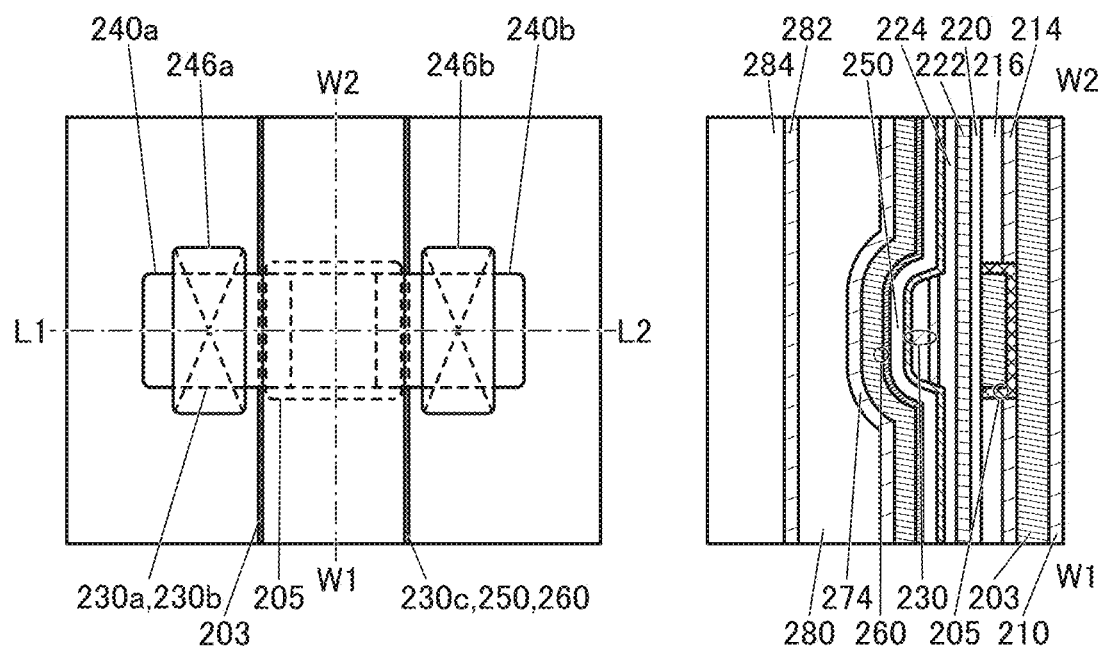
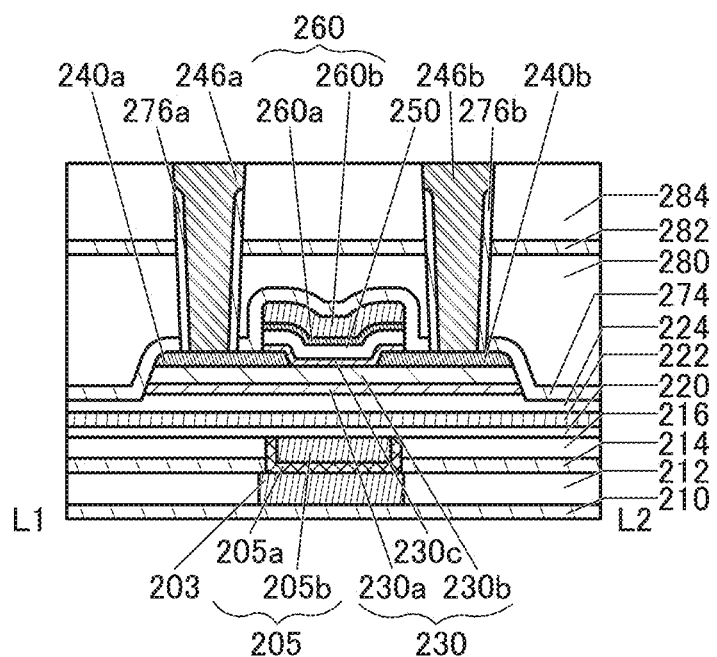

FIG. 10A
FIG. 10C
FIG. 10B
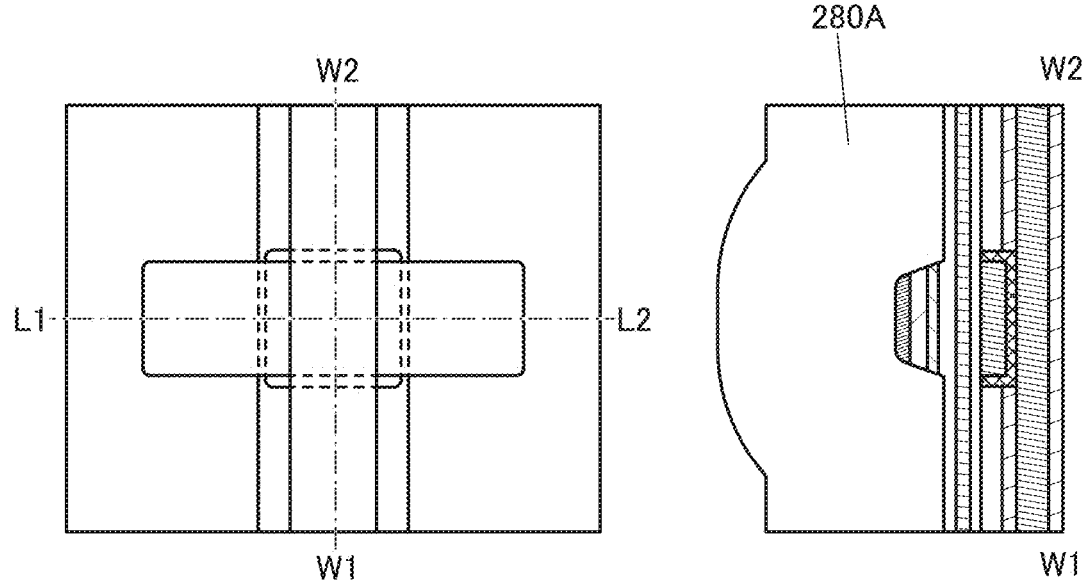
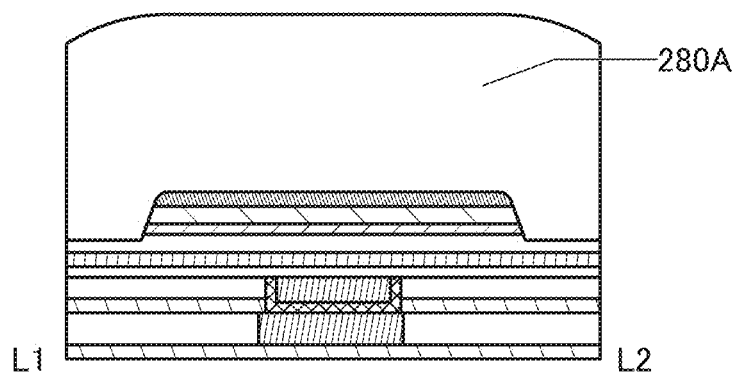

200

200

200

200

200

200

FIG. 24A
FIG. 24C
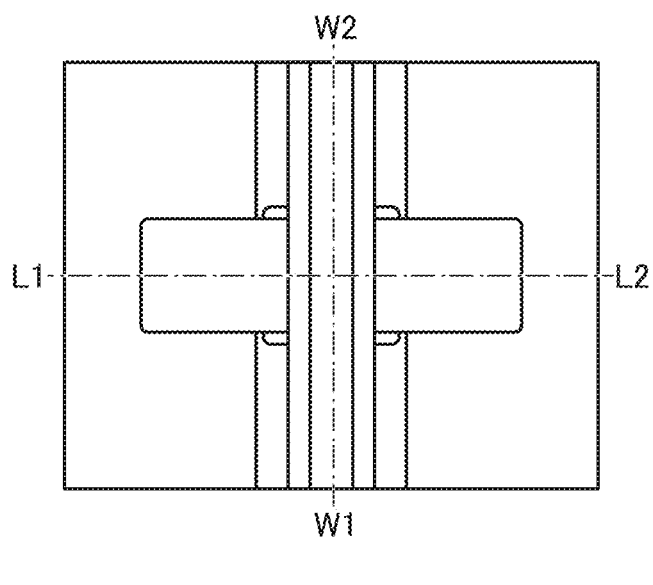
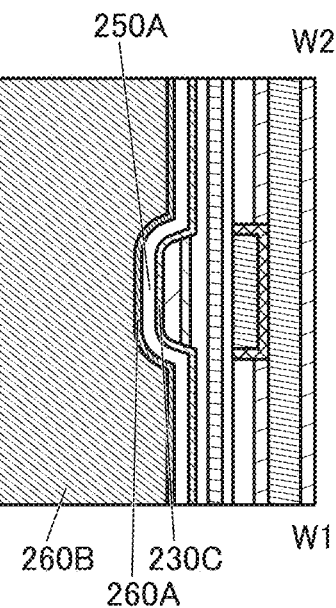
FIG. 24B
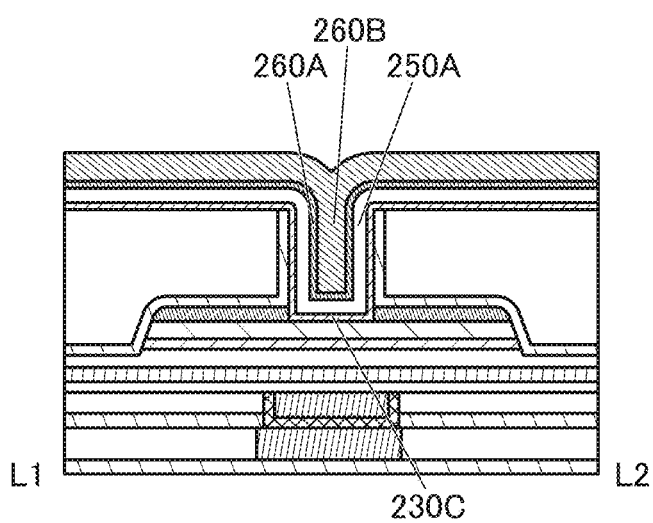

SEMICONDUCTOR MATERIAL AND SEMICONDUCTOR DEVICE HAVING A METAL ELEMENT AND NITROGEN

TECHNICAL FIELD

One embodiment of the present invention relates to a semiconductor material and a semiconductor device.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for fabricating a transistor using an oxide semiconductor having a CAAC structure is also disclosed. Moreover, Non-Patent Document 4 and Non-Patent Document 5 disclose that a fine crystal is included even in an oxide semiconductor which has lower crystallinity than an oxide semiconductor having the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

PRIOR ART DOCUMENTS

Non-Patent Documents

[Non-Patent Document 1] S. Yamazaki et al., "SID Symposium Digest of Technical Papers", 2012, volume 43, issue 1, p. 183-186.
[Non-Patent Document 2] S. Yamazaki et al., "Japanese Journal of Applied Physics", 2014, volume 53, Number 4S, p. 04ED18-1-04ED18-10.
[Non-Patent Document 3] S. Ito et al., "The Proceedings of AM-FPD'13 Digest of Technical Papers", 2013, p. 151-154.
[Non-Patent Document 4] S. Yamazaki et al., "ECS Journal of Solid State Science and Technology", 2014, volume 3, issue 9, p. Q3012-Q3022.
[Non-Patent Document 5] S. Yamazaki, "ECS Transactions", 2014, volume 64, issue 10, p. 155-164.
[Non-Patent Document 6] K. Kato et al., "Japanese Journal of Applied Physics", 2012, volume 51, p. 021201-1-021201-7.
[Non-Patent Document 7] S. Matsuda et al., "2015 Symposium on VLSI Technology Digest of Technical Papers", 2015, p. T216-T217.
[Non-Patent Document 8] S. Amano et al., "SID Symposium Digest of Technical Papers", 2010, volume 41, issue 1, p. 626-629.

SUMMARY OF THE INVENTION

Problem to be Solved by the Invention

It is said that carriers of an oxide semiconductor are formed mainly by hydrogen taken into oxygen vacancies. Thus, reducing the amounts of oxygen vacancies and hydrogen present in the oxide semiconductor can reduce the carrier concentration of the oxide semiconductor, that is, enables the oxide semiconductor to be an intrinsic semiconductor.

Dehydrogenation treatment or dehydration treatment is effective in reducing hydrogen in the oxide semiconductor. However, when the treatment is performed, oxygen vacancies are formed in the oxide semiconductor. Thus, the amounts of oxygen vacancies and hydrogen present in the oxide semiconductor are difficult to adjust at the same time.

In view of the above problem, an object of one embodiment of the present invention is to provide a novel oxide semiconductor material. An object of one embodiment of the present invention is to provide a semiconductor device having favorable electrical characteristics. In addition, an object of one embodiment of the present invention is to provide a highly reliable semiconductor device.

Note that the descriptions of these objects do not preclude the existence of other objects. One embodiment of the present invention does not need to achieve all of these objects. Objects other than these will be apparent from the descriptions of the specification, the drawings, the claims, and the like, and can be derived from the descriptions of the specification, the drawings, the claims, and the like.

Means for Solving the Problem

One embodiment of the present invention is a semiconductor material that is an oxide including a metal element and nitrogen. The metal element is indium (In), an element M (M is aluminum (Al), gallium (Ga), yttrium (Y), or tin (Sn)), and zinc (Zn). Nitrogen is taken into an oxygen vacancy or bonded to an atom of the metal element.

In the above semiconductor material, the carrier concentration of the oxide is preferably lower than $5 \times 10^{17}$ cm$^{-3}$. In the above semiconductor material, the proportion of the number of atoms of nitrogen in the oxide is preferably lower than 1.2 atomic %.

In the above semiconductor material, no structural change in the oxide is preferably observed when the oxide is irradiated with an electron and when a cumulative electron dose of the electron is less than or equal to $3.6 \times 10^8$ e$^-$/nm$^2$.

In the above semiconductor material, the oxide preferably includes cerium (Ce).

One embodiment of the present invention is a semiconductor device including a transistor. The transistor includes an oxide, a first insulator over the oxide, and a conductor over the first insulator. The oxide includes a metal element and nitrogen. The metal element is indium (In), an element M (M is aluminum (Al), gallium (Ga), yttrium (Y), or tin (Sn)), and zinc (Zn). Nitrogen is taken into an oxygen vacancy or bonded to an atom of the metal element.

In the above semiconductor device, a carrier concentration of the oxide is preferably lower than $5 \times 10^{17}$ cm$^{-3}$. In the above semiconductor device, the proportion of the number of atoms of nitrogen in the oxide is preferably lower than 1.2 atomic %.

One embodiment of the present invention is a semiconductor device including a transistor. The transistor includes a first oxide, a second oxide, a first conductor, a second conductor, a third conductor, a first insulator, a second insulator. The first oxide includes a first region, a second region, a third region in contact with the first region and the second region. The first region overlaps with the first conductor. The second region overlaps with the second conductor. The third region includes a region overlapping with the third conductor with the first insulator and the second oxide positioned therebetween. The second insulator includes an opening that exposes a side surface of the first conductor, a side surface of the second conductor, the third region. The third conductor is placed in the opening with the second oxide and the first insulator positioned therebetween. The first oxide includes a metal element and nitrogen. The metal element is indium (In), an element M (M is aluminum (Al), gallium (Ga), yttrium (Y), or tin (Sn)), and zinc (Zn). Nitrogen is taken into an oxygen vacancy or bonded to an atom of the metal element.

One embodiment of the present invention is a semiconductor device including a transistor. The transistor includes a first oxide, a second oxide, a first conductor, a second conductor, a third conductor, a first insulator, a second insulator, a third insulator. The first oxide includes a first region, a second region, a third region in contact with the first region and the second region. The first region overlaps with the first conductor. The second region overlaps with the second conductor. The third region includes a region overlapping with the third conductor with the first insulator and the second oxide positioned therebetween. The second insulator overlaps with the first conductor and the second conductor with the third insulator positioned therebetween and includes an opening that exposes a side surface of the first conductor, a side surface of the second conductor, the third region. The third conductor is placed in the opening with the third insulator, the second oxide, the first insulator positioned therebetween. The first oxide includes a metal element and nitrogen. The metal element is indium (In), an element M (M is aluminum (Al), gallium (Ga), yttrium (Y), or tin (Sn)), and zinc (Zn). Nitrogen is taken into an oxygen vacancy or bonded to an atom of the metal element.

In the above semiconductor, the first oxide includes cerium (Ce).

One embodiment of the present invention is a semiconductor device including a transistor. The transistor includes a first oxide, a second oxide, a third oxide, a fourth oxide, a first conductor, a second conductor, a third conductor, a first insulator, and a second insulator. The first oxide includes a first region, a second region, a third region in contact with the first region and the second region. The first region overlaps with the first conductor with the third oxide positioned therebetween. The second region overlaps with the second conductor with the fourth oxide positioned therebetween. The third region includes a region overlapping with the third conductor with the first insulator and the second oxide positioned therebetween. The second insulator includes an opening that exposes the third region, the side surface of the opening and a side surface of the first conductor or the second conductor are on one plane. The third conductor is placed in the opening with the second oxide and the first insulator positioned therebetween. The first oxide includes a metal element and nitrogen. The metal element is indium (In), an element M (M is aluminum (Al), gallium (Ga), yttrium (Y), or tin (Sn)), and zinc (Zn). Nitrogen is taken into an oxygen vacancy or bonded to an atom of the metal element.

One embodiment of the present invention is a semiconductor device including a transistor. The transistor includes a first oxide, a second oxide, a third oxide, a fourth oxide, a first conductor, a second conductor, a third conductor, a first insulator, a second insulator, a third insulator. The first oxide includes a first region, a second region, a third region in contact with the first region and the second region. The first region overlaps with the first conductor with the third oxide positioned therebetween. The second region overlaps with the second conductor with the fourth oxide positioned therebetween. The third region includes a region overlapping with the third conductor with the first insulator and the second oxide positioned therebetween. The second insulator overlaps with the first conductor and the second conductor with the third insulator positioned therebetween and includes an opening that exposes a side surface of the first conductor, a side surface of the second conductor, the third region. The third conductor is placed in the opening with the third insulator, the second oxide, the first insulator positioned therebetween. The first oxide includes a metal element and nitrogen. The metal element is indium (In), an element M (M is aluminum (Al), gallium (Ga), yttrium (Y), or tin (Sn)), and zinc (Zn). Nitrogen is taken into an oxygen vacancy or bonded to an atom of the metal element.

In the above semiconductor device, the third oxide and the fourth oxide have a higher cerium (Ce) content than the first oxide.

In the above semiconductor device, the carrier concentration of the first oxide is lower than $5 \times 10^{17}$ cm$^{-3}$.

In the above semiconductor device, the proportion of the number of atoms of nitrogen in the first oxide is lower than 1.2 atomic %.

In the above semiconductor device, no structural change in the first oxide is observed when the oxide is irradiated with an electron and when a cumulative electron dose of the electron is less than or equal to $3.6 \times 10^8$ e$^-$/nm$^2$.

Effect of the Invention

One embodiment of the present invention can provide a novel semiconductor material. In addition, a semiconductor device having favorable electrical characteristics can be provided. In addition, a highly reliable semiconductor device can be provided.

Note that the descriptions of the effects do not preclude the existence of other effects. One embodiment of the present invention does not necessarily achieve all the effects. Effects other than these will be apparent from the descriptions of the specification, the drawings, the claims, and the

BRIEF DESCRIPTION OF DRAWINGS

FIGS. 5A-5C A top view and cross-sectional views of a semiconductor device of one embodiment of the present invention.

FIGS. 10A-10C Cross-sectional views illustrating a method of fabricating a semiconductor device of one embodiment of the present invention.

FIGS. 24A-24C Cross-sectional views illustrating a method of fabricating a semiconductor device of one embodiment of the present invention.

FIGS. 31A-32F Diagrams illustrating electronic devices of one embodiment of the present invention.

MODE FOR CARRYING OUT THE INVENTION

Figure 1:
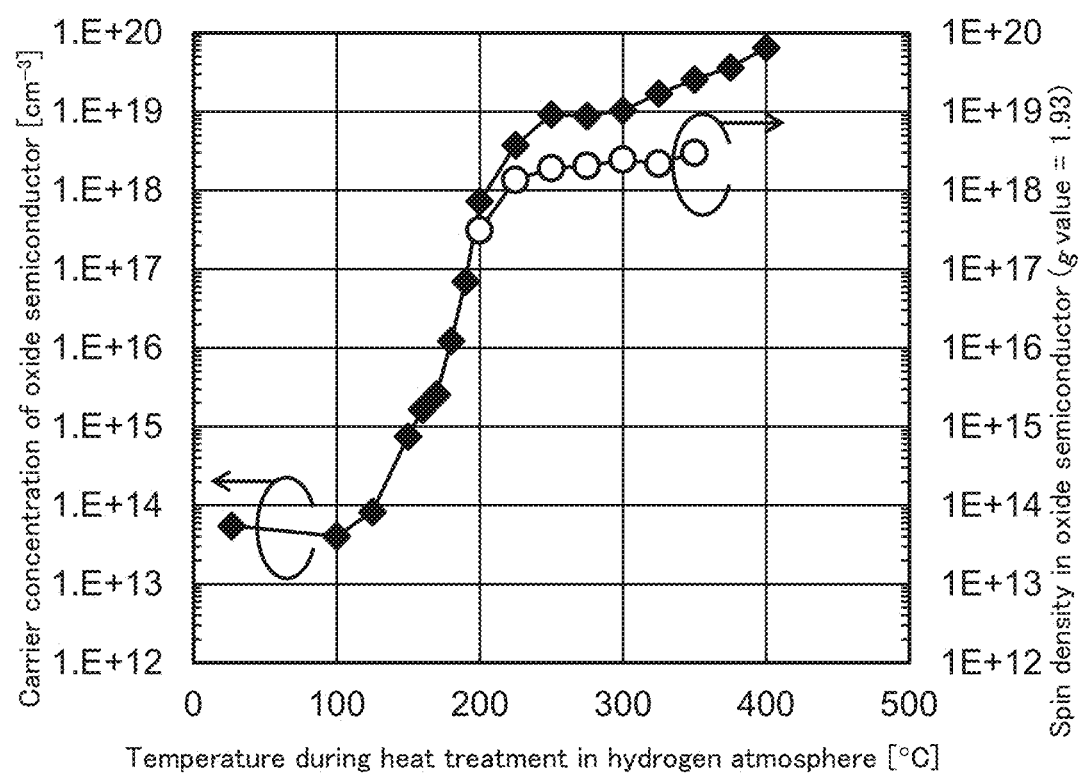
FIG. 1 A diagram showing changes in carrier concentration and spin density.

Hereinafter, embodiments will be described with reference to drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. The description of some hidden lines and the like might also be omitted.

Note that in this specification and the like, the ordinal numbers such as first and second are used for convenience and do not denote the order of steps or the stacking order of layers. Therefore, for example, description can be made even when "first" is replaced by "second", "third", or the like, as appropriate. In addition, the ordinal numbers in this specification and the like do not correspond to the ordinal numbers which are used to specify one embodiment of the present invention in some cases.

In this specification, terms for describing arrangement, such as "over" and "under", are used for convenience in describing a positional relationship between components with reference to drawings. Furthermore, the positional relation between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is regarded as being disclosed in the drawings or the texts.

Here, X and Y denote an object (e.g., a device, an element, a circuit, a wiring, an electrode, a terminal, a conductive film, or a layer).

The atomic ratio of elements forming an oxide, a metal oxide, a compound, or the like described in this specification includes the vicinity of the atomic ratio in some cases, unless otherwise specified. The vicinity of the atomic ratio here includes values greater than or equal to 50% and less than or equal to 150% of the number of each atom. For example, in the case where the atomic ratio of Element A to Element B is [A]:[B]=2:1, the vicinity of the proportion of [A] includes values greater than or equal to 1 and less than or equal to 3 and the vicinity of the proportion of [B] includes values greater than or equal to 0.5 and less than or equal to 1.5. The vicinity of the atomic ratio includes values greater than or equal to 80% and less than or equal to 120% of the number of each atom. For example, in the case where the atomic ratio of Element A to Element B is [A]:[B]=2:1, the vicinity of the proportion of [A] includes values greater than or equal to 1.6 and less than or equal to 2.4 and the vicinity of the proportion of [B] includes values greater than or equal to 0.8 and less than or equal to 1.2. The vicinity of the atomic ratio includes values greater than or equal to 90% and less than or equal to 110% of the number of each atom. For example, in the case where the atomic ratio of Element A to Element B is [A]:[B]=2:1, the vicinity of the proportion of [A] includes values greater than or equal to 1.8 and less than or equal to 2.2 and the vicinity of the proportion of [B] includes values greater than or equal to 0.9 and less than or equal to 1.1.

Furthermore, functions of a source and a drain might be switched when a transistor of opposite polarity is employed or a direction of current flow is changed in circuit operation, for example. Therefore, the terms "source" and "drain" is used interchangeably in this specification and the like in some cases.

In this specification and the like, "silicon oxynitride" is a substance in which the oxygen content is higher than the nitrogen content in its composition. Moreover, "silicon nitride oxide" is a substance in which the nitrogen content is higher than the oxygen content in its composition.

In this specification and the like, "parallel" indicates a state where two straight lines are placed such that the angle formed therebetween is greater than or equal to −10° and less than or equal to 10°. Accordingly, the case where the angle is greater than or equal to −5° and less than or equal to 5° is also included. The term "substantially parallel" indicates a state where two straight lines are placed such that the angle formed therebetween is greater than or equal to −30° and less than or equal to 30°. In addition, "perpendicular" indicates a state where two straight lines are placed such that the angle formed therebetween is greater than or equal to 80° and less than or equal to 100°. Accordingly, the case where the angle is greater than or equal to 85° and less than or equal to 95° is also included. The term "substantially perpendicular" indicates a state where two straight lines are placed such that the angle formed therebetween is greater than or equal to 60° and less than or equal to 120°.

Note that in this specification, a barrier film means a film having a function of inhibiting the passage of oxygen and impurities such as hydrogen, and the barrier film having conductivity is referred to as a conductive barrier film in some cases.

In this specification and the like, "normally off" means that current per micrometer of channel width flowing in a transistor when a potential is not applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Furthermore, in this specification and the like, a leakage current sometimes expresses the same meaning as an off-state current. In addition, in this specification and the like, the off-state current sometimes refers to a current that flows between a source and a drain of a transistor in the off state, for example.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, when a metal oxide is used in a semiconductor layer of a transistor, the metal oxide is referred to as an oxide semiconductor in some cases. That is, in the case where an OS transistor is mentioned, the OS FET can also be referred to as a transistor including an oxide or an oxide semiconductor.

Note that in this specification and the like, an oxide semiconductor containing nitrogen is also collectively referred to as an oxide semiconductor in some cases. In addition, an oxide semiconductor containing nitrogen may be referred to as an oxynitride semiconductor.

Embodiment 1

An oxide semiconductor which is one embodiment of the present invention is described below using FIG. 1 to FIG. 4.

A transistor preferably uses a metal oxide functioning as an oxide semiconductor (hereinafter also referred to as an oxide semiconductor) in a region where a channel is formed (hereinafter also referred to as a channel formation region). Since a transistor using the oxide semiconductor in a channel formation region has an extremely low leakage current in a non-conduction state, a semiconductor device with low power consumption can be provided. In addition, the oxide semiconductor can be deposited by a sputtering method or the like and thus can be used for a transistor constituting a highly integrated semiconductor device.

In the case where the oxide semiconductor is used in the channel formation region of a transistor, an i-type (intrinsic) or substantially i-type oxide semiconductor with a low carrier concentration is preferably used. When the oxide semiconductor with a low carrier concentration is used in the channel formation region of a transistor, the off-state current of the transistor can be kept low or the reliability of the transistor can be improved. Thus, reducing the carrier concentration of the oxide semiconductor is important.

Carriers in the oxide semiconductor (electrons for an n-type semiconductor) are mainly formed of hydrogen taken into oxygen vacancies, that is, hydrogen located at sites of oxygen (here, denoted as VoH or Ho). In other words, hydrogen taken into oxygen vacancies functions as a donor. Thus, when hydrogen is taken into oxygen vacancies, the threshold voltage of the transistor is shifted to the negative side, whereby the transistor has normally-on characteristics. Here, "normally on" means a state where a channel exists without application of a voltage to a gate electrode and a current flows through the transistor. Note that the relationship between hydrogen taken into oxygen vacancies and the carrier concentration is described later.

The amount of hydrogen taken into oxygen vacancies is preferably reduced so that the carrier concentration of the oxide semiconductor can be reduced. A reduction in the amount of hydrogen taken into oxygen vacancies enables the oxide semiconductor to be of an i-type or a substantially i-type. Note that oxygen vacancies or hydrogen present in the oxide semiconductor is preferably reduced so that the amount of hydrogen taken into oxygen vacancies can be reduced.

The amount of oxygen vacancies present in the oxide semiconductor is preferably reduced so that the amount of hydrogen taken into oxygen vacancies can be reduced. When the amount of oxygen vacancies present in the oxide semiconductor is reduced, hydrogen present in the oxide semiconductor can be prevented from being taken into the oxygen vacancies. An example of a method of reducing the oxygen vacancies is a method in which oxygen is supplied to the oxide semiconductor.

However, the oxygen supplied to the oxide semiconductor does not necessarily compensate for all the oxygen vacancies. This is because the size of an oxygen vacancy is smaller than the size of an oxygen atom in some cases. When the size of an oxygen vacancy is smaller than the size of an oxygen atom, the oxygen vacancy is difficult to compensate for even if the oxygen supplied to the oxide semiconductor diffuses around the oxygen vacancy. Note that the size of an oxygen vacancy is described later.

Furthermore, the amount of hydrogen present in the oxide semiconductor or the amount of hydrogen present around the oxide semiconductor is preferably reduced so that the amount of hydrogen taken into the oxygen vacancies can be reduced. Hydrogen present in the oxide semiconductor is not only located in the oxygen vacancies but also located in places that are not lattice sites. Since the size of a hydrogen atom is smaller than the size of an oxygen atom, hydrogen located in places that are not lattice sites is likely to diffuse in the oxide semiconductor. The hydrogen is taken into an oxygen vacancy in some cases if it diffuses around the oxygen vacancy. Thus, hydrogen located in the oxygen vacancies and hydrogen located in places that are not lattice sites need to be reduced so that the amount of hydrogen taken into the oxygen vacancies can be reduced.

Dehydrogenation treatment or dehydration treatment is effective in reducing the amount of hydrogen present in the oxide semiconductor. However, when the treatment is performed, oxygen vacancies are formed in the oxide semiconductor. Furthermore, since the treatment involves heat treatment, hydrogen located in places that are not lattice sites diffuses through the oxide semiconductor. The hydrogen is taken into an oxygen vacancy in some cases if it diffuses around the formed oxygen vacancy. This might prevent a decrease in the amount of hydrogen taken into the oxygen vacancies.

Hydrogen in an insulator or a conductor located around the oxide semiconductor is preferably reduced so that the amount of hydrogen present around the oxide semiconductor can be reduced. For example, when an insulator is located around the oxide semiconductor, hydrogen in the insulator diffuses to the oxide semiconductor to be taken into an oxygen vacancy in the oxide semiconductor in some cases.

As described above, the amounts of oxygen vacancies and hydrogen that are present in the oxide semiconductor are difficult to adjust at the same time.

Nitrogen (N), then, is introduced into the oxide semiconductor. Consequently, nitrogen is taken into the oxygen vacancies present in the oxide semiconductor in some cases. Nitrogen taken into the oxygen vacancies is referred below to as $V_O N$ or $N_O$ in some cases. Nitrogen taken into the oxygen vacancies does not generate a carrier; that is, nitrogen taken into the oxygen vacancies does not function as a donor. Therefore when nitrogen is taken into the oxygen vacancies, the carrier concentration of the oxide semiconductor can be reduced and a transistor using the oxide semiconductor in a channel formation region can have normally-off characteristics. Note that no carrier generation by nitrogen taken into the oxygen vacancies is described later.

Metal element atoms forming the oxide semiconductor exist around nitrogen taken into the oxygen vacancies. In other words, nitrogen taken into the oxygen vacancies is bonded to a metal atom located around the oxygen vacancies. The bond between a nitrogen atom and the metal atom can be analyzed by X-ray photoelectron spectroscopy (XPS), for example. Note that a peak indicating the bond between the nitrogen atom and the metal atom is not detected in some cases depending on the amount of nitrogen included in the oxide semiconductor.

Furthermore, the amount of hydrogen taken into the oxygen vacancies can be reduced when nitrogen is introduced into the oxide semiconductor. The bonding energy between the metal atom and the nitrogen atom tends to be higher than the bonding energy between the metal atom and a hydrogen atom. Therefore hydrogen taken into the oxygen vacancies is more likely to be replaced by nitrogen and nitrogen taken into the oxygen vacancies is less likely to be replaced by hydrogen. For this reason, nitrogen introduced into the oxide semiconductor replaces hydrogen taken into the oxygen vacancies, and the amount of hydrogen taken into the oxygen vacancies can be reduced accordingly. In addition, nitrogen taken into the oxygen vacancies is more stable to heat or the like than hydrogen taken into the oxygen vacancies.

Furthermore, diffusion of the oxygen vacancies can be inhibited when nitrogen is taken into the oxygen vacancies. The oxygen vacancies diffuse in some cases due to heat treatment in a manufacturing process of a semiconductor device. When taken into the oxygen vacancies, nitrogen is bonded to metal atoms located around the oxygen vacancies and diffusion of the oxygen vacancies can be inhibited. The inhibition of the diffusion of the oxygen vacancies can inhibit an increase in a region where the oxygen vacancies and hydrogen taken into the oxygen vacancies are present. Note that in this specification, the inhibition of the diffusion of the oxygen vacancies due to nitrogen taken into the oxygen vacancies is referred to as freezing in some cases.

As described above, the carrier concentration of the oxide semiconductor can be reduced when nitrogen is introduced into the oxide semiconductor. The use of the oxide semiconductor in the channel formation region of a transistor can keep the off-state current of the transistor low or improve the reliability of the transistor. Furthermore, since oxygen vacancies and nitrogen taken into the oxygen vacancies in the oxide semiconductor are less likely to diffuse, the transistor using the oxide semiconductor is stable to thermal budget, and design flexibility can be increased. The thermal budget refers to a time integral value of temperature applied to a semiconductor device in a manufacturing process of the semiconductor device.

When the nitrogen concentration of the oxide semiconductor is adjusted, the carrier concentration of the metal oxide can be lower than $1 \times 10^{18}$ cm$^{-3}$, preferably lower than $1 \times 10^{17}$ cm$^{-3}$, and further preferably lower than or equal to $1 \times 10^{16}$ cm$^{-3}$. Note that the carrier concentration of the oxide semiconductor can be evaluated by Hall effect measurement.

The nitrogen concentration of the oxide semiconductor is preferably higher than or equal to the carrier concentration of the oxide semiconductor into which nitrogen is not introduced. Reducing the amount of hydrogen taken into oxygen vacancies is effective in reducing the carrier concentration. Nitrogen introduced into the oxide semiconductor is likely to replace hydrogen taken into oxygen vacancies. However, all the introduced nitrogen does not necessarily replace hydrogen taken into the oxygen vacancies. This is because the nitrogen concentration of the oxide semiconductor is preferably higher than or equal to the carrier concentration of the oxide semiconductor into which nitrogen is not introduced.

Preferably, the nitrogen concentration of the oxide semiconductor is substantially equal to or higher than the hydrogen concentration of the oxide semiconductor. Nitrogen introduced into the oxide semiconductor is likely to replace hydrogen taken into oxygen vacancies. Hence, when the amount of introduced nitrogen is larger than the amount of hydrogen taken into oxygen vacancies, the amount of hydrogen taken into oxygen vacancies can be reduced. Furthermore, the amount of hydrogen located in places that are not lattice sites is preferably reduced so that hydrogen located in places that are not lattice sites can be inhibited from being taken into oxygen vacancies. Thus, the nitrogen concentration of the oxide semiconductor is preferably higher than the hydrogen concentration of the oxide semiconductor. Note that hydrogen located in places that are not lattice sites does not generate carriers if bonded to nitrogen taken into oxygen vacancies. For this reason, the nitrogen concentration of the oxide semiconductor may be substantially equal to the hydrogen concentration of the oxide semiconductor.

For example, the nitrogen concentration of the oxide semiconductor is preferably higher than or equal to $1 \times 10^{18}$ atoms/cm$^3$ and lower than or equal to $4 \times 10^{21}$ atoms/cm$^3$. The nitrogen concentration is further preferably higher than or equal to $1 \times 10^{19}$ atoms/cm$^3$ and lower than or equal to $2 \times 10^{21}$ atoms/cm$^3$. The nitrogen concentration is further preferably higher than or equal to $5 \times 10^{19}$ atoms/cm$^3$ and lower than $1 \times 10^{21}$ atoms/cm$^3$.

Alternatively, the proportion of the number of nitrogen atoms in the oxide semiconductor is preferably higher than or equal to 0.001 atomic % and lower than or equal to 5 atomic %. The proportion is further preferably higher than or equal to 0.01 atomic % and lower than or equal to 3 atomic %. The proportion is further preferably higher than or equal to 0.05 atomic % and lower than 1.2 atomic %. In this specification and the like, the proportion of the number of nitrogen atoms [atomic %] means the proportion of the number of nitrogen atoms to the total number of metal element atoms, oxygen atoms, and nitrogen atoms forming the oxide semiconductor.

Preferably, the oxide semiconductor into which nitrogen is introduced has crystallinity. When the oxide semiconductor has crystallinity, physical properties as the oxide semiconductor become stable, and accordingly the oxide semiconductor which is resistant to heat and has high reliability can be provided.

The crystallinity of the oxide semiconductor can be analyzed by using X-ray diffraction (XRD) or analyzed with a transmission electron microscope (TEM), for example. Alternatively, the crystallinity of the oxide semiconductor can be analyzed by electron diffraction. For example, a region with high luminance in a ring pattern and a plurality of spots in the region with high luminance in a ring pattern are observed in some cases in an electron diffraction pattern.

Preferably, the oxide semiconductor into which nitrogen is introduced has a stable oxide semiconductor structure. The oxide semiconductor having a stable structure refers to, for example, an oxide semiconductor in which crystallization does not occur or the crystalline structure is not impaired due to electron beam irradiation during observation with an electron microscope. Although introduction of nitrogen into the oxide semiconductor can reduce the carrier concentration, excessive introduction of nitrogen renders the oxide semiconductor structure unstable in some cases. The use of the oxide semiconductor having an unstable structure in the channel formation region in a transistor may cause a progressive defect due to operation of the transistor, heat generated by the transistor, or the like. For this reason, the stableness of the oxide semiconductor structure is a key to the reliability of the semiconductor device Nitrogen taken into oxygen vacancies is bonded to hydrogen located in places that are not lattice sites in some cases. Oxygen and nitrogen present in the oxide semiconductor tend to have a valence of −2 and a valence of −3, respectively. Nitrogen taken into an oxygen vacancy can be regarded as nitrogen that has replaced an oxygen atom. Therefore nitrogen taken into oxygen vacancies is presumed to be in a state deficient in one electron, that is, to have an unpaired electron. This leads to a presumption that nitrogen taken into oxygen vacancies and hydrogen located in places that are not lattice sites are stabilized by bonding to each other. Furthermore, hydrogen bonded to nitrogen taken into oxygen vacancies is presumed to generate no carriers.

Addition of an atom that can have a valence of +4 to the oxide semiconductor containing nitrogen can adjust the carrier concentration of the oxide semiconductor. As atoms that can have a valence of +4, cerium (Ce), praseodymium (Pr), neodymium (Nd), terbium (Tb), dysprosium (Dy), and the like are given. Since cerium particularly has substantially the same ion radius as indium (In), cerium is estimated to be likely to replace indium in the oxide semiconductor. Replacement of indium having a valence of +3 by cerium having a valence of +4 generates one extra electron, that is, a carrier. Hence, by adjustment of the amount of added atoms that can have a valence of +4, a semiconductor device having electrical characteristics that meet the demand for the circuit design can be provided easily.

<Relation Between Hydrogen Taken into Oxygen Vacancies and Carrier Concentration>

Here, generation of a carrier (electron) of the oxide semiconductor mainly by hydrogen taken into oxygen vacancies (referred to as VoH or Ho in some cases) is described using FIG. 1. Specifically, Hall effect measurement and electron spin resonance (ESR) measurement were performed on samples obtained by deposition of the oxide semiconductor to examine the relation between hydrogen taken into oxygen vacancies and carrier concentration.

Sample A1 to Sample A17 Fabricated are Described Below.

First, the oxide semiconductor was deposited to a thickness of 35 nm over a quartz substrate by a sputtering method. The oxide semiconductor was deposited under the following conditions: an In—Ga—Zn oxide target with In:Ga:Zn=1: 1:1 [atomic ratio] was used, the argon gas flow rate was 30 sccm, the oxygen gas flow rate was 15 sccm, the pressure was 0.7 Pa, the distance between the substrate and the target was 60 nm, the direct-current power source was 0.5 kW, and the substrate temperature was 300° C.

Next, heat treatment was performed at 400° C. in an atmosphere containing nitrogen for one hour. Next, heat treatment was performed at 400° C. in an atmosphere containing oxygen for one hour.

Next, heat treatment was performed in an atmosphere containing hydrogen (hereinafter, referred to as a hydrogen atmosphere) at a hydrogen gas flow rate of 500 sccm and a pressure of 133 Pa for one hour, whereby Sample A1 to Sample A17 were fabricated. Note that the temperatures during the heat treatment were as follows: no heat treatment for Sample A1; 100° C. for Sample A2; 125° C. for Sample A3; 150° C. for Sample A4; 160° C. for Sample A5; 170° C. for Sample A6; 180° C. for Sample A7; 190° C. for Sample A8; 200° C. for Sample A9; 225° C. for Sample A10; 250° C. for Sample A11; 275° C. for Sample A12; 300° C. for Sample A13; 325° C. for Sample A14; 350° C. for Sample A15; 375° C. for Sample A16; and 400° C. for Sample A17.

Through the above process, Sample A1 to Sample A17 were fabricated.

Hall effect measurement was performed on Sample A1 to Sample 17 fabricated by the above method to calculate the carrier concentration of the oxide semiconductor. Here, the Hall effect measurement is a method in which electrical properties such as carrier density, mobility, and resistivity are measured with the use of the Hall effect; in the Hall effect, when a magnetic field is applied to the object through which a current flows in a direction perpendicular to the direction of the current, an electromotive force is produced in directions perpendicular to both the current and the magnetic field. Here, the Hall effect measurement using the Van der Pauw method was performed. Note that ResiTest manufactured by TOYO Corporation was used for the Hall effect measurement.

FIG. 1 shows a change in the carrier concentration of the oxide semiconductor with respect to the temperature during the heat treatment in the hydrogen atmosphere. The horizontal axis in FIG. 1 represents temperature [° C.] during the heat treatment in the hydrogen atmosphere, and the first vertical axis in FIG. 1 represents the carrier concentration of the oxide semiconductor [cm$^{-3}$]. In FIG. 1, measured values of the carrier concentration of the oxide semiconductor are plotted with rhomboids. FIG. 1 reveals that the carrier concentration of the oxide semiconductor increases with increasing temperature during the heat treatment in the hydrogen atmosphere.

Next, ESR measurement was performed on Sample A1 to Sample A17 under the following conditions. The measurement temperature was room temperature; 20 mW of high-frequency power (microwave power) with 9.15 GHz was applied; and the direction of a magnetic field was parallel to the surface of the fabricated sample film. Note that when the oxide semiconductor includes hydrogen taken into oxygen vacancies, a signal having symmetry is found at a g value of around 1.93 in the ESR measurement. Thus, the higher the spin density calculated from the signal found at a g value of around 1.93 (hereinafter referred to as spin density (g value=1.93)) is, the amount of hydrogen taken into oxygen vacancies can be said to be larger. Note that the lower calculation limit of the spin density (g value=1.93) is 1.0× 10$^{17}$ spins/cm$^3$.

FIG. 1 shows a change in the spin density (g value=1.93) in the oxide semiconductor with respect to the temperature during the heat treatment in the hydrogen atmosphere. The second vertical axis in FIG. 1 represents the spin density (g value=1.93) in the oxide semiconductor [spins/cm$^3$]. In FIG. 1, calculated values of the spin densities (g value=1.93) are plotted with circles. FIG. 1 reveals that the spin density (g value=1.93) in the oxide semiconductor increases with increasing temperature during the heat treatment in the hydrogen atmosphere. In other words, it is found that, the higher the temperature during the heat treatment in the hydrogen atmosphere is, the more hydrogen are taken into oxygen vacancies. Note that for Sample A16 and Sample A17, the spin densities of Sample A16 and Sample A17 have not been calculated because the signal found at a g value of around 1.93 was broadened.

The above shows that, the higher the temperature during the heat treatment in the hydrogen atmosphere is, the carrier concentration of the oxide semiconductor is higher and the hydrogen taken into oxygen vacancies increases. Then, a focus is put on the relation between the carrier concentration and the amount of hydrogen taken into oxygen vacancies. The higher the carrier concentration of the oxide semiconductor is, hydrogen taken into oxygen vacancies increases; that is, it is found that there is a positive correlation between the carrier concentration of the oxide semiconductor and the amount of hydrogen taken into oxygen vacancies. This indicates that the carriers of the oxide semiconductor are generated mainly by hydrogen taken into oxygen vacancies.

<Size of Oxygen Vacancy>

The size of an oxygen vacancy is smaller than the size of an oxygen atom in some cases, which is described here using calculation.

Figure 2:
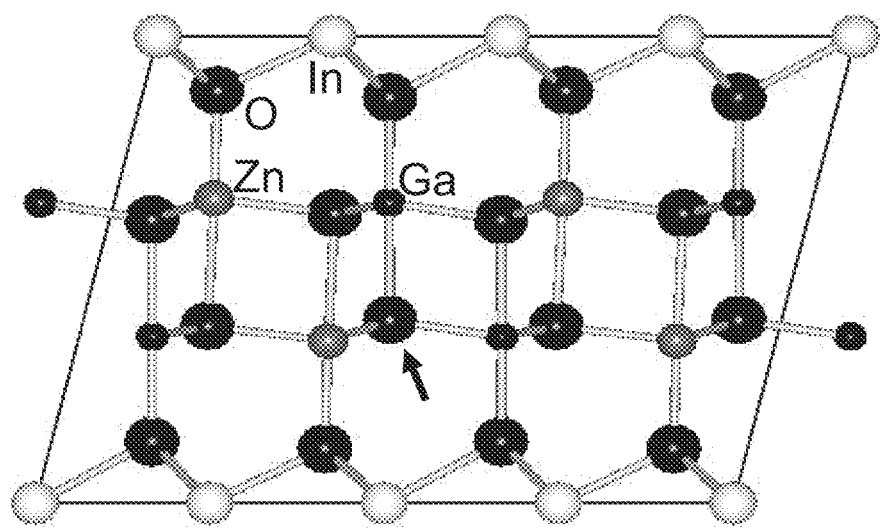
FIG. 2 A diagram showing an InGaZnO$_4$ crystal model.

First, one oxygen atom indicated by an arrow was removed from an InGaZnO$_4$ crystal model illustrated in FIG. 2. Atomic relaxation calculation was performed on the model from which one oxygen atom was removed. Note that the InGaZnO$_4$ crystal model illustrated in FIG. 2 before removal of one oxygen atom is formed of 112 atoms. The calculation conditions are described below.

In the first principles calculation, VASP (Vienna Ab initio Simulation Package) was used. In addition, the Heyd-Scuseria-Ernzerhof (HSE) hybrid functional (HSE06) was used for the exchange-correlation functional, generalized gradient approximation (GGA) was used for the Perdew-Burke-Ernzerhof (PBE) functional, and a PAW (projector augmented wave) method was used for pseudopotential calculation of electronic states of the ion potential. The cut-off energy was 800 eV, and the grid of only Γ-point was used for the k-point. Furthermore, the charge state of the whole model was neutral.

Figure 3A:
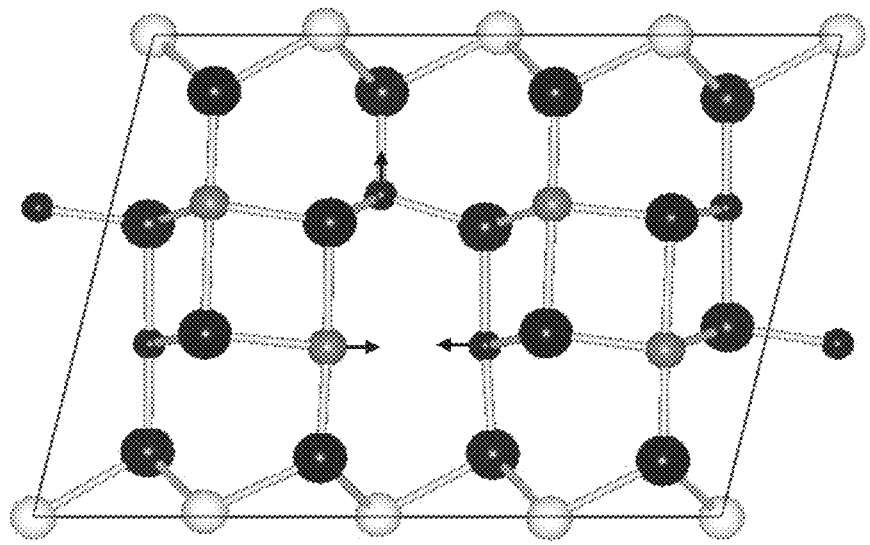
FIGS. 3A-3B Diagrams showing atomic arrangement after atomic relaxation.
Figure 3B:
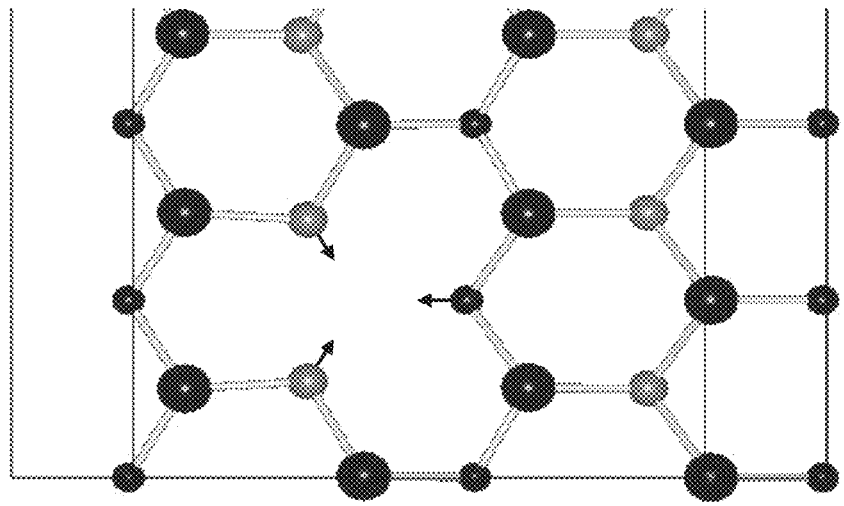

FIG. 3 shows atomic arrangement of a model from which one oxygen atom has been removed after the atomic relaxation calculation. FIG. 3(A) shows the atomic arrangement seen from the direction perpendicular to the c-axis of the InGaZnO$_4$ crystal, and FIG. 3(B) shows the atomic arrangement seen from the direction parallel to the c-axis of the InGaZnO$_4$ crystal. Note that the frame lines in FIG. 3(A) and FIG. 3(B) represent periodic boundaries. In addition, the arrows shown in FIG. 3 represent the directions of movement of atoms that have shown a relatively large variation before and after the atomic relaxation calculation.

FIG. 3 reveals that metal atoms located around an oxygen vacancy are approaching the center of the oxygen vacancy. Accordingly, the size of an oxygen vacancy is smaller than the size of an oxygen atom in some cases.

<Nitrogen Taken into Oxygen Vacancies>

Nitrogen taken into an oxygen vacancy does not generate a carrier, which is described here using calculation.

First, one oxygen atom indicated by the arrow was replaced by a nitrogen atom in the InGaZnO$_4$ crystal model illustrated in FIG. 2. The nitrogen atom corresponds to nitrogen taken into an oxygen vacancy. Atomic relaxation calculation was performed on the model in which one oxygen atom was replaced by a nitrogen atom, and a state density diagram was calculated. The calculation conditions are described below.

In the first principles calculation, VASP was used. In addition, the GGA/PBE (Generalized-Gradient-Approximation/Perdew-Burke-Ernzerhof) was used for the exchange-correlation functional, and a PAW method was used for pseudopotential calculation of electronic states of the ion potential. The cut-off energy was 800 eV, and the 2×2×3 grid was used for the k-point. Furthermore, the charge state of the whole model was neutral.

Figure 4:
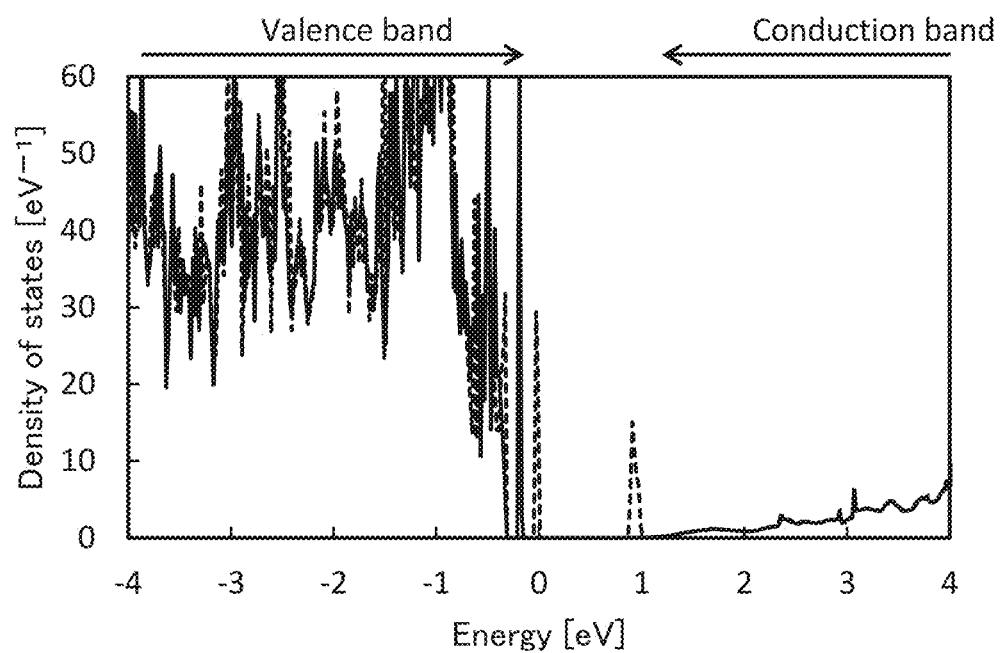
FIG. 4 A state density diagram of the case where nitrogen taken into an oxygen vacancy is included.

FIG. 4 is the state density diagram of the model in which one oxygen atom was replaced by a nitrogen atom after the atomic relaxation calculation. In FIG. 4, the horizontal axis represents energy [eV], and the vertical axis represents density of states [eV$^{-1}$]. In FIG. 4, the solid line represents the density of states of up spin, and the broken line represents the density of states of down spin. Note that in FIG. 4, the Fermi level (the energy of the highest occupied level of an electron) was adjusted to be 0 eV in the horizontal axis.

It was confirmed from FIG. 4 that the Fermi level is located in the band gap when one oxygen atom is replaced by a nitrogen atom. This means that there is no electron in the conduction band, that is, a carrier is not generated. Thus, nitrogen taken into an oxygen vacancy does not generate a carrier.

<Metal Oxide>

A metal oxide that can be used for the oxide semiconductor according to the present invention is described below. By introduction of nitrogen into the metal oxide, an i-type (intrinsic) or substantially i-type metal oxide (oxide semiconductor) with a low carrier concentration can be provided. Alternatively, the metal oxide (oxide semiconductor) that is resistant to heat and has high reliability can be provided.

The metal oxide preferably contains at least indium or zinc. In particular, indium and zinc are preferably contained. Furthermore, aluminum, gallium, yttrium, tin, or the like is preferably contained in addition to them. Furthermore, one or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be used in combination as the element M in some cases.

Note that in this specification and the like, a metal oxide containing nitrogen is also collectively referred to as a metal oxide in some cases. A metal oxide containing nitrogen may be referred to as a metal oxynitride. A metal oxide including indium, gallium, zinc, and nitrogen is referred to as IGZON$_x$ in some cases.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide having small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In some cases, IGZO has a stable structure when formed of smaller crystals (e.g., the above-described nanocrystals) rather than larger crystals (here, crystals with a size of several millimeters or several centimeters) because crystal growth tends to hardly occur particularly in the air.

An a-like OS is a metal oxide having a structure between those of the nc-OS and an amorphous oxide semiconductor. The a-like OS contains a void or a low-density region. That is, the a-like OS has low crystallinity as compared with the nc-OS and the CAAC-OS.

The oxide semiconductor (metal oxide) can have various structures which show different properties. Two or more kinds of the amorphous oxide semiconductor, the polycrystalline oxide semiconductor, the a-like OS, the nc-OS, and the CAAC-OS may be included in the oxide semiconductor of one embodiment of the present invention.

[Impurities]

Here, the influence of each impurity in the metal oxide will be described.

When the metal oxide contains an alkali metal or an alkaline earth metal, defect states are formed and carriers are generated, in some cases. Thus, a transistor using a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by secondary ion mass spectrometry (SIMS) is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to become water, and thus forms an oxygen vacancy, in some cases. When hydrogen is taken into the oxygen vacancy, an electron which is a carrier is generated in some cases. Furthermore, in some cases, bonding of part of hydrogen to oxygen bonded to a metal atom causes generation of an electron which is a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used in a channel formation region of a transistor, stable electrical characteristics can be given.

Note that as a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different microscopic regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a low-power-consumption CPU applying a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, it is proposed in Non-Patent Document 8 that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of a low leakage current of the transistor have been studied.

The structure described in this embodiment can be used in an appropriate combination with the structures described in the other embodiments.

Embodiment 2

In this embodiment, one embodiment of a semiconductor device will be described using FIG. 5 to FIG. 7.

<Structure 1 of Semiconductor Device>

An example of a semiconductor device including a transistor 200 according to one embodiment of the present invention is described below. FIG. 5(A), FIG. 5(B), and FIG. 5(C) are a top view and cross-sectional views of the transistor 200 according to one embodiment of the present invention and a periphery of the transistor 200. FIG. 5(A) is the top view, FIG. 5(B) is the cross-sectional view taken along the dashed-dotted line L1-L2 in FIG. 5(A), and FIG. 5(C) is the cross-sectional view taken along the dashed-dotted line W1-W2 in FIG. 5(A). Note that for simplification of the drawing, some components are not illustrated in the top view of FIG. 5(A).

The semiconductor device of one embodiment of the present invention includes the transistor 200 and an insulator 210, an insulator 212, an insulator 214, an insulator 216, an insulator 280, an insulator 282, and an insulator 284 functioning as interlayer films.

The semiconductor device also includes a conductor 246 which is electrically connected to the transistor 200 and functions as a plug (a conductor 246a and a conductor 246b). The semiconductor device further includes a conductor 203 which is electrically connected to the transistor 200 and functions as a wiring.

The transistor 200 includes a conductor 260 (a conductor 260a and a conductor 260b) functioning as a first gate electrode, a conductor 205 (a conductor 205a and a conductor 205b) functioning as a second gate electrode, an insulator 250 functioning as a first gate insulator, an insulator 220, an insulator 222, and an insulator 224 functioning as a second gate insulator, an oxide 230 (an oxide 230a, an oxide 230b, and an oxide 230c) including a region where a channel is formed, a conductor 240a functioning as one of a source and a drain, a conductor 240b functioning as the other of the source and the drain, and an insulator 274.

The oxide semiconductor described above in Embodiment 1 can be used for the oxide 230 in the transistor 200. The use of the oxide semiconductor for the oxide 230 can inhibit generation of oxygen vacancies in the oxide 230. Accordingly, the transistor having high reliability can be provided. Furthermore, the carrier concentration of the transistor can be adjusted and accordingly design flexibility is improved. In addition, the oxide semiconductor can be deposited by a sputtering method or the like and thus can be used for a transistor constituting a highly integrated semiconductor device.

The structure of the semiconductor device including the transistor 200 of one embodiment of the present invention will be described in detail below.

The insulator 210 and the insulator 212 function as interlayer films.

As the interlayer films, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used, for example. Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator given above.

For example, the insulator 210 preferably functions as a barrier film that inhibits impurities such as water and hydrogen from entering the transistor 200 from a substrate side. Accordingly, for the insulator 210, it is preferable to use an insulating material having a function of inhibiting diffusion of impurities such as a hydrogen atom, a hydrogen molecule, a water molecule, and a copper atom (through which the above impurities are less likely to pass). Alternatively, it is preferable to use an insulating material having a function of inhibiting diffusion of oxygen (e.g., at least one of oxygen atoms, oxygen molecules, and the like) (through which the above oxygen is less likely to pass). For example, aluminum oxide, silicon nitride, or the like may be used for the insulator 210. With this structure, impurities such as hydrogen and water can be inhibited from diffusing into the transistor 200 side from the side closer to the substrate than the insulator 210.

For example, the dielectric constant of the insulator 212 is preferably lower than that of the insulator 210. When a material with a low dielectric constant is used for an interlayer film, the parasitic capacitance generated between wirings can be reduced.

The conductor 203 is formed to be embedded in the insulator 212. The level of the top surface of the conductor 203 and the level of the top surface of the insulator 212 can be substantially the same. Note that although a structure in which the conductor 203 is a single layer is illustrated, the present invention is not limited thereto. For example, the conductor 203 may have a stacked-layer structure of two or more layers. Note that in the case where a structure body has a multilayer film structure, the layers may be distinguished by ordinal numbers corresponding to the formation order. Note that for the conductor 203, a conductive material that has high conductivity and contains tungsten, copper, or aluminum as its main component is preferably used.

In the transistor 200, the conductor 260 functions as a first gate (also referred to as a top gate) electrode in some cases. The conductor 205 functions as a second gate (also referred to as a bottom gate) electrode in some cases. In such cases, a potential applied to the conductor 205 is changed not in synchronization with but independently of a potential applied to the conductor 260, whereby the threshold voltage of the transistor 200 can be adjusted. In particular, the threshold voltage of the transistor 200 can be higher than 0 V and the off-state current can be reduced by applying a negative potential to the conductor 205. Thus, a drain current when a potential applied to the conductor 260 is 0 V can be lower in the case where a negative potential is applied to the conductor 205 than in the case where the negative potential is not applied to the conductor 205.

For example, when the conductor 205 and the conductor 260 provided to overlap with each other and a potential is applied to the conductor 205 and the conductor 260, an electric field generated from the conductor 260 and an electric field generated from the conductor 205 are connected, thereby covering the channel formation region formed in the oxide 230.

That is, the channel formation region can be electrically surrounded by the electric field of the conductor 260 having a function of the first gate electrode and the electric field of the conductor 205 having a function of the second gate electrode. In this specification, a transistor structure in which a channel formation region is electrically surrounded by electric fields of a first gate electrode and a second gate electrode is referred to as a surrounded channel (S-channel) structure.

Like the insulator 210 or the insulator 212, the insulator 214 and the insulator 216 function as interlayer films. For example, the insulator 214 preferably functions as a barrier film that inhibits impurities such as water and hydrogen from entering the transistor 200 from the substrate side. With this structure, impurities such as hydrogen and water can be inhibited from diffusing into the transistor 200 side from the side closer to the substrate than the insulator 214. In addition, the dielectric constant of the insulator 216 is preferably lower than that of the insulator 214, for example. When a material having a low dielectric constant is used for the interlayer film, the parasitic capacitance generated between wirings can be reduced.

In the conductor 205 functioning as a second gate, the conductor 205a is formed in contact with an inner wall of an opening in the insulator 214 and the insulator 216, and the conductor 205b is formed more inward. Here, the top surfaces of the conductor 205a and the conductor 205b and the top surface of the insulator 216 can be substantially level with each other. Although the transistor 200 having a structure in which the conductor 205a and the conductor 205b are stacked is illustrated, the present invention is not limited thereto. For example, the conductor 205 may have a single-layer structure or a stacked-layer structure of three or more layers.

The conductor 205a is preferably formed using a conductive material which has a function of inhibiting diffusion of impurities such as a hydrogen atom, a hydrogen molecule, a water molecule, and a copper atom (through which the above impurities are less likely to pass). Alternatively, it is preferable to use a conductive material having a function of inhibiting diffusion of oxygen (e.g., at least one of oxygen atoms, oxygen molecules, and the like) (through which the above oxygen is less likely to pass). Note that in this specification, a function of inhibiting diffusion of impurities or oxygen means a function of inhibiting diffusion of any one or all of the above impurities and the above oxygen.

For example, when the conductor 205a has a function of inhibiting diffusion of oxygen, the conductor 205b can be inhibited from being oxidized and having reduced conductivity.

In the case where the conductor 205 also functions as a wiring, a conductive material that has high conductivity and contains tungsten, copper, or aluminum as its main component is preferably used for the conductor 205b. In that case, the conductor 203 is not necessarily provided. Note that the conductor 205b is a single layer in the drawing but may have a stacked-layer structure; for example, a stacked layer of titanium or titanium nitride and the above conductive material may be employed.

The insulator 220, the insulator 222, and the insulator 224 have a function of a second gate insulator.

The insulator 222 preferably has a barrier property. The insulator 222 having a barrier property functions as a layer that inhibits entry of impurities such as hydrogen to the transistor 200 from the peripheral portion of the transistor 200.

For example, a single layer or a stacked layer of an insulator containing what is called a high-k material such as aluminum oxide, hafnium oxide, oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) is preferably used for the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

For example, it is preferable that the insulator 220 be thermally stable. For example, silicon oxide and silicon oxynitride, which have thermal stability, are preferable. When silicon oxide or silicon oxynitride is combined with an insulator which is a high-k material, the insulator 220 having a stacked-layer structure that has thermal stability and a high dielectric constant can be obtained.

The second gate insulator may have a single-layer structure or a stacked-layer structure of two layers or four or more layers, although a three-layer structure is illustrated in FIG. 5. In that case, without limitation to a stacked-layer structure formed of the same material, a stacked-layer structure formed of different materials may be employed.

The oxide 230 having a region functioning as the channel formation region includes the oxide 230a, the oxide 230b over the oxide 230a, and the oxide 230c over the oxide 230b. When the oxide 230a is provided below the oxide 230b, impurities can be inhibited from diffusing into the oxide 230b from the components formed below the oxide 230a. When the oxide 230c is provided over the oxide 230b, impurities can be inhibited from diffusing into the oxide 230b from the components formed above the oxide 230c.

In addition, the semiconductor device illustrated in FIG. 5 includes a region where the conductor 240 (the conductor 240a and the conductor 240b), the oxide 230c, the insulator 250, and the conductor 260 overlap with each other. With this structure, a transistor having a high on-state current can be provided. Alternatively, a transistor having high controllability can be provided.

One of the conductors 240 functions as a source electrode and the other functions as a drain electrode.

A metal such as aluminum, titanium, chromium, nickel, copper, yttrium, zirconium, molybdenum, silver, tantalum, or tungsten or an alloy containing this as the main component can be used for the conductor 240a and the conductor 240b. In particular, a metal nitride film of tantalum nitride or the like is preferable because it has a barrier property against hydrogen or oxygen and its oxidation resistance is high.

Although the conductor 240 is illustrated to have a single-layer structure in FIG. 5, a stacked-layer structure of two or more layers may be employed. For example, a tantalum nitride film and a tungsten film may be stacked. A titanium film and an aluminum film may be stacked. A two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure in which a titanium film or a titanium nitride film, an aluminum film or a copper film, and a titanium film or a titanium nitride film are stacked in this order and a three-layer structure in which a molybdenum film or a molybdenum nitride film, an aluminum film or a copper film, and a molybdenum film or a molybdenum nitride film are stacked in this order; and the like. Note that a transparent conductive material containing indium oxide, tin oxide, or zinc oxide may be used.

In addition, a barrier layer may be provided over the conductor 240. A substance having a barrier property against oxygen or hydrogen is preferably used for the barrier layer. With this structure, the conductor 240 can be inhibited from being oxidized when the insulator 274 is deposited.

For example, a metal oxide can be used for the above barrier layer. In particular, an insulating film having a barrier property against oxygen or hydrogen, such as aluminum oxide, hafnium oxide, or gallium oxide, is preferably used. Alternatively, silicon nitride formed by a chemical vapor deposition (CVD) method may be used.

When the above barrier layer is included, the range of choices for the materials of the conductor 240 can be expanded. For example, a material having low oxidation resistance and high conductivity, such as tungsten or aluminum, can be used for the conductor 240. For example, a conductor that can be easily deposited or processed can be used.

The insulator 250 functions as the first gate insulator. With miniaturization and high integration of a transistor, a problem of leakage current or the like may arise because of a thinner gate insulator. In that case, the insulator 250 may have a stacked-layer structure like the second gate insulator. When the insulator functioning as a gate insulator has a stacked-layer structure of a high-k material and a thermally stable material, a gate potential during operation of the transistor can be reduced while the physical thickness of the gate insulator is kept. Furthermore, the stacked-layer structure can be thermally stable and have a high dielectric constant.

The conductor 260 functioning as the first gate electrode includes the conductor 260a and the conductor 260b over the conductor 260a. Like the conductor 205a, the conductor 260a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of oxygen atoms, oxygen molecules, and the like).

When the conductor 260a has a function of inhibiting diffusion of oxygen, the range of choices for the material of the conductor 260b can be expanded. That is, when the conductor 260a is included, oxidization of the conductor 260b is inhibited, whereby a decrease in conductivity can be prevented.

As a conductive material which has a function of inhibiting diffusion of oxygen, for example, tantalum, tantalum nitride, ruthenium, ruthenium oxide, or the like is preferably used. The oxide semiconductor that can be used for the oxide 230 can be used for the conductor 260a. In that case, when the conductor 260b is deposited by a sputtering method, the electric resistance value of the conductor 260a can be reduced so that it can become a conductor. The conductor 260a formed in such a manner can be referred to as an OC (Oxide Conductor) electrode.

The conductor 260 functions as a wiring and thus is preferably a conductor having high conductivity. For example, a conductive material containing tungsten, copper, or aluminum as its main component can be used for the conductor 260b. The conductor 260b may have a stacked-layer structure; for example, a stacked layer of titanium or titanium nitride and the above conductive material may be employed.

The insulator 274 is preferably provided to cover the top surface and the side surface of the conductor 260, the side surface of the insulator 250, and the side surface of the oxide 230c. Note that the insulator 274 is preferably formed using an insulating material having a function of inhibiting diffusion of impurities such as water and hydrogen and oxygen. For example, aluminum oxide, hafnium oxide, or the like is preferably used. Alternatively, for example, a metal oxide such as magnesium oxide, gallium oxide, germanium oxide, yttrium oxide, zirconium oxide, lanthanum oxide, neodymium oxide, or tantalum oxide, silicon nitride oxide, silicon nitride, or the like can be used.

By provision of the insulator 274, oxidation of the conductor 260 can be inhibited. Moreover, when the insulator 274 is included, diffusion of impurities such as water and hydrogen included in the insulator 280 into the transistor 200 can be inhibited.

The insulator 280, the insulator 282, and the insulator 284 function as interlayer films.

Like the insulator 214 and the insulator 274, the insulator 282 preferably functions as a barrier insulating film that inhibits impurities such as water and hydrogen from entering the transistor 200 from the outside.

Like the insulator 216, the insulator 280 and the insulator 284 preferably have a lower dielectric constant than the insulator 282. When a material having a low dielectric constant is used for the interlayer film, the parasitic capacitance generated between wirings can be reduced.

In addition, the transistor 200 may be electrically connected to another component through the plug or the wiring such as the conductor 246 embedded in the insulator 280, the insulator 282, and the insulator 284.

As a material of the conductor 246, a single layer or a stacked layer of a conductive material such as a metal material, an alloy material, a metal nitride material, or a metal oxide material can be used as in the conductor 205. For example, it is preferable to use a high-melting-point material that has both heat resistance and conductivity, such as tungsten or molybdenum. Alternatively, the conductor 246 is preferably formed with a low-resistance conductive material such as aluminum or copper. The use of a low-resistance conductive material can reduce wiring resistance.

For example, the conductor 246 employs a stacked-layer structure of tantalum nitride or the like, which is a conductive material having a barrier property against hydrogen and oxygen, and tungsten, which has high conductivity, whereby the diffusion of impurities from the outside can be inhibited while the conductivity of a wiring is kept.

In addition, an insulator 276 (an insulator 276a and an insulator 276b) having a barrier property may be placed between the conductor 246 and the insulator 280. Providing the insulator 276 can inhibit oxygen in the insulator 280 from reacting with the conductor 246 and oxidizing the conductor 246.

Furthermore, by provision of the insulator 276 having a barrier property, the range of choices for the materials of the conductor used for the plug or the wiring can be expanded. The use of a metal material having an oxygen absorbing property and high conductivity for the conductor 246, for example, can provide a semiconductor device with low power consumption. As specific examples, a material having low oxidation resistance and high conductivity, such as tungsten or aluminum, can be used. For example, a conductor that can be easily deposited or processed can be used.

With the above structure, a semiconductor device that includes a transistor including an oxide semiconductor and having a high on-state current can be provided. Alternatively, a semiconductor device that includes a transistor including an oxide semiconductor and having a low off-state current can be provided. Alternatively, a semiconductor device that has a small variation in electrical characteristics, stable electrical characteristics, and high reliability can be provided.

<Structure 2 of Semiconductor Device>

Figure 6A:
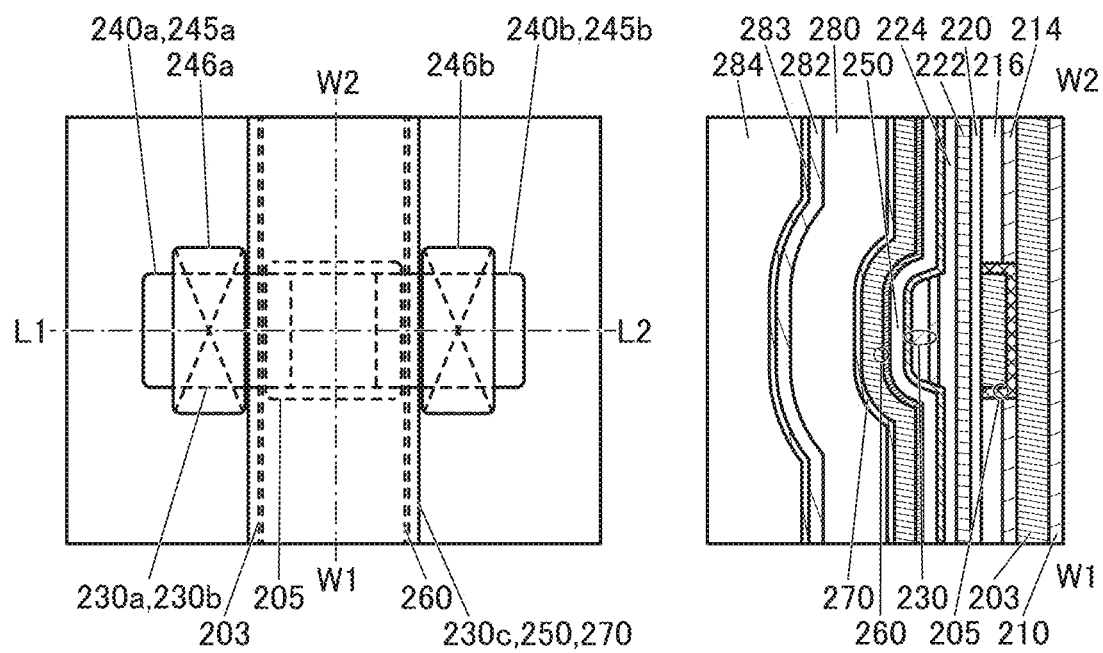
FIGS. 6A-6C A top view and cross-sectional views of a semiconductor device of one embodiment of the present invention.
Figure 6C:
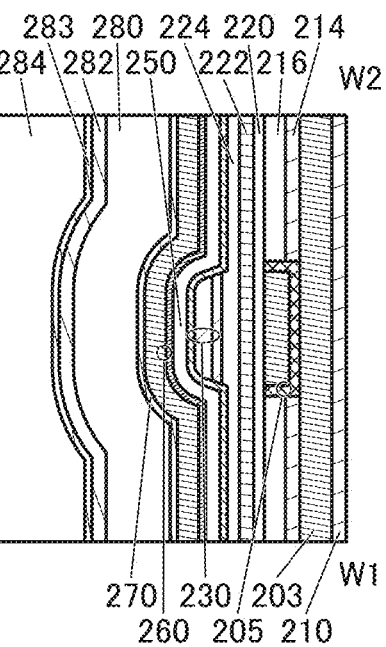
Figure 6B:
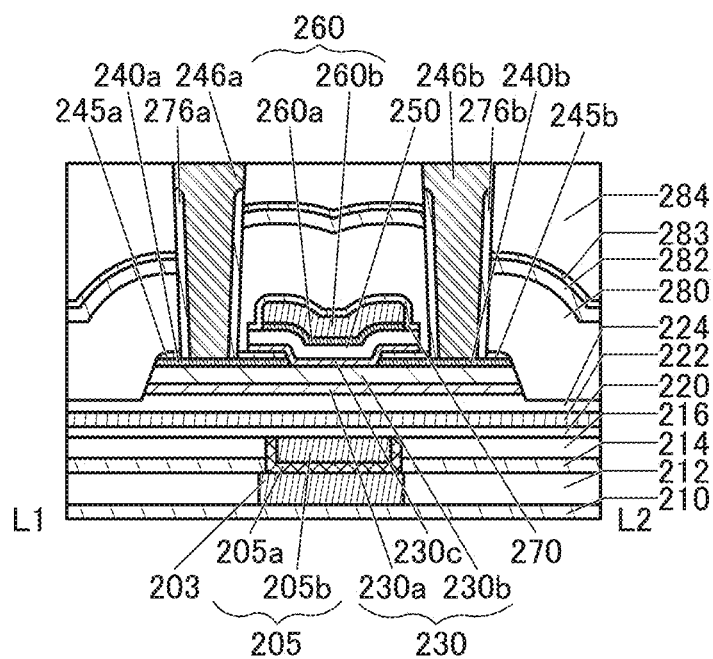

FIG. 6 illustrates an example of a semiconductor device including the transistor 200. FIG. 6(A) is a top view of the semiconductor device. Note that for simplification of the drawing, some films are omitted in FIG. 6(A). FIG. 6(B) is the cross-sectional view taken along the dashed-dotted line L1-L2 shown in FIG. 6(A), and FIG. 6(C) is the cross-sectional view taken along the dashed-dotted line W1-W2 shown in FIG. 6(A).

Note that in the semiconductor device illustrated in FIG. 6, components having the same functions as the components included in the semiconductor device illustrated in FIG. 5 are denoted by the same reference numerals.

The insulator 274 is not necessarily provided in the semiconductor device illustrated in FIG. 6. For example, in the case where impurities such as hydrogen and water are reduced sufficiently in the insulator 280, the insulator 274 is not necessary.

In the case where a material that is easily oxidized is used for the conductor 260, for example, an insulator 270 having a barrier property may be provided. When the insulator 270 covers the side surface and the top surface of the conductor 260, the conductor 260 can be inhibited from being oxidized and having higher resistance.

When a material that is easily oxidized is also used for the conductor 240, for example, an insulator 245 (an insulator 245a and an insulator 245b) having a barrier property may be provided. When the insulator 245 covers the top surface of the conductor 240, the conductor 240 can be inhibited from being oxidized and having higher resistance. Note that although the structure in which the insulator 245 covers only the top surface of the conductor 240 is shown in FIG. 6, the structure in which the insulator 245 covers the side surface of the conductor 240, the side surface of the oxide 230a, and the side surface of the oxide 230b may be employed.

The insulator 280 is not necessarily subjected to planarization treatment. For example, when the top surface of the insulator 280 has unevenness, an insulator 283 having high coverage is preferably provided over the insulator 282. Note that the insulator 283 preferably has a barrier property. Further preferably, the same material as the insulator 282 is used. When the same material is used for the insulator 283 and the insulator 282, generation of a defect such as peeling can be inhibited.

The insulator 283 is deposited by an atomic layer deposition (ALD) method, whereby coverage can be improved. A sputtering method, which achieves a higher deposition rate than an ALD method, can improve the productivity. Thus, the insulator 282 is deposited by a sputtering method and the insulator 283 is deposited by an ALD method, so that a stacked-layer structure having a high barrier property can be obtained.

When an insulator having a barrier property is provided in contact with a conductor, the range of choices for materials of the conductor can be expanded. The use of a metal material having an oxygen absorbing property and high conductivity for the conductor, for example, can provide a semiconductor device with low power consumption. As specific examples, a material having low oxidation resistance and high conductivity, such as tungsten or aluminum, can be used. For example, a conductor that can be easily deposited or processed can be used.

<Structure 3 of Semiconductor Device>

Figure 7A:
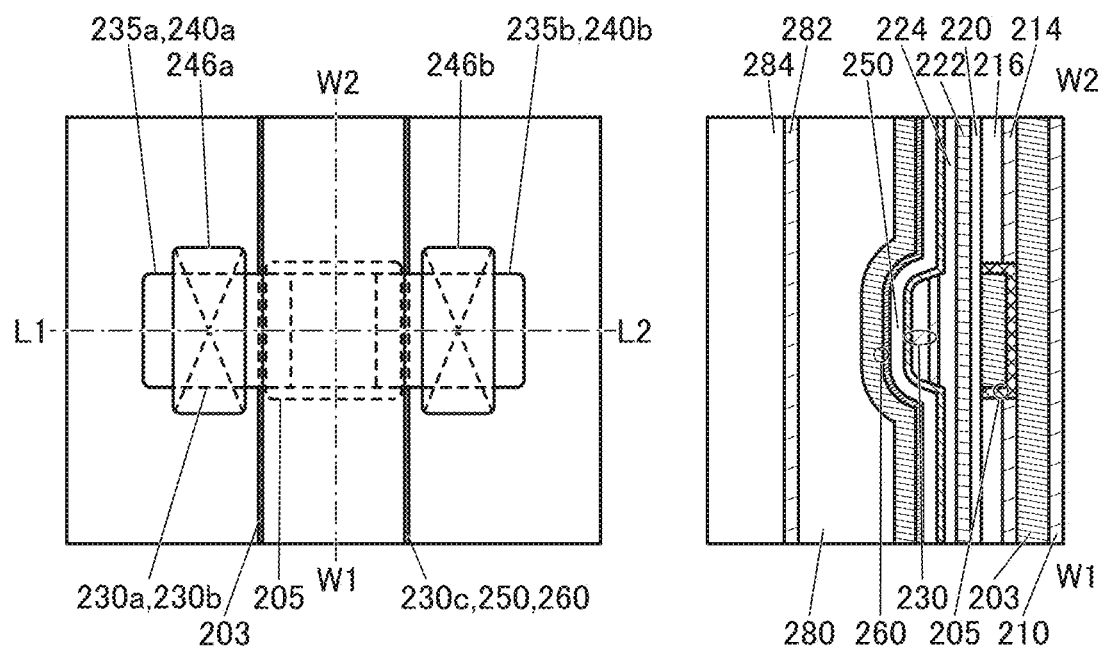
FIGS. 7A-7C A top view and cross-sectional views of a semiconductor device of one embodiment of the present invention.
Figure 7C:
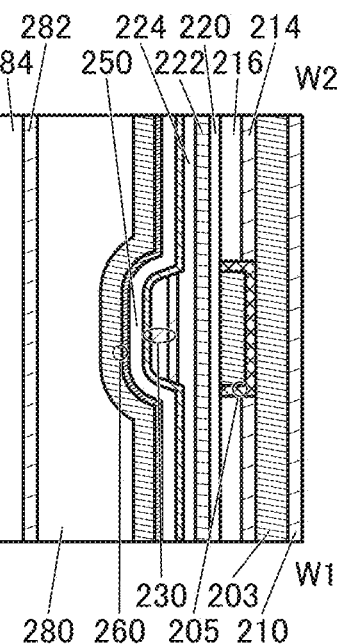
Figure 7B:
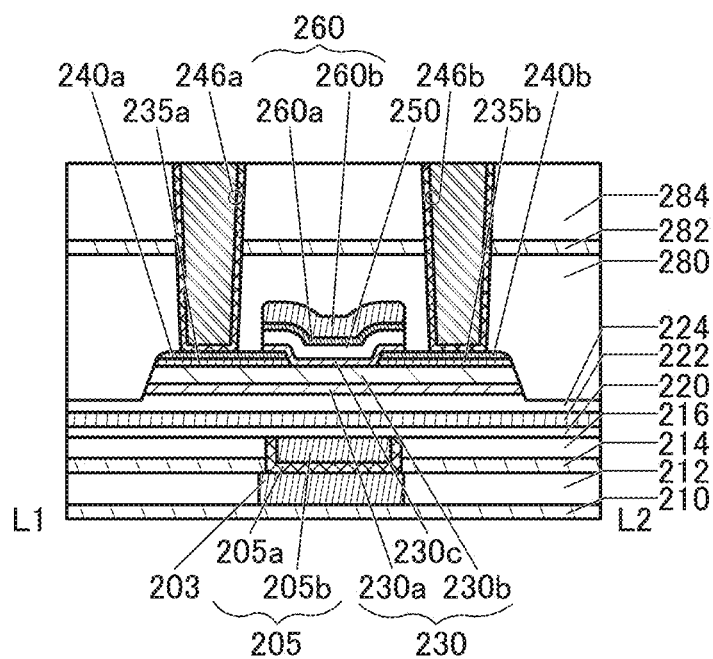

FIG. 7 illustrates an example of a semiconductor device including the transistor 200. FIG. 7(A) is a top view of the semiconductor device. Note that for simplification of the drawing, some films are omitted in FIG. 7(A). FIG. 7(B) is the cross-sectional view taken along the dashed-dotted line L1-L2 shown in FIG. 7(A), and FIG. 7(C) is the cross-sectional view taken along the dashed-dotted line W1-W2 shown in FIG. 7(A).

Note that in the semiconductor device illustrated in FIG. 7, components having the same functions as the components included in the semiconductor device illustrated in FIG. 5 and FIG. 6 are denoted by the same reference numerals.

In the case where a conductor having oxidation resistance is used as a conductor included in the transistor 200, an insulator having a barrier property is not necessarily provided.

For example, the insulator 276 is not necessarily provided in contact with the conductor 246. In that case, for example, the conductor 246 preferably has a stacked-layer structure of a material having oxidation resistance and a material having low resistance, like the conductor 205.

When a material having oxidation resistance is used for the conductor 260, the insulator 274 or the insulator 270 is not needed, which improves the flexibility of the layout. This leads to higher integration.

In addition, an oxide 235 (an oxide 235a and an oxide 235b) may be provided between the conductor 240 and the oxide 230b. A metal oxide used for the oxide 230 can be used for the oxide 235. In particular, an atom that can have a valence of +4 may be added to the oxide 235. An atom having a valence of +4 functions in some cases as a donor when the atom having a valence of +4 is added to the oxide 235. In other words, when the oxide 235 is placed between the oxide 230b and the conductor 240, the contact resistance between the oxide 230b and the conductor 240 can be reduced.

With the above structure, a semiconductor device that includes a transistor including an oxide semiconductor and having a high on-state current can be provided. Alternatively, a semiconductor device that includes a transistor including an oxide semiconductor and having a low off-state current can be provided. Alternatively, a semiconductor device that has a small variation in electrical characteristics, stable electrical characteristics, and high reliability can be provided.

Examples of the structures of the semiconductor device described in this embodiment can be combined with each other as appropriate.

The structures, methods, and the like described above in this embodiment can be used in combination as appropriate with the structures, methods, and the like described in the other embodiments and other examples.

Embodiment 3

In this embodiment, one embodiment of a semiconductor device is described using FIG. 8 to FIG. 16. Note that in the semiconductor device described in this embodiment, components having the same functions as the components in the semiconductor device described in the above embodiment are denoted by the same reference numerals. In addition, description in the above embodiment can be referred to for details of the components of the semiconductor device in this embodiment which are common to the components of the semiconductor device in the above embodiment and for details of the components denoted by the same reference numerals.

Modification Example 1 of Structure of Semiconductor Device

Figure 8A:
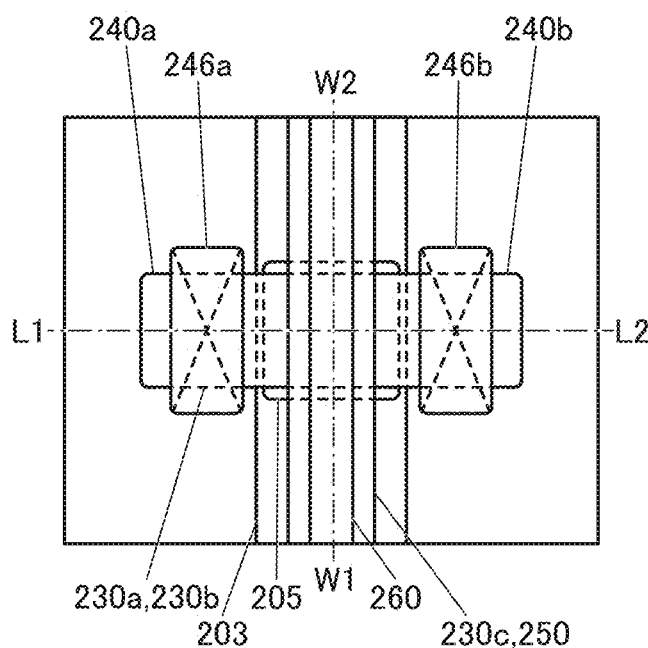
FIGS. 8A-8C A top view and cross-sectional views of a semiconductor device of one embodiment of the present invention.
Figure 8C:
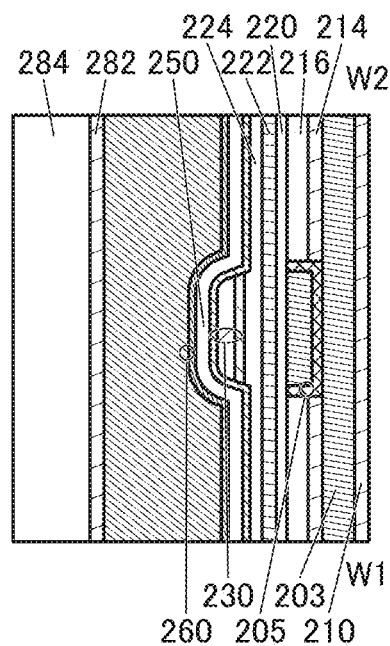
Figure 8B:
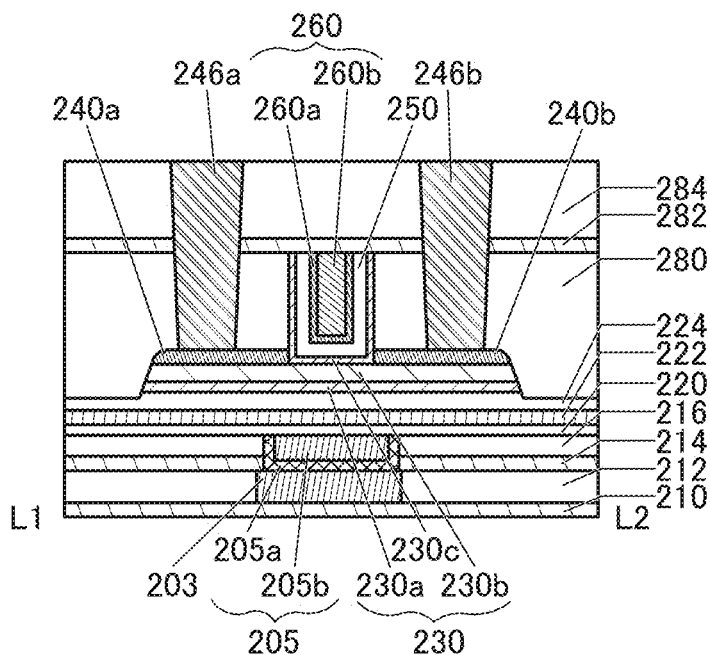
Figure 9A:
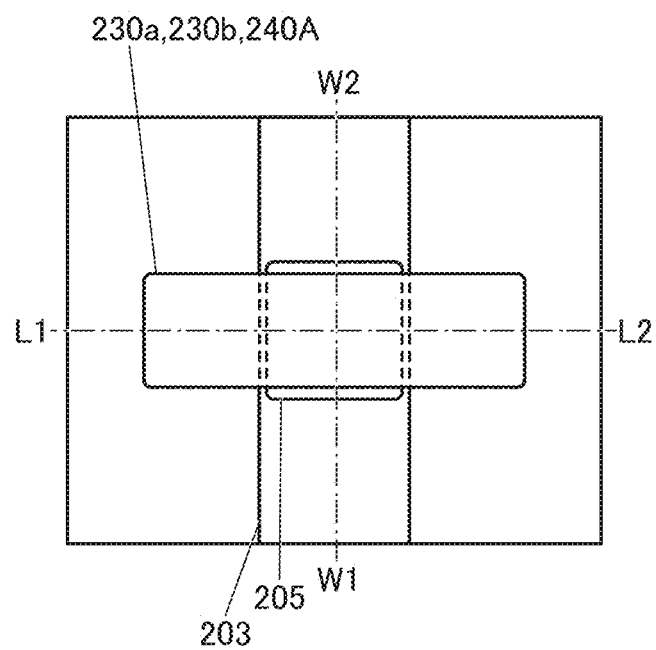
FIGS. 9A-9C Cross-sectional views illustrating a method of fabricating a semiconductor device of one embodiment of the present invention.
Figure 9C:
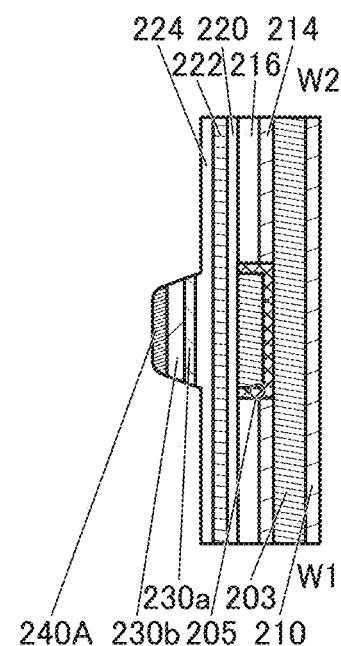
Figure 9B:
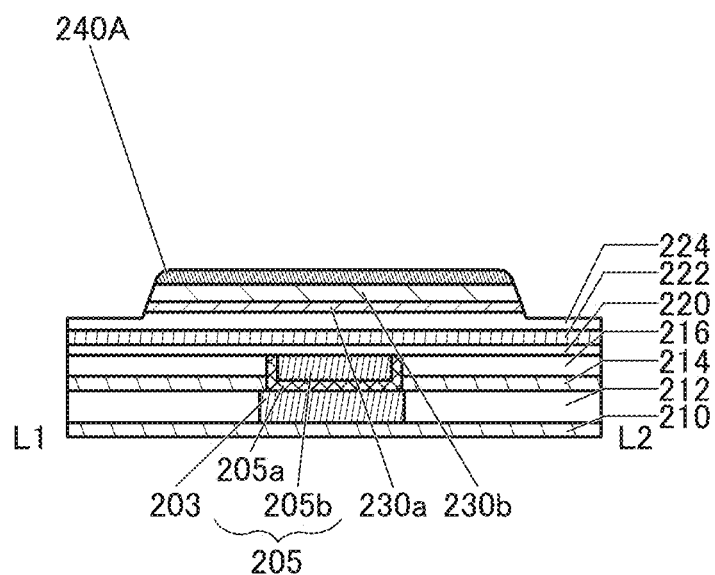

An example of a semiconductor device including the transistor 200 according to one embodiment of the present invention is described below. FIG. 8(A), FIG. 8(B), and FIG. 8(C) are a top view and cross-sectional views of the transistor 200 according to one embodiment of the present invention and a periphery of the transistor 200. FIG. 8(A) is the top view, FIG. 8(B) is the cross-sectional view taken along the dashed-dotted line L1-L2 in FIG. 8(A), and FIG. 8(C) is the cross-sectional view taken along the dashed-dotted line W1-W2 in FIG. 8(A). Note that for simplification of the drawing, some components are not illustrated in the top view of FIG. 8(A).

The semiconductor device of one embodiment of the present invention includes the transistor 200 and the insulator 210, the insulator 212, the insulator 214, the insulator 216, the insulator 280, the insulator 282, and the insulator 284 functioning as interlayer films.

The semiconductor device also includes the conductor 246 (the conductor 246a and the conductor 246b) functioning as a plug and being electrically connected to the transistor 200. The semiconductor device further includes the conductor 203 that is electrically connected to the transistor 200 and functions as a wiring.

The transistor 200 includes the conductor 260 (the conductor 260a and the conductor 260b) functioning as the first gate electrode, the conductor 205 (the conductor 205a and the conductor 205b) functioning as the second gate electrode, an insulator 250 functioning as the first gate insulator, the insulator 220, the insulator 222, and the insulator 224 functioning as the second gate insulator, the oxide 230 (the oxide 230a, the oxide 230b, and the oxide 230c) including a region where a channel is formed, the conductor 240a functioning as one of a source and a drain, and the conductor 240b functioning as the other of the source and the drain.

The oxide semiconductor described above in Embodiment 1 can be used for the oxide 230 in the transistor 200. The use of the oxide semiconductor for the oxide 230 can inhibit generation of oxygen vacancies in the oxide 230. Accordingly, the transistor having high reliability can be provided. Furthermore, the carrier concentration of the transistor can be adjusted and accordingly design flexibility is improved. In addition, the oxide semiconductor can be deposited by a sputtering method or the like and thus can be used for a transistor constituting a highly integrated semiconductor device.

In the transistor 200 illustrated in FIG. 8, the oxide 230c, the insulator 250, and the conductor 260 are placed in an opening portion provided in the insulator 280. The oxide 230c, the insulator 250, and the conductor 260 are placed between the conductor 240a and the conductor 240b.

Note that the oxide 230c is preferably provided in the opening portion provided in the insulator 280. This structure facilitates high integration of a plurality of transistors with a small variation.

In addition, a barrier layer may be provided over the conductor 240. A substance having a barrier property against oxygen or hydrogen is preferably used for the barrier layer. With this structure, the conductor 240 can be inhibited from being oxidized when the insulator 280 is deposited.

For example, a metal oxide can be used for the above barrier layer. In particular, an insulating film having a barrier property against oxygen or hydrogen, such as aluminum oxide, hafnium oxide, or gallium oxide, is preferably used. Alternatively, silicon nitride formed by a CVD method may be used.

When the above barrier layer is included, the range of choices for the materials of the conductor 240 can be expanded. For example, a material having low oxidation resistance and high conductivity, such as tungsten or aluminum, can be used for the conductor 240. For example, a conductor that can be easily deposited or processed can be used.

The insulator 250 functions as the first gate insulator. The insulator 250 is preferably provided in the opening portion provided in the insulator 280 with the oxide 230c positioned therebetween.

With miniaturization and high integration of a transistor, a problem of leakage current or the like may arise because of a thinner gate insulator. In that case, the insulator 250 may have a stacked-layer structure like the second gate insulator. When the insulator functioning as a gate insulator has a stacked-layer structure of a high-k material and a thermally stable material, a gate potential during operation of the transistor can be reduced while the physical thickness of the gate insulator is kept. Furthermore, the stacked-layer structure can be thermally stable and have a high dielectric constant.

In addition, an insulator having a barrier property may be placed between the conductor 246 and the insulator 280. Providing the insulator can inhibit oxygen in the insulator 280 from reacting with the conductor 246 and oxidizing the conductor 246.

Furthermore, by provision of the insulator having a barrier property, the range of choices for the materials of the conductor used for a plug or a wiring can be expanded. The use of a metal material having an oxygen absorbing property and high conductivity for the conductor 246, for example, can provide a semiconductor device with low power consumption. As specific examples, a material having low oxidation resistance and high conductivity, such as tungsten or aluminum, can be used. For example, a conductor that can be easily deposited or processed can be used.

With the above structure, a semiconductor device that includes a transistor including an oxide semiconductor and having a high on-state current can be provided. Alternatively, a semiconductor device that includes a transistor including an oxide semiconductor and having a low off-state current can be provided. Alternatively, a semiconductor device that has a small variation in electrical characteristics, stable electrical characteristics, and high reliability can be provided.

<Method of Fabricating Semiconductor Device>

Next, a method for fabricating a semiconductor device including the transistor 200 according to the present invention, which is illustrated in FIG. 8, will be described with reference to FIG. 9 to FIG. 16. In FIG. 9 to FIG. 16, (A) of each drawing is a top view. Moreover, (B) of each drawing is a cross-sectional view corresponding to a portion indicated by the dashed-dotted line L1-L2 in (A), and is also a cross-sectional view of the transistor 200 in the channel length direction. Furthermore, (C) of each drawing is a cross-sectional view corresponding to a portion indicated by the dashed-dotted line W1-W2 in (A), and is also a cross-sectional view of the transistor 200 in the channel width direction. Note that for simplification of the drawings, some components are not illustrated in the top view of (A) of each drawing.

First, a substrate (not illustrated) is prepared and the insulator 210 is deposited over the substrate. The insulator 210 can be deposited by a sputtering method, a CVD method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In this case, accumulated charges might break the wiring, electrode, element, or the like included in the semiconductor device. By contrast, in the case of a thermal CVD method that does not use plasma, such plasma damage is not caused and the yield of the semiconductor device can be increased. Furthermore, a thermal CVD method does not cause plasma damage during deposition, so that a film with few defects can be obtained.

An ALD method is also a deposition method which enables less plasma damage to an object. An ALD method also does not cause plasma damage during deposition, so that a film with few defects can be obtained. Note that a precursor used in an ALD method sometimes contains impurities such as carbon. Thus, a film provided by an ALD method contains impurities such as carbon in a larger amount than a film provided by another deposition method, in some cases. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and thus is suitable for covering a surface of an opening with a high aspect ratio, for example. On the other hand, an ALD method has a relatively low deposition rate; thus, it is sometimes preferable to combine an ALD method with another deposition method with a high deposition rate such as a CVD method.

A CVD method and an ALD method enable control of the composition of a film to be obtained with a flow rate ratio of the source gases. For example, by a CVD method or an ALD method, a film with a certain composition can be deposited depending on a flow rate ratio of the source gases. Moreover, by a CVD method or an ALD method, by changing the flow rate ratio of the source gases during the deposition, a film whose composition is continuously changed can be deposited. In the case of depositing while changing the flow rate ratio of the source gases, as compared with the case of depositing with the use of a plurality of deposition chambers, time taken for the deposition can be shortened because time taken for transfer and pressure adjustment is omitted. Thus, productivity of semiconductor devices can be improved in some cases.

For example, a film having a barrier property such as aluminum oxide is preferably deposited for the insulator 210 by a sputtering method. The insulator 210 may have a multilayer structure. For example, a structure may be employed in which aluminum oxide is deposited by a sputtering method and another aluminum oxide is deposited over the aluminum oxide by an ALD method. Alternatively, a structure may be employed in which aluminum oxide is deposited by an ALD method and another aluminum oxide is deposited over the aluminum oxide by a sputtering method.

Then, a conductive film to be the conductor 203 is deposited over the insulator 210. For example, tungsten is preferably deposited as the conductive film to be the conductor 203. The conductive film to be the conductor 203 can be deposited by a sputtering method, a CVD method, an MBE method, a PLD method, an ALD method, or the like. The conductive film to be the conductor 203 can be a multilayer film.

Next, the conductive film to be the conductor 203 is processed by a lithography method, so that the conductor 203 is formed.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

A hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 203, forming a resist mask thereover, and then etching the hard mask material. The etching of the conductive film to be the conductor 203 may be performed after removal of the resist mask or with the resist mask remaining. In the latter case, the resist mask sometimes disappears during the etching. The hard mask may be removed by etching after the etching of the conductive film to be the conductor 203. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency voltage is applied to one of the parallel plate type electrodes. Alternatively, a structure may employed in which different high-frequency voltages are applied to one of the parallel plate type electrodes. Alternatively, a structure may be employed in which high-frequency voltages with the same frequency are applied to the parallel plate type electrodes. Alternatively, a structure may be employed in which high-frequency voltages with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 212 is deposited over the insulator 210 and the conductor 203. For example, as the insulating film to be the insulator 212, silicon oxide is preferably deposited by a CVD method. The insulator to be the insulator 212 can be deposited by a sputtering method, a CVD method, an MBE method, a PLD method, an ALD method, or the like. Here, the thickness of the insulating film to be the insulator 212 is greater than or equal to the thickness of the conductor 203. For example, when the thickness of the conductor 203 is 1, the thickness of the insulating film to be the insulator 212 is greater than or equal to 1 and less than or equal to 3.

Next, CMP (Chemical Mechanical Polishing) treatment is performed on the insulating film to be the insulator 212, so that part of the insulating film to be the insulator 212 is removed and a surface of the conductor 203 is exposed. Thus, the insulator 212 whose top surface is flat can be formed (see FIG. 9).

Instead of employing the above manufacturing method, a wiring layer including the conductor 203 is formed in such a manner that the insulator 212 is deposited and then the conductor 203 is embedded in the insulator 212.

Specifically, an opening reaching the insulator 210 is formed in the insulator 212. Note that examples of the opening include a groove and a slit. A region where the opening is formed may be referred to as an opening portion. Wet etching can be used for the formation of the openings; however, dry etching is preferably used for microfabrication. As the insulator 210, it is preferable to select an insulator that functions as an etching stopper film used in forming the groove by etching the insulator 212. For example, in the case where a silicon oxide film is used as the insulator 212 in which the groove is to be formed, a silicon nitride film, an aluminum oxide film, or a hafnium oxide film is preferably used as the insulator 210.

After the formation of the opening, the conductive film to be the conductor 203 is deposited. The conductive film desirably includes a hardly oxidizable material. For example, tantalum nitride, tungsten nitride, or titanium nitride can be used. Alternatively, a stacked film of tantalum nitride, tungsten nitride, titanium nitride, or the like and tantalum, tungsten, titanium, molybdenum, aluminum, copper, or a molybdenum-tungsten alloy can be used. The conductive film to be the conductor 203 can be deposited by a sputtering method, a CVD method, an MBE method, a PLD method, an ALD method, or the like.

The conductive film to be the conductor 203 may have a multilayer structure. For example, as a lower layer of the conductive film to be the conductor 203, tantalum nitride is deposited by a sputtering method, and titanium nitride is stacked over the tantalum nitride. Furthermore, as an upper layer of the conductive film to be the conductor 203, a conductive film of copper or the like, which has low resistance, is deposited by a plating method, a sputtering method, a CVD method, an MBE method, a PLD method, an ALD method, or the like. Even when a metal that is likely to diffuse, such as copper, is used for part of the conductor 203, the stack can prevent the metal from diffusing into the outside from the conductor 203.

Next, CMP treatment is performed to remove parts of the upper layer of the conductive film to be the conductor 203 and the lower layer of the conductive film to be the conductor 203, so that the insulator 212 is exposed. As a result, the conductive film to be the conductor 203 remains only in the opening portion. Thus, the conductor 203 whose top surface is flat can be formed. Note that the insulator 212 is partly removed by the CMP treatment in some cases. Accordingly, the wiring layer including the conductor 203 can be formed.

Next, the insulator 214 is deposited over the insulator 212 and the conductor 203. The insulator 214 can be deposited by a sputtering method, a CVD method, an MBE method, a PLD method, an ALD method, or the like. For example, for the insulator 214, silicon nitride is preferably deposited by a CVD method. An insulator through which copper is less likely to pass, such as silicon nitride, is used for the insulator 214; accordingly, even when a metal that is easily diffused, such as copper, is used for the upper layer of the conductor 203, the metal can be inhibited from diffusing into layers above the insulator 214.

Next, the insulator 216 is deposited over the insulator 214. The insulator 216 can be deposited by a sputtering method, a CVD method, an MBE method, a PLD method, an ALD method, or the like. For example, for the insulator 216, silicon oxide is preferably deposited by a CVD method.

Next, an opening reaching the conductor 203 is formed in the insulator 214 and the insulator 216. A wet etching method may be used for the formation of the opening; however, a dry etching method is preferably used for microfabrication.

After the formation of the opening, the conductive film to be the conductor 205 is deposited. For example, tantalum nitride, tungsten nitride, or titanium nitride can be used for the conductor 205. Alternatively, a stacked film of tantalum nitride, tungsten nitride, titanium nitride, or the like and tantalum, tungsten, titanium, molybdenum, aluminum, copper, or a molybdenum-tungsten alloy can be used. The conductive film to be the conductor 205 can be deposited by a sputtering method, a CVD method, an MBE method, a PLD method, an ALD method, or the like.

In the case where the conductor 205 is in contact with an insulator formed of an oxide, the conductive film to be the conductor 205a preferably includes a conductive material that has a function of inhibiting the passage of oxygen. As the conductive film to be the conductor 205a, for example, tantalum nitride is preferably deposited by a sputtering method. As the conductive film to be the conductor 205b, preferably, titanium nitride is deposited by a CVD method and tungsten is deposited by a CVD method over the titanium nitride.

Next, CMP treatment is performed to remove parts of the conductive film to be the conductor 205a and the conductive film to be the conductor 205b, so that the insulator 216 is exposed. As a result, the conductive film to be the conductor 205a and the conductive film to be the conductor 205b remain only in the opening portion. Thus, the conductor 205 including the conductor 205a and the conductor 205b, which has a flat top surface, can be formed (see FIG. 9). Note that the insulator 216 is partly removed by the CMP treatment in some cases.

Next, the insulator 220, the insulator 222, and the insulator 224 are deposited over the insulator 216 and the conductor 205. The insulator 220, the insulator 222, and the insulator 224 can be deposited by a sputtering method, a CVD method, an MBE method, a PLD method, an ALD method, or the like.

Since the insulator 220, the insulator 222, and the insulator 224 function as a gate insulator in some cases, a stacked-layer structure of a material having high heat resistance, such as silicon oxide, and a material having a high dielectric constant is preferably used. For example, silicon oxide is preferably used for the insulator 220 and the insulator 224. An insulator containing an oxide of one or both of aluminum and hafnium is preferably deposited for the insulator 222. Note that it is preferable to use aluminum oxide, hafnium oxide, an oxide containing aluminum and hafnium (hafnium aluminate), or the like as an insulator containing an oxide of one or both of aluminum and hafnium.

Note that the insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from diffusing into the transistor 200 through the insulator 222, and generation of oxygen vacancies in the oxide 230 can be inhibited.

Sequentially, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. Alternatively, the heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

For example, as the heat treatment, treatment is performed at 400° C. in a nitrogen atmosphere for one hour after the deposition of the insulator 224. By the heat treatment, impurities such as water and hydrogen contained in the insulator 224 can be removed, for example.

This heat treatment can also be performed after the deposition of the insulator 220 and after the deposition of the insulator 222. Although the conditions for the above-described heat treatment can be used for the heat treatment, the heat treatment after the deposition of the insulator 220 is preferably performed in an atmosphere containing nitrogen.

For the insulator 224, plasma treatment containing oxygen may be performed under a reduced pressure. The plasma treatment containing oxygen is preferably performed using an apparatus including a power source for generating high-density plasma using microwaves, for example. Alternatively, a power source for applying an RF (Radio Frequency) to a substrate side may be included. Alternatively, after plasma treatment containing an inert gas is performed, plasma treatment containing oxygen may be performed. Note that impurities such as water and hydrogen contained in the insulator 224 can be removed by selecting the conditions for the plasma treatment appropriately. In that case, the heat treatment is not necessarily performed.

Next, an oxide film to be the oxide 230a, an oxide film to be the oxide 230b, and a conductive film to be the conductor 240 are sequentially deposited over the insulator 224. The oxide film to be the oxide 230a, the oxide film to be the oxide 230b, and the conductive film to be the conductor 240 can be deposited by a sputtering method, a CVD method, an MBE method, a PLD method, an ALD method, or the like.

Here, at least for the oxide 230b, the oxide semiconductor described in Embodiment 1 is preferably used. The oxide 230b can be deposited by, for example, a sputtering method. In the case where the oxide 230b is deposited by a sputtering method, a mixed gas of oxygen and nitrogen or a mixed gas of oxygen, nitrogen, and a rare gas is preferably used as a sputtering gas. For example, when the flow rate of an oxygen gas in the sputtering gas is 1, the flow rate of a nitrogen gas is higher than or equal to 0.1 and lower than or equal to 3. Adjustment of the rate of a nitrogen gas to an oxygen gas can control properties of the oxide 230b.

In the case where the above oxide film is deposited by a sputtering method, the above In-M-Zn oxide target can be used. Note that the target may contain nitrogen.

For the oxide 230a, the oxide semiconductor is selected as appropriate in accordance with required characteristics. For example, the same material and deposition method as those of the oxide 230b can be used. In addition, the oxide 230a preferably includes at least one of the metal elements included in the oxide 230b.

For example, in the case where the oxide film to be the oxide 230a is deposited by a sputtering method, oxygen or a mixed gas of oxygen and a rare gas may be used as a sputtering gas. By increasing the proportion of oxygen contained in the sputtering gas, oxygen vacancies in the oxide films to be deposited can be reduced. In the case where the oxide film to be the oxide 230a is deposited by a sputtering method, the above In-M-Zn oxide target can be used.

Each oxide film is preferably formed in accordance with characteristics required for the oxide 230 by appropriate selection of deposition conditions and an atomic ratio.

The above oxide films are preferably deposited successively without being exposed to the atmospheric environment. By the deposition without exposure to the air, impurities or moisture from the atmospheric environment can be prevented from being attached onto the oxide film to be the oxide 230a and the oxide film to be the oxide 230b. Accordingly, generation of defects in the vicinity of an interface between the oxide film to be the oxide 230a and the oxide film to be the oxide 230b can be inhibited, and the vicinity of the interface can be kept clean.

Next, heat treatment may be performed. For the heat treatment, the conditions for the above-described heat treatment can be used. Through the heat treatment, impurities such as water and hydrogen in the above oxide films can be removed, for example. For example, treatment is preferably performed at 400° C. in a nitrogen atmosphere for one hour, and successively another treatment is performed at 400° C. in an oxygen atmosphere for one hour.

Next, the above oxide films and conductive film are processed into island shapes to form the oxide 230a, the oxide 230b, and a conductor 240A. Note that in the step, the thickness of a region of the insulator 224 which does not overlap with the oxide 230a becomes small in some cases (see FIG. 9).

Here, the oxide 230a, the oxide 230b, and the conductor 240A are formed to at least partly overlap with the conductor 205. It is preferable that the side surfaces of the oxide 230a, the oxide 230b, and the conductor 240A be substantially perpendicular to a top surface of the insulator 222. When the side surfaces of the oxide 230a, the oxide 230b, and the conductor 240A are substantially perpendicular to the top surface of the insulator 222, the plurality of transistors 200 can be provided in a smaller area and at a higher density. Alternatively, a structure may be employed in which an angle formed by the side surfaces of the oxide 230a, the oxide 230b, and the conductor 240A and the top surface of the insulator 222 is a small angle. In that case, the angle formed by the side surfaces of the oxide 230a and the oxide 230b and the top surface of the insulator 222 is preferably greater than or equal to 60° and less than 70°. With such a shape, the coverage with the insulator 280 and the like can be improved in a later step, so that defects such as a void can be reduced.

There is a curved surface between the side surface of and the top surface of the conductor 240A. That is, an end portion of the side surface and an end portion of the top surface are preferably curved (hereinafter such a curved shape is also referred to as a rounded shape). The radius of curvature of the curved surface at an end portion of the conductor 240 is greater than or equal to 3 nm and less than or equal to 10 nm, preferably greater than or equal to 5 nm and less than or equal to 6 nm, for example. When the end portions are not angular, the coverage with films deposited in a later step can be improved.

Note that for the processing of the oxide films, a lithography method can be employed. The processing can be performed by a dry etching method or a wet etching method. The processing by a dry etching method is suitable for microfabrication.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, the ultrasonic cleaning using pure water or carbonated water is performed.

Sequentially, heat treatment may be performed. For the conditions of the heat treatment, the conditions for the above-described heat treatment can be used.

Next, an insulating film 280A to be the insulator 280 is deposited to cover the oxide 230a, the oxide 230b, and the conductor 240A (see FIG. 10). The insulating film 280A can be deposited by a sputtering method, a CVD method, an MBE method, a PLD method, an ALD method, or the like.

Figure 11A:
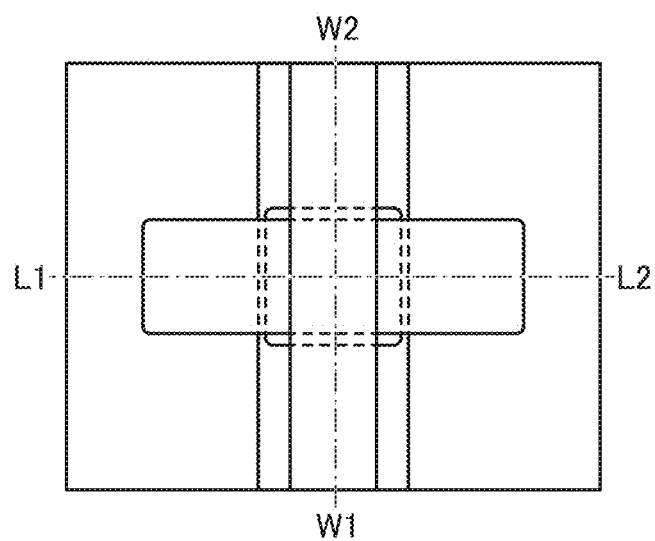
FIGS. 11A-11C Cross-sectional views illustrating a method of fabricating a semiconductor device of one embodiment of the present invention.
Figure 11C:
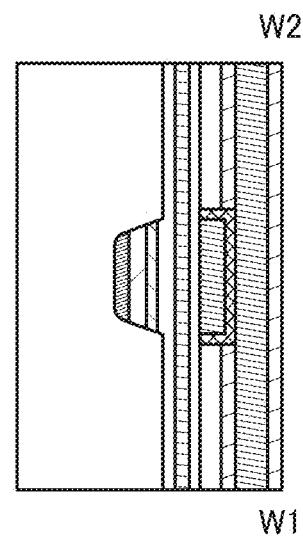
Figure 11B:
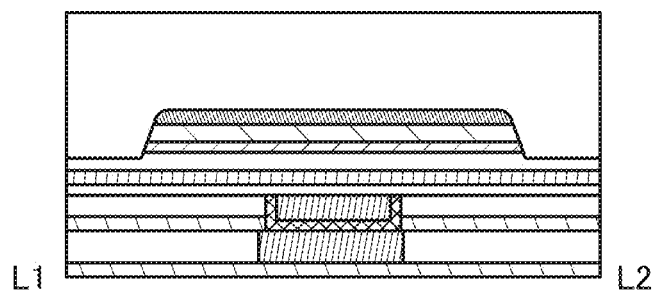

Next, the insulating film 280A is partly removed, whereby the insulating film 280A is planarized (see FIG. 11). The processing preferably employs CMP treatment.

Figure 12A:
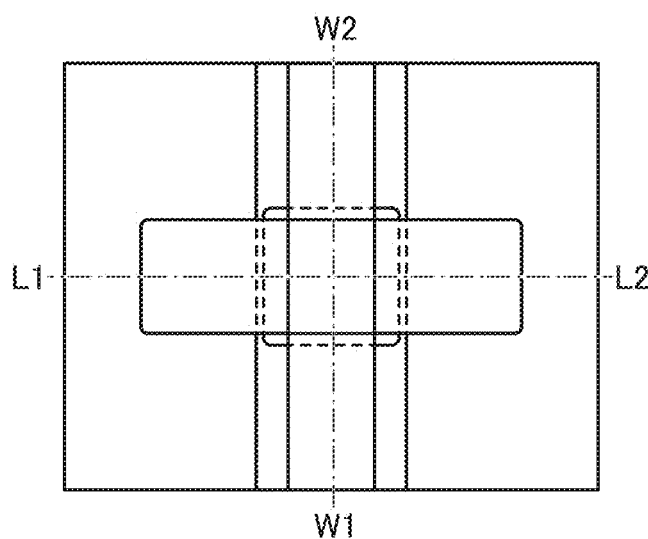
FIGS. 12A-12C Cross-sectional views illustrating a method of fabricating a semiconductor device of one embodiment of the present invention.
Figure 12C:
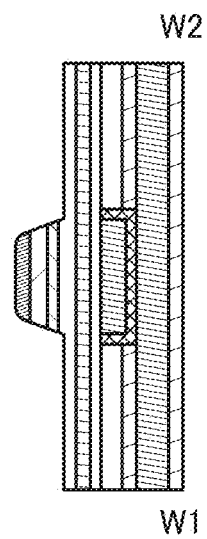
Figure 12B:
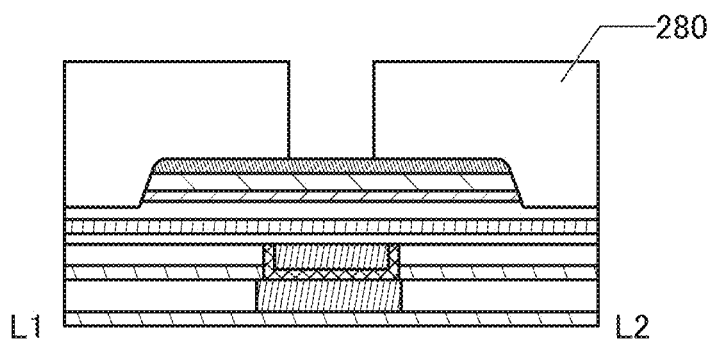
Figure 13A:
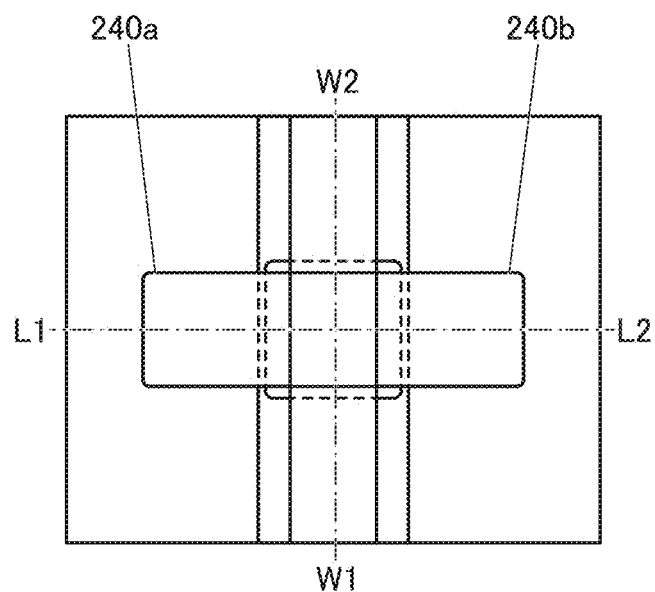
FIGS. 13A-13C Cross-sectional views illustrating a method of fabricating a semiconductor device of one embodiment of the present invention.
Figure 13C:
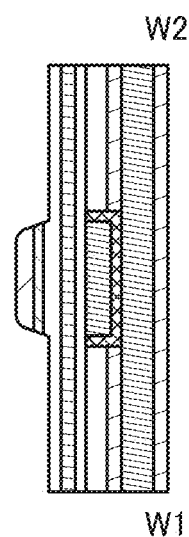
Figure 13B:
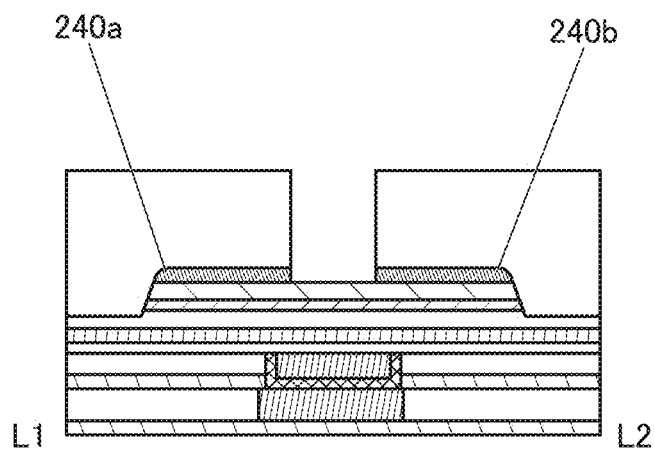

Next, an opening is formed in the insulating film 280A, and the insulator 280 is formed (see FIG. 12). The opening can be formed using a mask by wet etching, dry etching, ashing, or the like. Alternatively, a plurality of the above treatments may be performed in combination as appropriate. By the formation of the opening, the surfaces of the insulator 224, the oxide 230a, the oxide 230b, and the conductor 240A are partly exposed.

Next, the conductor 240A is partly removed, and the conductor 240 (the conductor 240a and the conductor 240b) is formed. The conductor 240A can be removed by wet etching, dry etching, ashing, or the like. Alternatively, a plurality of the above treatments may be performed in combination as appropriate. By the removal of part of the conductor 240A, part of the surface of the oxide 230b is exposed (see FIG. 13).

Figure 14A:
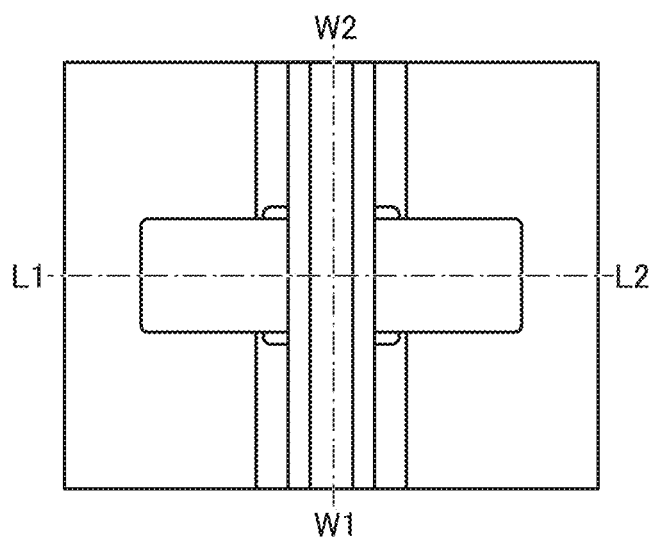
FIGS. 14A-14C Cross-sectional views illustrating a method of fabricating a semiconductor device of one embodiment of the present invention.
Figure 14C:
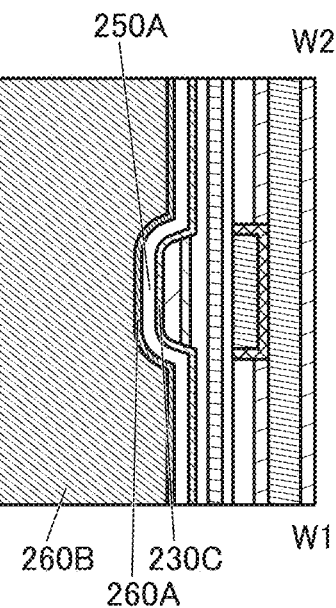
Figure 14B:
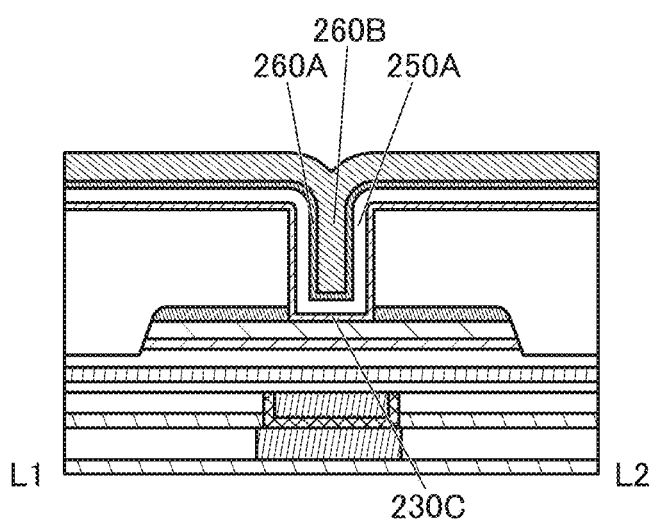
Figure 15A:
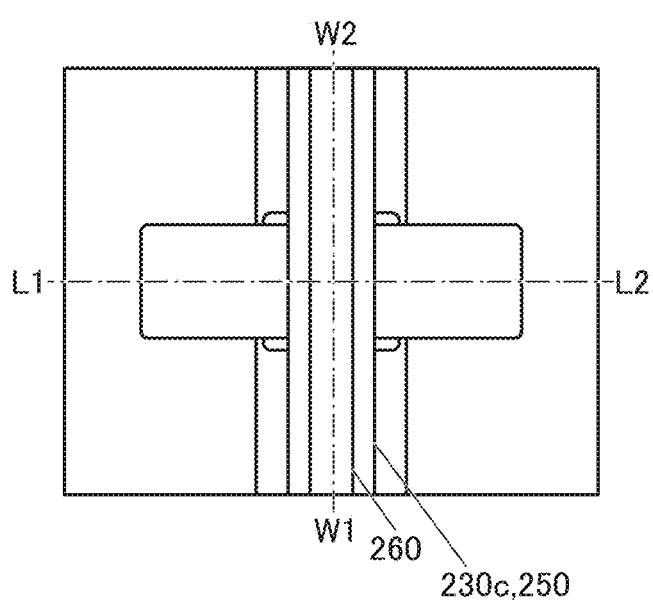
FIGS. 15A-15C Cross-sectional views illustrating a method of fabricating a semiconductor device of one embodiment of the present invention.
Figure 15C:
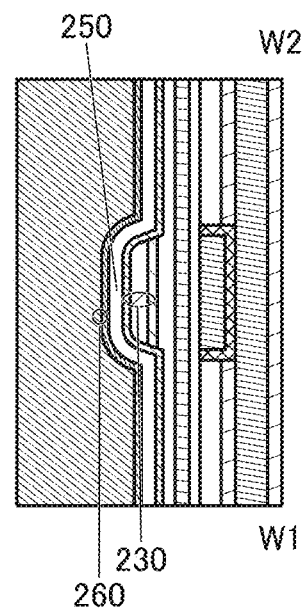
Figure 15B:
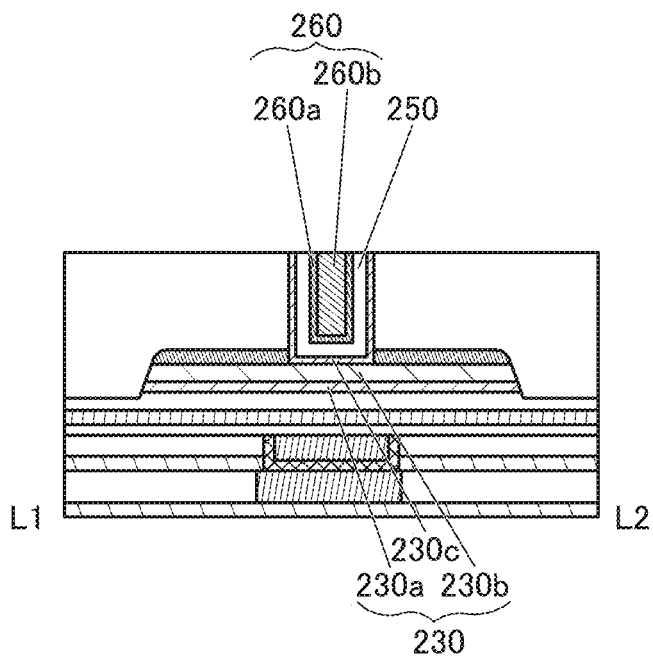

Next, an oxide film 230C is deposited (see FIG. 14). The oxide film 230C can be deposited by a sputtering method, a CVD method, an MBE method, a PLD method, an ALD method, or the like. The oxide film 230C is deposited by a method similar to that for the oxide film to be the oxide 230a or the oxide 230b in accordance with characteristics required for the oxide film 230C.

Next, an insulating film 250A is deposited (see FIG. 14). The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulating film having few impurities can be deposited.

Here, heat treatment or plasma treatment may be performed. For the heat treatment or plasma treatment, the conditions for the above-described heat treatment can be used. The treatment can reduce the moisture concentration and the hydrogen concentration of the insulating film 250A.

Next, the conductive film 260A and the conductive film 260B are deposited (see FIG. 14). The conductive film 260A and the conductive film 260B can be deposited by a sputtering method, a CVD method, an MBE method, a PLD method, an ALD method, or the like. For example, the conductive film 260A is deposited by an ALD method, and the conductive film 260B is deposited by a CVD method Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 15).

Figure 16A:
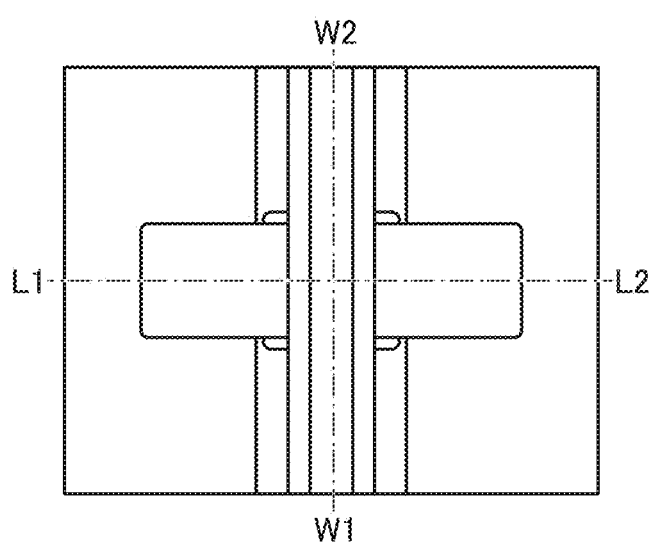
FIGS. 16A-16C Cross-sectional views illustrating a method of fabricating a semiconductor device of one embodiment of the present invention.
Figure 16C:
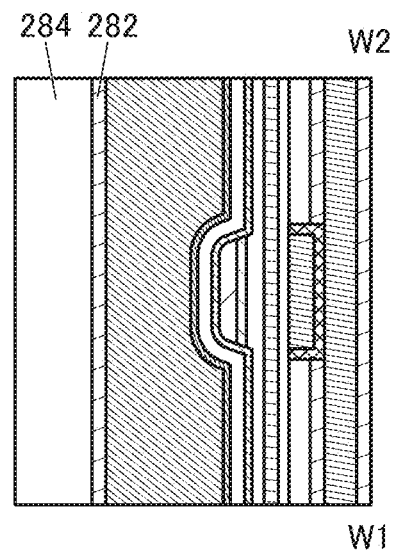
Figure 16B:
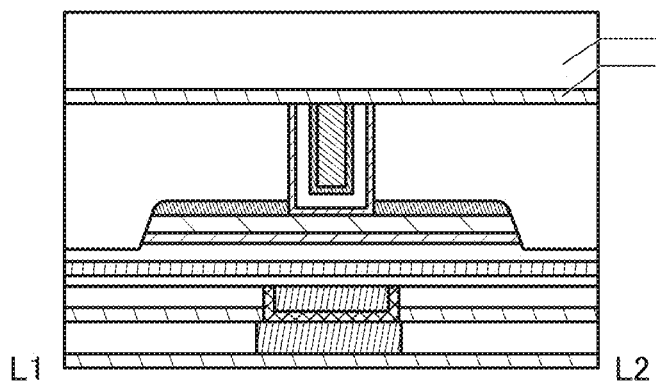

Next, the insulator 282 and the insulator 284 are deposited over the insulator 280 (see FIG. 16). The insulator 282 and the insulator 284 can be deposited by a sputtering method, a CVD method, an MBE method, a PLD method, an ALD method, or the like.

As the insulator 282, an aluminum oxide film is preferably deposited by a sputtering method, for example. With an aluminum oxide film deposited by a sputtering method, hydrogen included in the insulator 280 can be inhibited from diffusing into the oxide 230 in some cases.

Then, openings that reach the conductor 240a and the conductor 240b are formed in the insulator 280, the insulator 282, and the insulator 284. The openings are formed by a lithography method.

Next, the conductive film to be the conductor 246 (the conductor 246a and the conductor 246b) is deposited. The conductive film to be the conductor 246 desirably has a stacked-layer structure which includes a conductor having a function of inhibiting the passage of impurities such as water and hydrogen. For example, a stacked layer of tantalum nitride, titanium nitride, or the like and tungsten, molybdenum, copper, or the like can be employed. The conductive film to be the conductor 246 can be deposited by a sputtering method, a CVD method, an MBE method, a PLD method, an ALD method, or the like.

Next, CMP treatment is performed to remove part of the conductive film to be the conductor 246, so that the insulator 284 is exposed. As a result, the conductive film remains only in the above openings, so that the conductor 246 having a flat top surface can be formed (see FIG. 8).

The conductor 246 may be formed after an insulator having a barrier property is formed on side wall portions of the openings. By forming aluminum oxide on the side wall portions of the openings, the passage of oxygen from the outside can be inhibited and oxidation of the conductor 246 can be prevented. Furthermore, impurities such as water and hydrogen can be prevented from diffusing from the conductor 246 to the outside. The aluminum oxide can be formed by depositing aluminum oxide in the openings by an ALD method or the like and then performing anisotropic etching.

Through the above process, the semiconductor device including the transistor 200 illustrated in FIG. 8 can be fabricated. As illustrated in FIG. 8 to FIG. 16, with the use of the method of manufacturing the semiconductor device described in this embodiment, the transistor 200 can be fabricated.

Modification Example 2 of Structure of Semiconductor Device

Figure 17A:
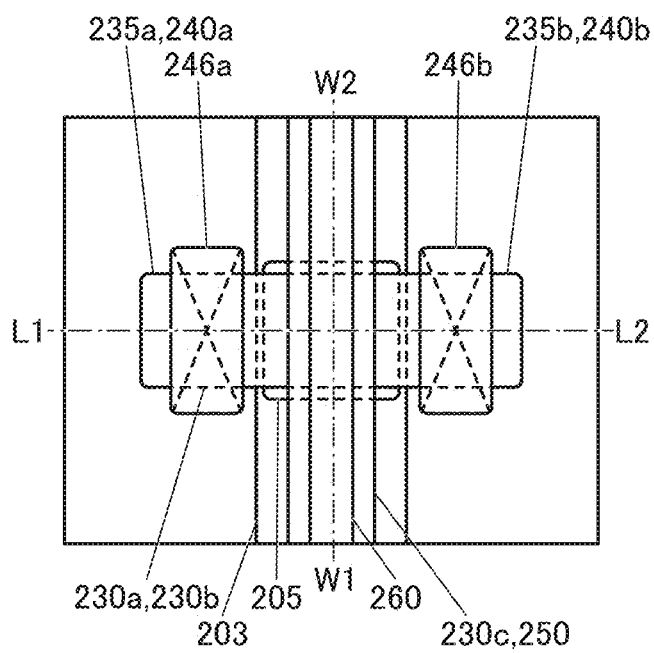
FIGS. 17A-17C A top view and cross-sectional views of a semiconductor device of one embodiment of the present invention.
Figure 17C:
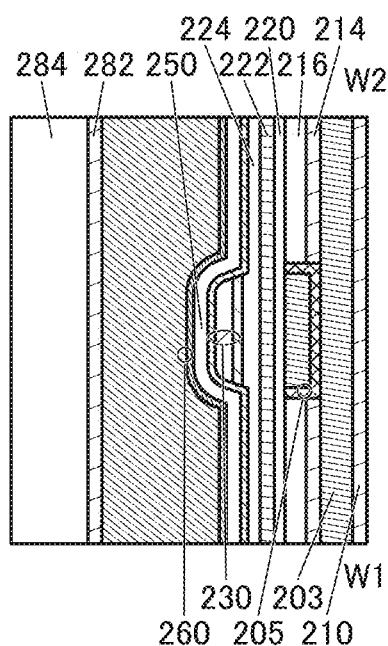
Figure 17B:
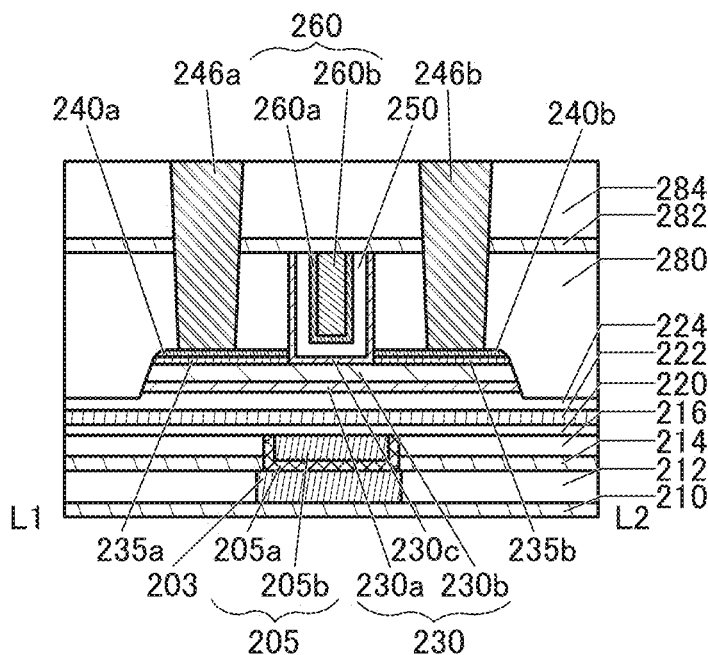

An example of a semiconductor device including the transistor 200 according to one embodiment of the present invention is described below. FIG. 17(A), FIG. 17(B), and FIG. 17(C) are a top view and cross-sectional views of the transistor 200 according to one embodiment of the present invention and a periphery of the transistor 200. FIG. 17(A) is the top view, FIG. 17(B) is the cross-sectional view taken along the dashed-dotted line L1-L2 in FIG. 17(A), and FIG. 17(C) is the cross-sectional view taken along the dashed-dotted line W1-W2 in FIG. 17(A). Note that for simplification of the drawing, some components are not illustrated in the top view of FIG. 17(A).

The transistor 200 illustrated in FIG. 17 includes the oxide 235 (the oxide 235a and the oxide 235b) provided between the oxide 230b and the conductor 240 (the conductor 240a and the conductor 240b).

Here, the oxide semiconductor described above in Embodiment 1 may be used for the oxide 235. In that case, an atom that can have a valence of +4 is preferably added to an oxide semiconductor containing nitrogen. An atom that can have a valence of +4 enables adjustment of the carrier concentration of the oxide semiconductor. As atoms that can have a valence of +4, cerium (Ce), praseodymium (Pr), neodymium (Nd), terbium (Tb), dysprosium (Dy), and the like are given. Since cerium particularly has substantially the same ion radius as indium (In), cerium is estimated to be likely to replace indium in an oxide semiconductor. Replacement of indium having a valence of +3 by cerium having a valence of +4 generates one extra electron, that is, a carrier. Hence, by adjustment of the amount of added atoms that can have a valence of +4, a semiconductor device having electrical characteristics that meet the demand for the circuit design can be provided easily.

In the case where an oxide semiconductor containing an atom that can have a valence of +4 is used for the oxide 235, the oxide 235 preferably has a higher content of an atom that can have a valence of +4 than the oxide 230. If the content of an atom that can have a valence of +4 is high, the atom that can have a valence of +4 functions as an electron donor (donor). In addition, providing the oxide 235 can reduce the contact resistance between the conductor 240 and the oxide 230. Note that in this structure, when the atom which is included in the oxide 235 and can have a valence of +4 functions as an electron donor, the oxide 235 is treated as a conductive oxide in some cases.

Note that the oxide 235 can be deposited by a sputtering method, for example. In the case where an oxide film to be the oxide 235 is deposited by a sputtering method, an oxide target including an atom that can have a valence of +4 in addition to In, M, and Zn can be used.

For example, in the case where the oxide film to be the oxide 235 is deposited by a sputtering method, a single gas of oxygen, a rare gas, or nitrogen or a mixed gas of any two or more kinds of these gases is preferably used as a sputtering gas. By increasing the proportion of oxygen contained in the sputtering gas, oxygen vacancies in the oxide films to be deposited can be reduced.

Note that the oxide film to be the oxide 230a, the oxide film to be the oxide 230b, and the oxide film to be the oxide 235 are preferably deposited successively without being exposed to the atmospheric environment. By the deposition without exposure to the air, impurities or moisture from the atmospheric environment can be prevented from being attached onto the oxide film to be the oxide 230b and the oxide film to be the oxide 235. Accordingly, defects can be kept from being generated in the vicinity of an interface between the oxide film to be the oxide 235 and the oxide film to be the oxide 230b, and the vicinity of the interface can be kept clean.

A metal oxide containing an atom that can have a valence of +4 may be formed by deposition of an oxide film and then introduction of an atom that can have a valence of +4 through addition treatment. The oxide film to be the oxide 235 is deposited by a method similar to that for the oxide film to be the oxide 230a or the oxide 230b in accordance with characteristics required for the oxide film to be the oxide 235. After that, an atom that can have a valence of +4 is preferably added to the oxide film to be the oxide 235.

Note that as a method for adding an atom that can have a valence of +4, an ion implantation method by which an ionized source gas is subjected to mass separation and then added, an ion doping method by which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that the atom that can have a valence of +4 to be added may be referred to as an element, a dopant, an ion, a donor, an acceptor, or the like.

An atom that can have a valence of +4 may be added by plasma treatment. In that case, the plasma treatment is performed with a plasma CVD apparatus, a dry etching apparatus, or an ashing apparatus, so that the impurity and the metal element can be added. Note that a plurality of the above-described treatments may be combined.

The structures, methods, and the like described above in this embodiment can be used in combination as appropriate with the structures, methods, and the like described in the other embodiments and other examples.

Embodiment 4

In this embodiment, one embodiment of a semiconductor device is described using FIG. 18 to FIG. 26. Note that in the semiconductor device described in this embodiment, components having the same functions as the components in the semiconductor device described in the above embodiment are denoted by the same reference numerals. In addition, description in the above embodiment can be referred to for details of the components of the semiconductor device in this embodiment which are common to the components of the semiconductor device in the above embodiment and for details of the components denoted by the same reference numerals.

Modification Example 3 of Structure of Semiconductor Device

Figure 18A:
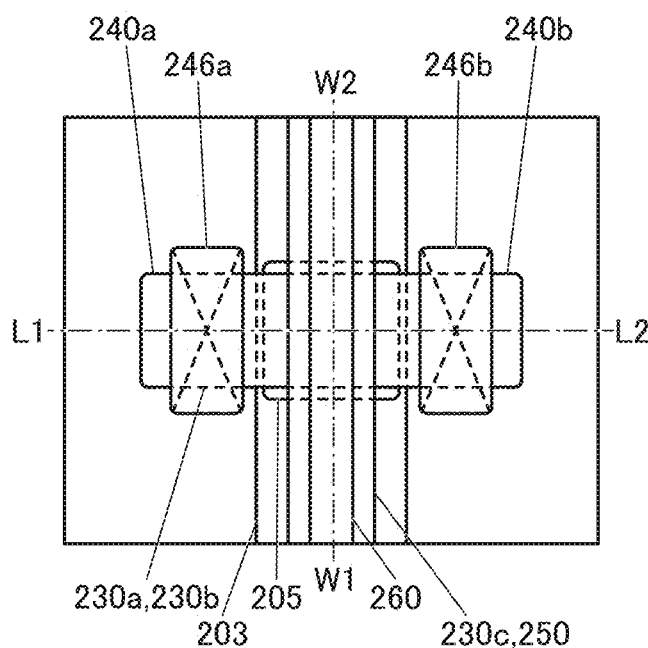
FIGS. 18A-18C A top view and cross-sectional views of a semiconductor device of one embodiment of the present invention.
Figure 18C:
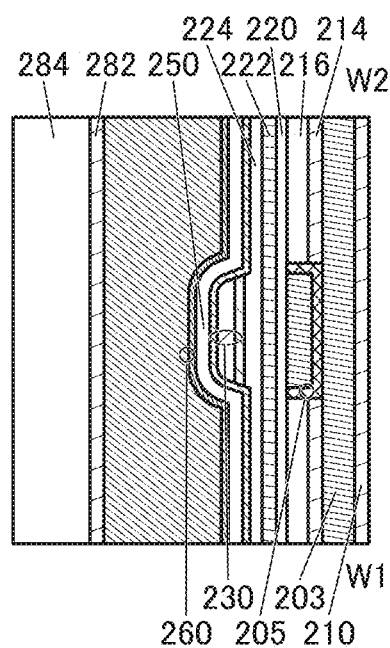
Figure 18B:
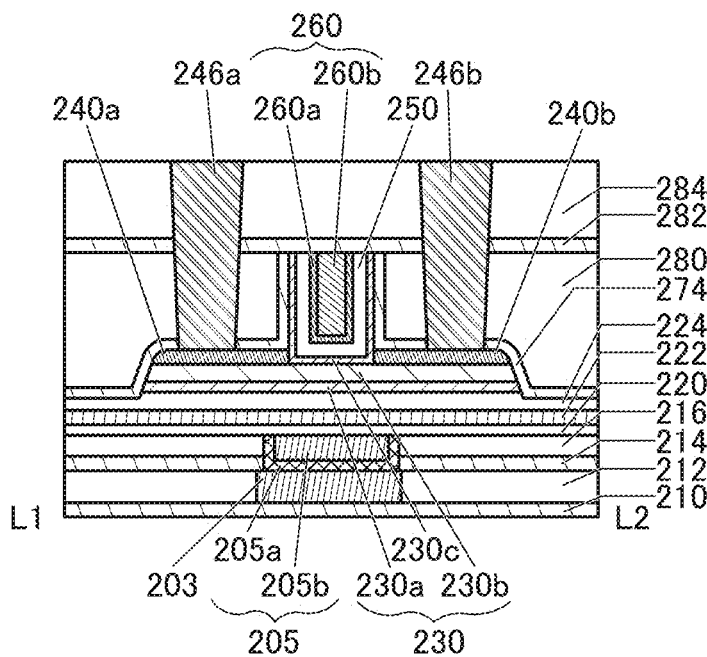

An example of a semiconductor device including the transistor 200 according to one embodiment of the present invention is described below. FIG. 18(A), FIG. 18(B), and FIG. 18(C) are a top view and cross-sectional views of the transistor 200 according to one embodiment of the present invention and a periphery of the transistor 200. FIG. 18(A) is the top view, FIG. 18(B) is the cross-sectional view taken along the dashed-dotted line L1-L2 in FIG. 18(A), and FIG. 18(C) is the cross-sectional view taken along the dashed-dotted line W1-W2 in FIG. 18(A). Note that for simplification of the drawing, some components are not illustrated in the top view of FIG. 18(A).

The transistor 200 includes the conductor 260 (the conductor 260a and the conductor 260b) functioning as the first gate electrode, the conductor 205 (the conductor 205a and the conductor 205b) functioning as the second gate electrode, an insulator 250 functioning as the first gate insulator, the insulator 220, the insulator 222, and the insulator 224 functioning as the second gate insulator, the oxide 230 (the oxide 230a, the oxide 230b, and the oxide 230c) including a region where a channel is formed, the conductor 240a functioning as one of a source and a drain, the conductor 240b functioning as the other of the source and the drain, and the insulator 274.

In the transistor 200 illustrated in FIG. 18, the oxide 230c, the insulator 250, and the conductor 260 are placed in an opening portion provided in the insulator 280 with the insulator 274 positioned therebetween. The oxide 230c, the insulator 250, and the conductor 260 are placed between the conductor 240a and the conductor 240b.

In other words, the oxide 230c is preferably provided in the opening portion provided in the insulator 280 with the insulator 274 positioned therebetween. When the insulator 274 has a barrier property, diffusion of impurities included in the insulator 280 into the oxide 230 can be inhibited.

The insulator 274 is preferably formed using an insulating material having a function of inhibiting diffusion of impurities such as water and hydrogen and oxygen. For example, aluminum oxide, hafnium oxide, or the like is preferably used. Alternatively, for example, a metal oxide such as magnesium oxide, gallium oxide, germanium oxide, yttrium oxide, zirconium oxide, lanthanum oxide, neodymium oxide, or tantalum oxide, silicon nitride oxide, silicon nitride, or the like can be used.

When the insulator 274 is included, impurities such as water and hydrogen included in the insulator 280 can be inhibited from diffusing into the oxide 230b through the oxide 230c and the insulator 250. In addition, oxidation of the conductor 260 by excess oxygen included in the insulator 280 can be inhibited.

The structure and manufacturing method of the transistor 200 illustrated in FIG. 18 are suitable for miniaturization because the transistor 200 is fabricated using a dummy gate. Accordingly, the transistor 200 can be highly integrated easily.

<Method of Fabricating Semiconductor Device>

A method for fabricating a semiconductor device including the transistor 200 according to the present invention, which is illustrated in FIG. 18, will be described below with reference to FIG. 19 to FIG. 26. In FIG. 19 to FIG. 26, (A) of each drawing is a top view. Moreover, (B) of each drawing is a cross-sectional view corresponding to a portion indicated by the dashed-dotted line L1-L2 in (A) of the drawing, and is also a cross-sectional view of the transistor 200 in the channel length direction. Furthermore, (C) of each drawing is a cross-sectional view corresponding to a portion indicated by the dashed-dotted line W1-W2 in (A) of the drawing, and is also a cross-sectional view of the transistor 200 in the channel width direction. Note that for simplification of the drawings, some components are not illustrated in the top view of (A) of each drawing.

The method of fabricating the semiconductor device in the above embodiment can be referred to for the structure bodies denoted by the same reference numerals in the semiconductor device described in this embodiment.

The insulator 210, the insulator 212, the conductor 203, the insulator 214, the insulator 216, the conductor 205, the insulator 220, the insulator 222, the insulator 224, the oxide 230a, the oxide 230b, and the conductor 240A are formed over a substrate. After that, a dummy gate film to be a dummy gate 290 is formed over the insulator 224, the oxide 230a, the oxide 230b, and the conductor 240A.

The dummy gate film to be the dummy gate 290 is processed to be used as the dummy gate 290. The dummy gate is an interim gate electrode. That is, the dummy gate film is processed to form a dummy gate, the dummy gate is removed in a later step, and a gate electrode is formed using a conductive film or the like instead. Thus, a film that is easily processed minutely and easily removed is preferably used as the dummy gate film to be the dummy gate 290.

The dummy gate film to be the dummy gate 290 can be deposited by a sputtering method, a CVD method, an MBE method, a PLD method, an ALD method, or the like. An insulator, a semiconductor, or a conductor can be used, for example. Specifically, silicon such as polysilicon, microcrystalline silicon, or amorphous silicon, or a metal film of aluminum, titanium, tungsten, or the like is used, for example. Alternatively, a resin film may be formed by a coating method. Examples include a photoresist, polyester, polyolefin, polyamide (nylon, aramid, or the like), polyimide, polycarbonate, and acrylic. When the resin film is formed by a coating method, a surface of the dummy gate film can be flat. In this manner, when having a flat surface, the dummy gate film can be easily processed minutely and easily removed.

The dummy gate film to be the dummy gate 290 can be a multilayer film using different kinds of films. For example, the dummy gate film to be the dummy gate 290 can be a film having a two-layer structure in which a conductive film and a resin film over the conductive film are formed. When the dummy gate film has such a structure, the conductive film functions as a stopper film for CMP treatment in a later CMP process in some cases, for example. Alternatively, the end of the CMP treatment can be detected in some cases, so that processing variation can be reduced in some cases.

Figure 19A:
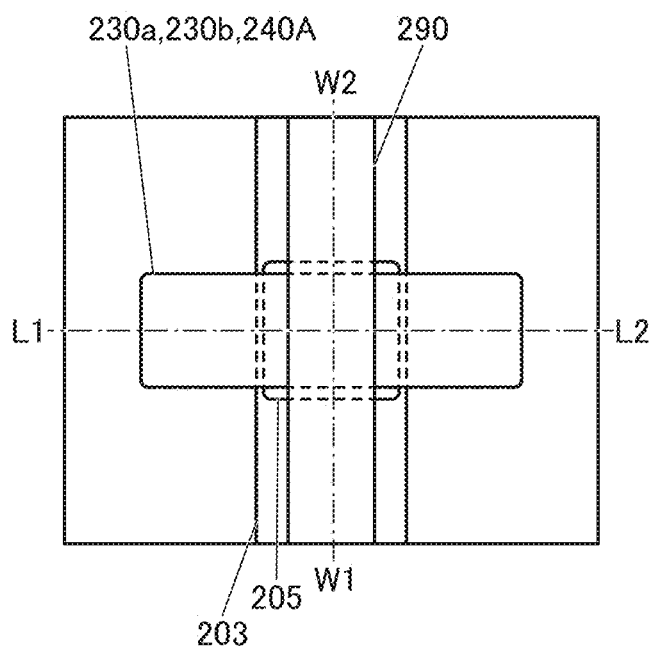
FIGS. 19A-19C Cross-sectional views illustrating a method of fabricating a semiconductor device of one embodiment of the present invention.
Figure 19C:
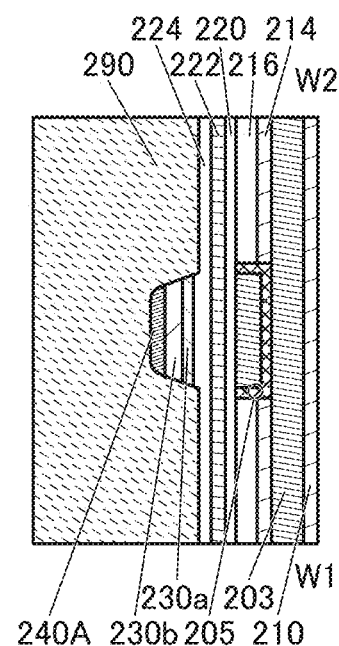
Figure 19B:
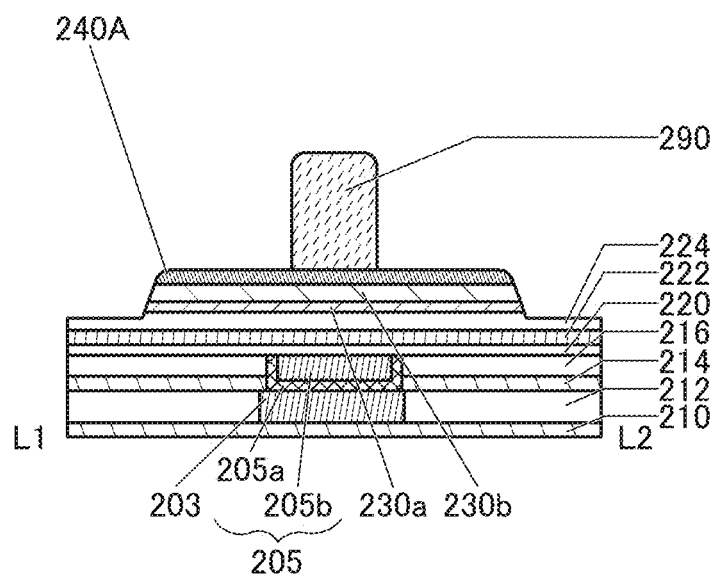

Next, the dummy gate film to be the dummy gate 290 is etched by a lithography method to form the dummy gate 290 (see FIG. 19). The dummy gate 290 is formed to at least partly overlap with the conductor 205, the oxide 230a, and the oxide 230b.

Figure 20A:
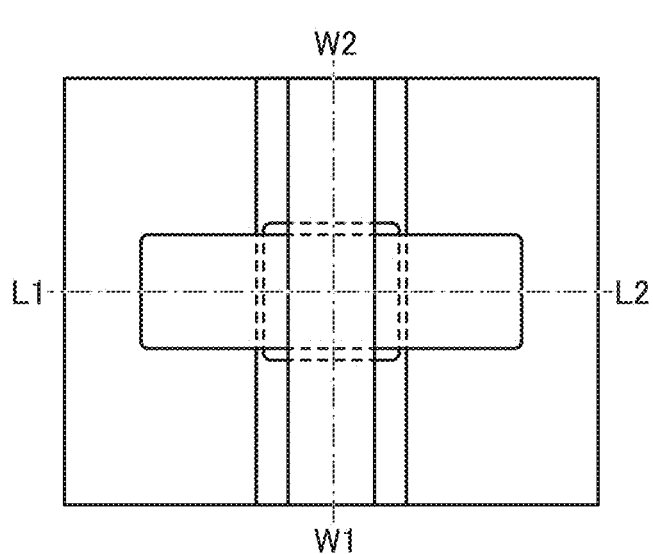
FIGS. 20A-20C Cross-sectional views illustrating a method of fabricating a semiconductor device of one embodiment of the present invention.
Figure 20C:
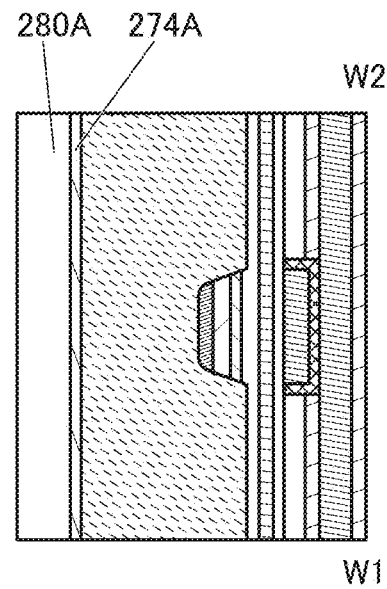
Figure 20B:
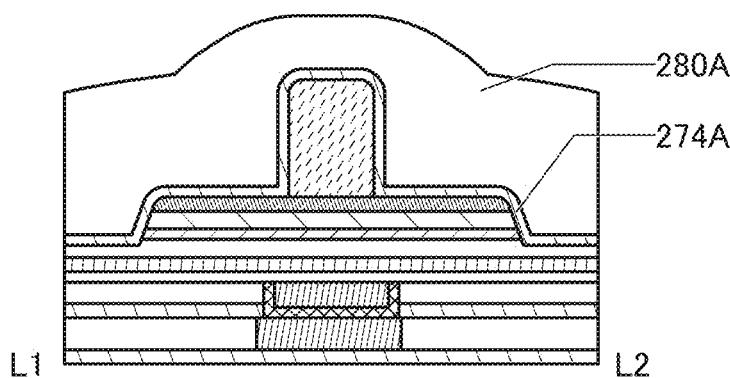

Next, an insulating film 274A is deposited so as to cover the oxide 230a, the oxide 230b, the conductor 240A, and the dummy gate 290 (see FIG. 20). The insulating film 274A can be deposited by a sputtering method, a CVD method, an MBE method, a PLD method, an ALD method, or the like.

As the insulating film 274A, an insulating film having a function of inhibiting the passage of oxygen is preferably used. An aluminum oxide film is preferably deposited by a sputtering method, for example. Alternatively, the insulating film 274A may have a stacked-layer structure. Preferably, an aluminum oxide film is deposited by a sputtering method and then an aluminum oxide film is deposited by an ALD method, for example. With the use of an ALD method which enables good coverage, the insulating film 274A having a uniform thickness can be formed even at a step portion formed by the dummy gate 290 or the like. In addition, with the use of an ALD method, a dense thin film can be deposited. As described above, a dense thin film with good coverage can be deposited; thus, for example, even when a defect such as a void or a pinhole is generated in the aluminum oxide film deposited by a sputtering method, coverage with the aluminum oxide film deposited by an ALD method is possible.

As described above, entry of impurities such as water and hydrogen to the oxide 230a, the oxide 230b, and the insulator 224 from the outside can be prevented. Note that deposition of the insulating film 274A can be omitted.

Next, an insulating film 280A is deposited over the insulating film 274A (see FIG. 20). The insulating film 280A can be deposited by a sputtering method, a CVD method, an MBE method, a PLD method, an ALD method, or the like.

Figure 21A:
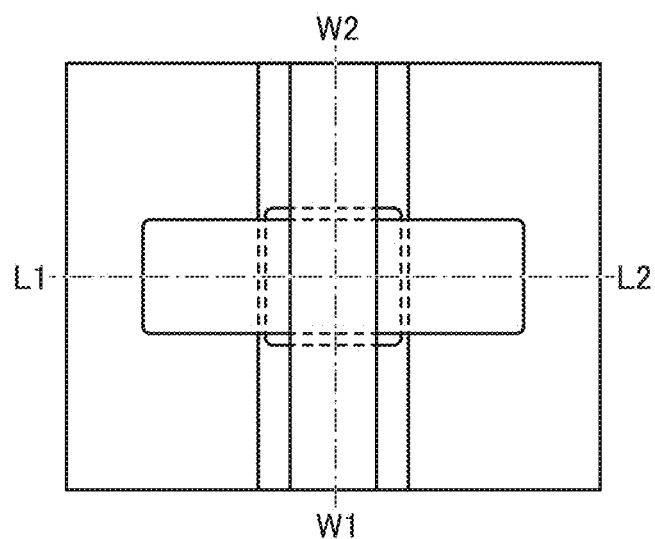
FIGS. 21A-21C Cross-sectional views illustrating a method of fabricating a semiconductor device of one embodiment of the present invention.
Figure 21C:
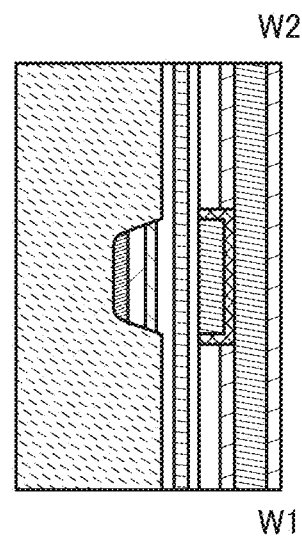
Figure 21B:
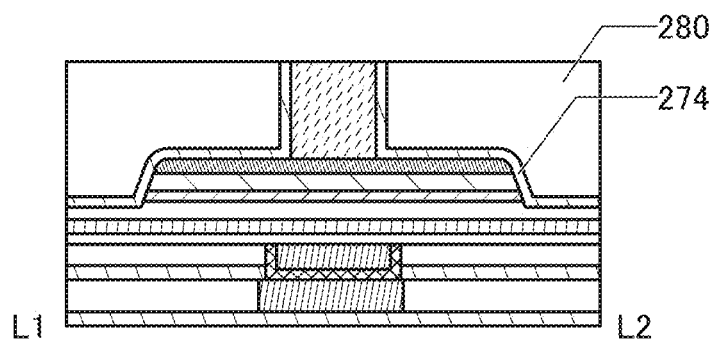

Next, the insulating film 280A, the dummy gate 290, and the insulating film 274A are partly removed until part of the dummy gate 290 is exposed, whereby the insulator 280 and the insulator 274 are formed (see FIG. 21). CMP treatment is preferably employed for forming the insulator 280 and the insulator 274.

As mentioned above, when the dummy gate 290 has a two-layer structure in which a conductive film and a resin film over the conductive film are formed, for example, in CMP treatment, the conductive film functions as a stopper film for the CMP treatment in some cases. Alternatively, the end of the CMP treatment can be detected with the conductive film in some cases, so that variation in the height of the dummy gate 290 can be reduced in some cases. As illustrated FIG. 21, a top surface of the dummy gate 290 is substantially aligned with top surfaces of the insulator 274 and the insulator 280.

Figure 22A:
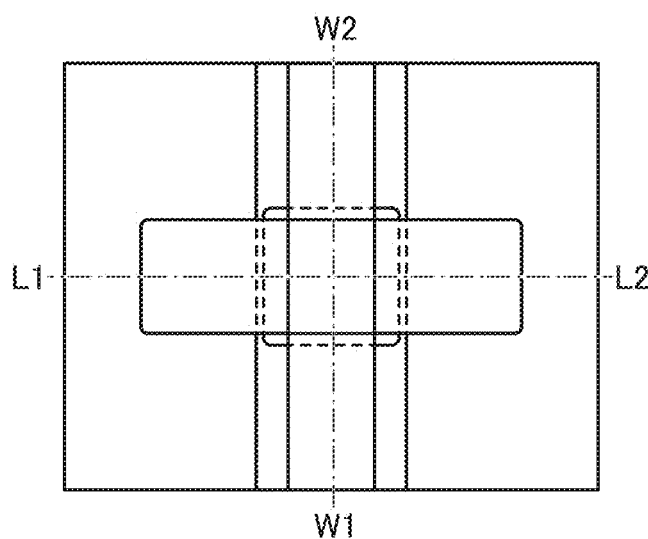
FIGS. 22A-22C Cross-sectional views illustrating a method of fabricating a semiconductor device of one embodiment of the present invention.
Figure 22C:
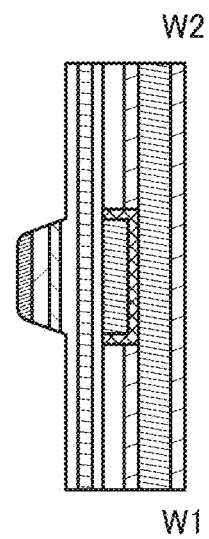
Figure 22B:
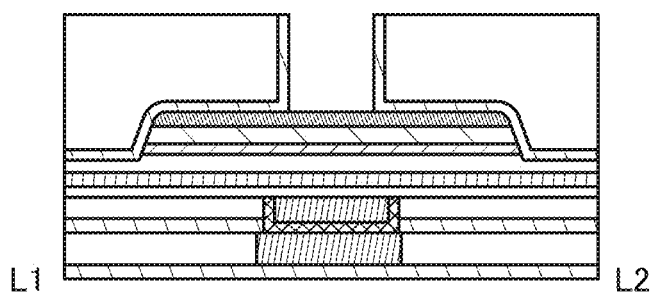
Figure 23A:
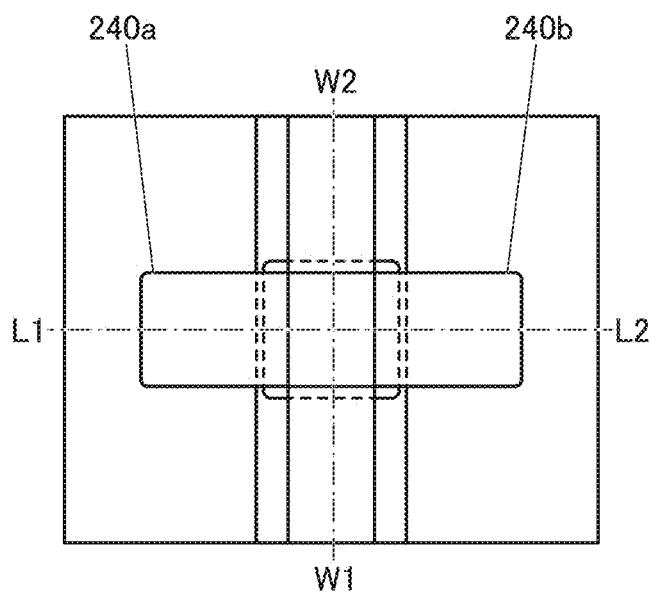
FIGS. 23A-23C Cross-sectional views illustrating a method of fabricating a semiconductor device of one embodiment of the present invention.
Figure 23C:
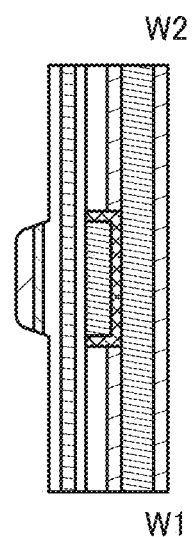
Figure 23B:
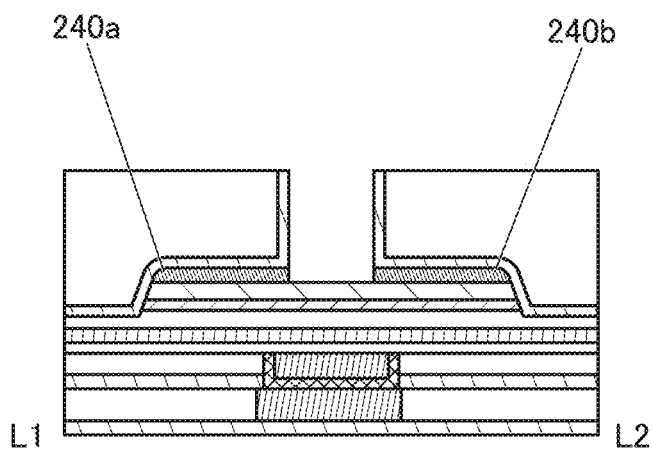

Next, the dummy gate 290 is removed (see FIG. 22). The dummy gate 290 can be removed by wet etching, dry etching, ashing, or the like. Alternatively, a plurality of the above treatments may be performed in combination as appropriate. For example, wet etching treatment is performed after ashing treatment. By the removal of the dummy gate 290, the surfaces of the insulator 224, the oxide 230a, the oxide 230b, and the conductor 240A are partly exposed.

Next, part of the conductor 240A is removed, and the conductor 240 (the conductor 240a and the conductor 240b) is formed. The conductor 240A can be removed by wet etching, dry etching, ashing, or the like. Alternatively, a plurality of the above treatments may be performed in combination as appropriate. By the removal of part of the conductor 240A, part of the surface of the oxide 230b is exposed (see FIG. 23).

Next, the oxide film 230C is deposited (see FIG. 24). The oxide film 230C can be deposited by a sputtering method, a CVD method, an MBE method, a PLD method, an ALD method, or the like. The oxide film 230C is deposited by a method similar to that for the oxide film to be the oxide 230a or the oxide 230b in accordance with characteristics required for the oxide film 230C.

Next, the insulating film 250A is deposited (see FIG. 24). The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulator having few impurities can be deposited.

Here, heat treatment or plasma treatment may be performed. For the heat treatment or plasma treatment, the conditions for the above-described heat treatment can be used. The treatment can reduce the moisture concentration and the hydrogen concentration of the insulating film 250A.

Next, the conductive film 260A and the conductive film 260B are deposited (see FIG. 24). The conductive film 260A and the conductive film 260B can be deposited by a sputtering method, a CVD method, an MBE method, a PLD method, an ALD method, or the like. For example, the conductive film 260A is deposited by an ALD method, and the conductive film 260B is deposited by a CVD method.

Figure 25A:
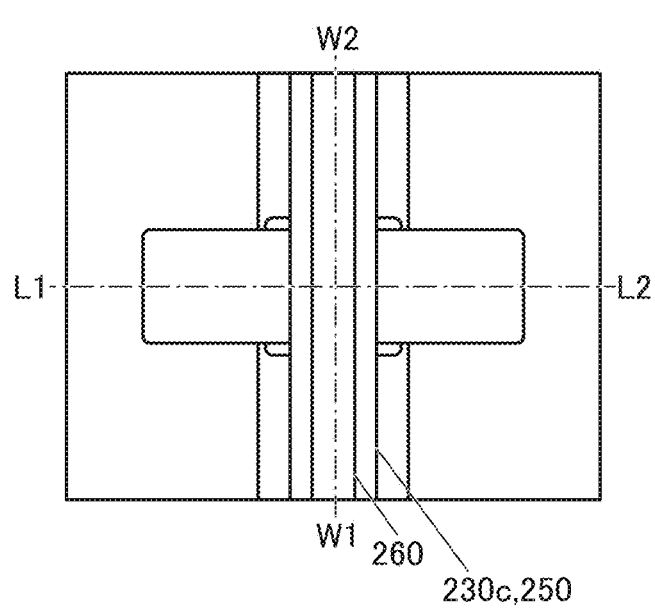
FIGS. 25A-25C Cross-sectional views illustrating a method of fabricating a semiconductor device of one embodiment of the present invention.
Figure 25C:
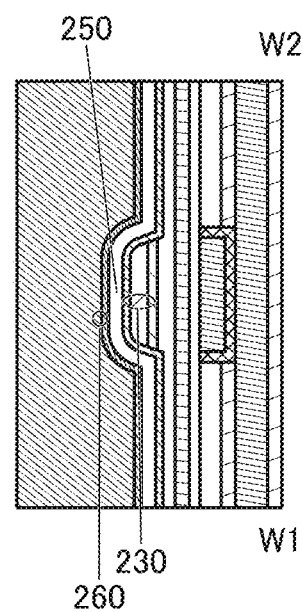
Figure 25B:
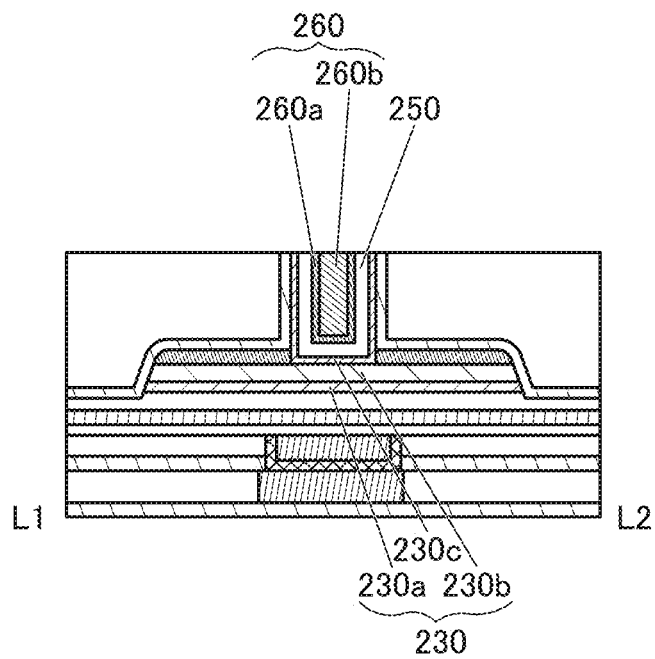

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 25).

Figure 26A:
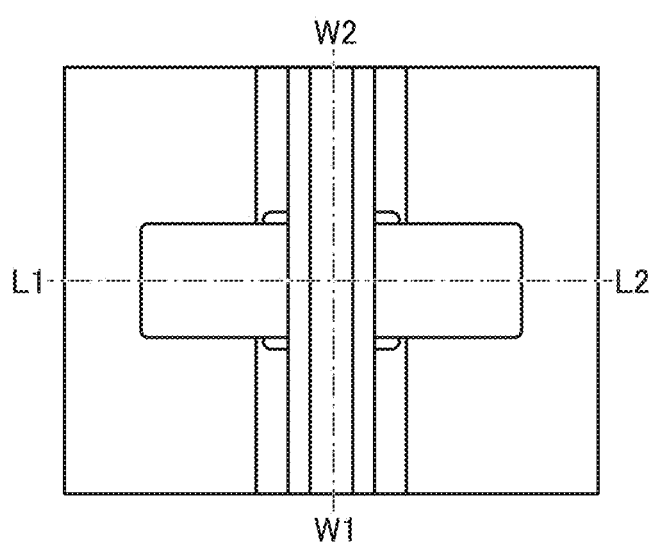
FIGS. 26A-26C Cross-sectional views illustrating a method of fabricating a semiconductor device of one embodiment of the present invention.
Figure 26C:
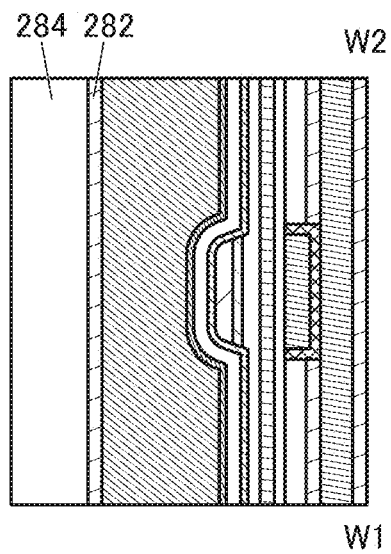
Figure 26B:
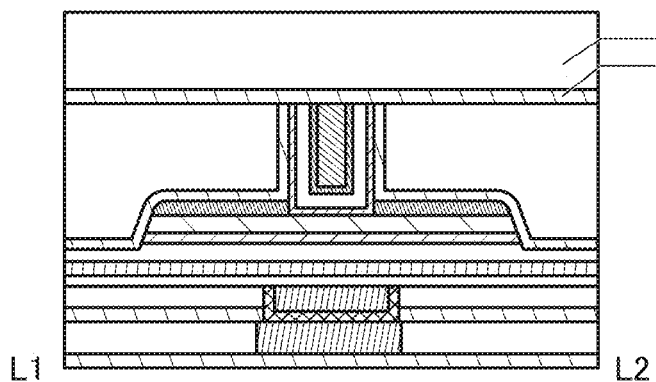

Next, the insulator 282 and the insulator 284 are deposited over the insulator 280 (see FIG. 26). The above embodiment can be referred to for the insulator 282 and the insulator 284. The above embodiment can also be referred to for the conductor 246.

Through the above process, the semiconductor device including the transistor 200 illustrated in FIG. 18 can be fabricated. As illustrated in FIG. 18 to FIG. 26, with the use of the method of manufacturing the semiconductor device described in this embodiment, the transistor 200 can be fabricated.

Modification Example 4 of Structure of Semiconductor Device

Figure 27A:
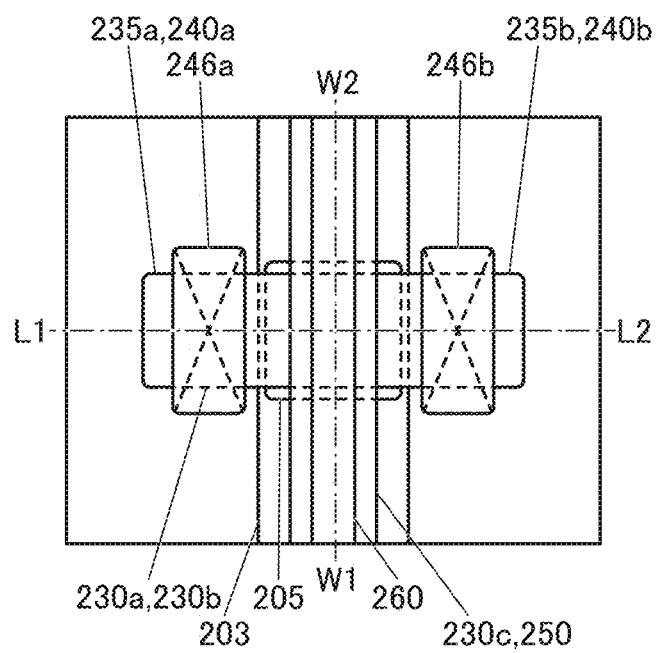
FIGS. 27A-27C A top view and cross-sectional views of a semiconductor device of one embodiment of the present invention.
Figure 27C:
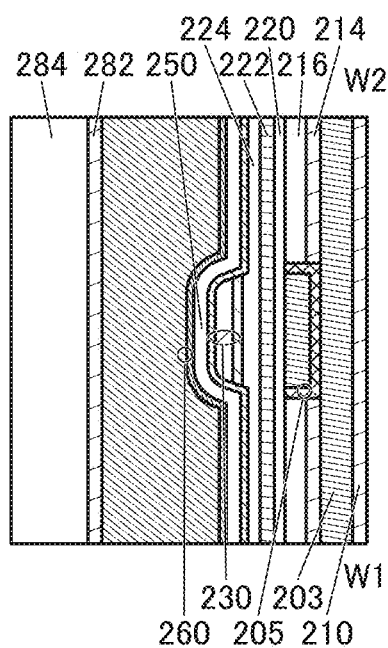
Figure 27B:
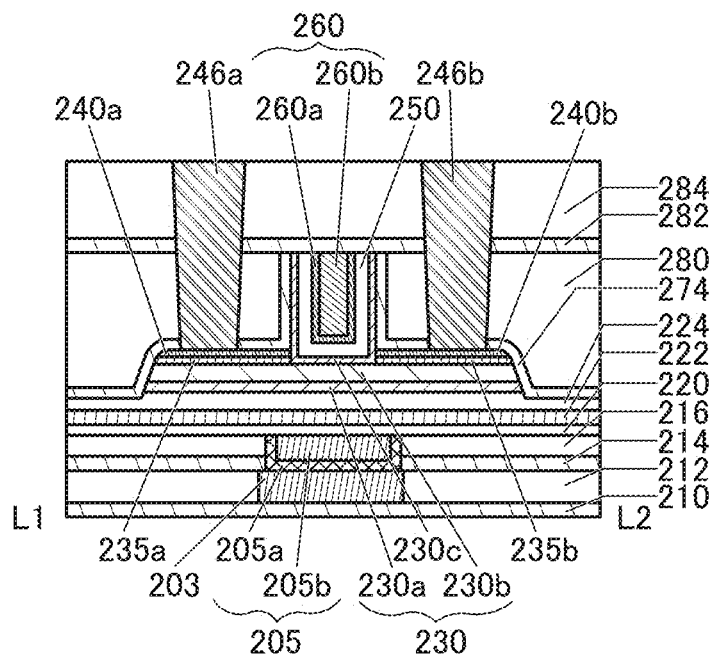

An example of a semiconductor device including the transistor 200 according to one embodiment of the present invention is described below. FIG. 27(A), FIG. 27(B), and FIG. 27(C) are a top view and cross-sectional views of the transistor 200 according to one embodiment of the present invention and a periphery of the transistor 200. FIG. 27(A) is the top view, FIG. 27(B) is the cross-sectional view taken along the dashed-dotted line L1-L2 in FIG. 27(A), and FIG. 27(C) is the cross-sectional view taken along the dashed-dotted line W1-W2 in FIG. 27(A). Note that for simplification of the drawing, some components are not illustrated in the top view of FIG. 27(A).

The transistor illustrated in FIG. 27 includes the oxide 235 (the oxide 235a and the oxide 235b) provided between the oxide 230b and the conductor 240. The oxide semiconductor described above in Embodiment 1 may be used for the oxide 235.

In that case, an atom that can have a valence of +4 is preferably added to an oxide semiconductor containing nitrogen. An atom that can have a valence of +4 enables adjustment of the carrier concentration of the oxide semiconductor. As atoms that can have a valence of +4, cerium (Ce), praseodymium (Pr), neodymium (Nd), terbium (Tb), dysprosium (Dy), and the like are given. Since cerium particularly has substantially the same ion radius as indium (In), cerium is estimated to be likely to replace indium in an oxide semiconductor. Replacement of indium having a valence of +3 by cerium having a valence of +4 generates one extra electron, that is, a carrier. Hence, by adjustment of the amount of added atoms that can have a valence of +4, a semiconductor device having electrical characteristics that meet the demand for the circuit design can be provided easily.

In the case where an oxide semiconductor containing an atom that can have a valence of +4 is used for the oxide 235, the oxide 235 preferably has a higher content of an atom that can have a valence of +4 in the oxide 235 than the oxide 230. If the content of an atom that can have a valence of +4 is high, the atom that can have a valence of +4 functions as an electron donor (donor). In addition, providing the oxide 235 can reduce the contact resistance between the conductor 240 and the oxide 230. Note that in this structure, when the atom which is included in the oxide 235 and can have a valence of +4 functions as an electron donor, the oxide 235 is treated as a conductive oxide in some cases.

The structures, methods, and the like described above in this embodiment can be used in combination as appropriate with the structures, methods, and the like described in the other embodiments and other examples.

Embodiment 5

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), will be described with reference to FIG. 28 and FIG. 29. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 28A:
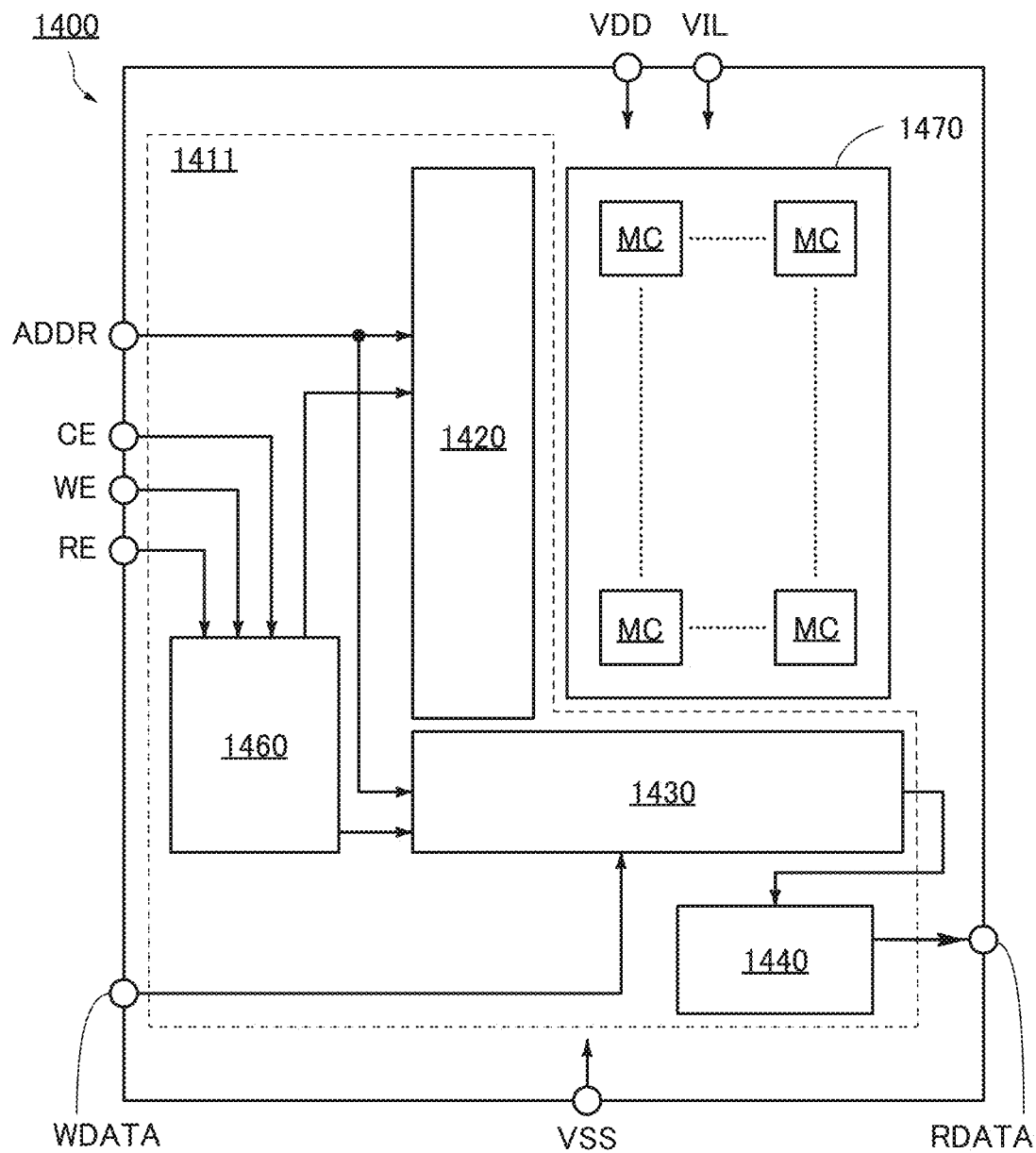
FIGS. 28A-28B A block diagram illustrating a configuration example of a memory device of one embodiment of the present invention.

FIG. 28(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 28B:
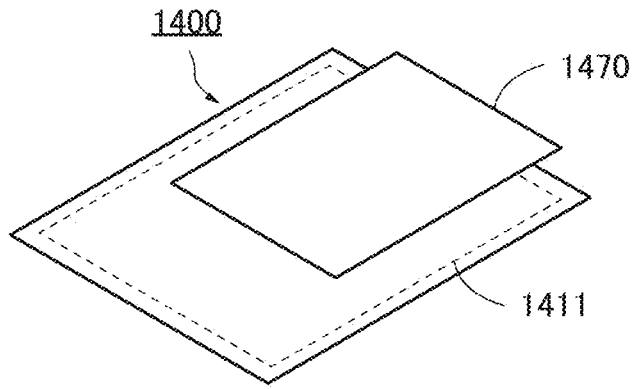

Note that FIG. 28(A) illustrates an example in which the peripheral circuit 1411 and the memory cell array 1470 are formed on the same plane; however, this embodiment is not limited thereto. For example, as illustrated in FIG. 28(B), the memory cell array 1470 may be provided over the peripheral circuit 1411 to partly overlap with the peripheral circuit 1411. For example, the sense amplifier may be provided below the memory cell array 1470 so that they overlap with each other.

FIG. 29 illustrates structure examples of a memory cell applicable to the memory cell MC.

[DOSRAM]

Figure 29A:
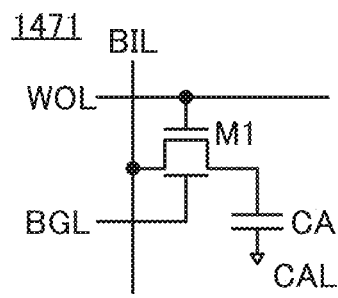
FIGS. 29A-29H Circuit diagrams illustrating configuration examples of a memory device of one embodiment of the present invention.
Figure 29B:
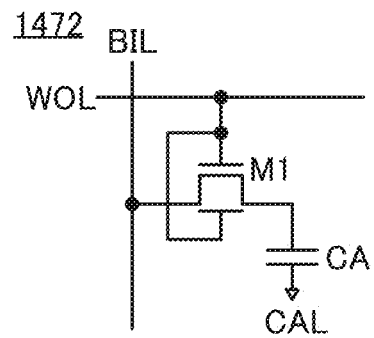
Figure 29C:
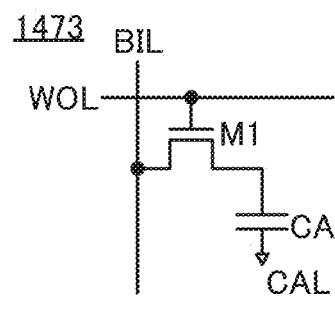
Figure 29D:
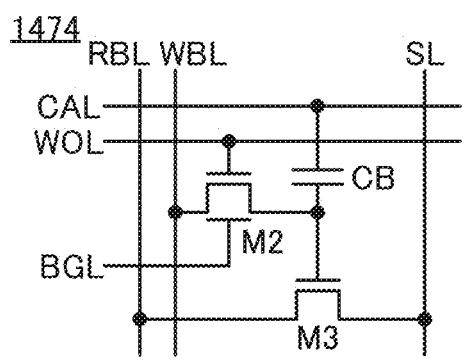
Figure 29E:
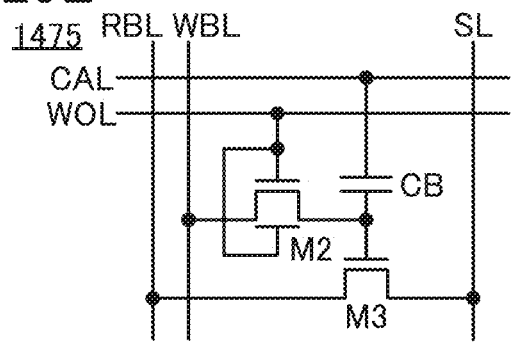
Figure 29F:
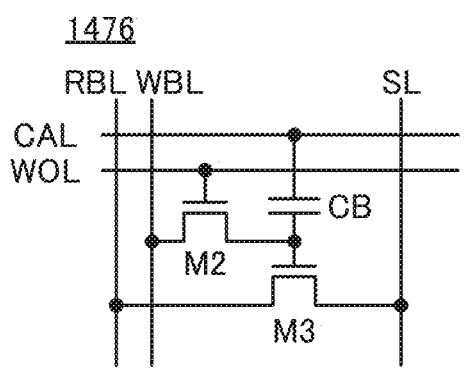
Figure 29G:
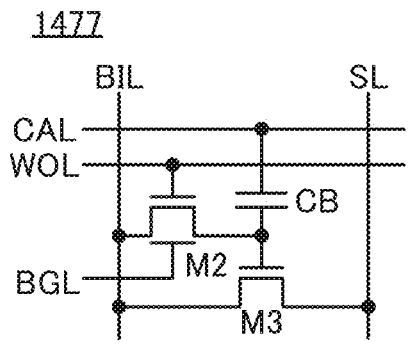

FIGS. 29(A) to 29(C) each illustrate a circuit structure example of a memory cell of a DRAM. In this specification and the like, a DRAM using a memory cell including one OS transistor and one capacitor is referred to as DOSRAM (registered trademark) (Dynamic Oxide Semiconductor Random Access Memory) in some cases. A memory cell 1471 illustrated in FIG. 29(A) includes a transistor M1 and a capacitor CA. Note that the transistor M1 includes a gate (also referred to as a top gate in some cases) and a back gate.

One of a source and a drain of the transistor M1 is connected to a first terminal of the capacitor CA. The other of the source and the drain of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and the circuit structure can be changed. For example, as in a memory cell 1472 illustrated in FIG. 29(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 29(C).

In the case where the semiconductor device described in any of the above embodiments is used in the memory cell 1471 and the like, the transistor 200 can be used as the transistor M1. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 29(D) to 29(G) each illustrate a circuit structure example of a gain-cell memory cell including two transistors and one capacitor. A memory cell 1474 illustrated in FIG. 29(D) includes a transistor M2, a transistor M3, and a capacitor CB. Note that the transistor M2 includes a gate (referred to as a top gate in some cases) and a back gate. In this specification and the like, a memory device including a gain-cell memory cell using an OS transistor as the transistor M2 is referred to as NOSRAM (registered trademark) (Non-volatile Oxide Semiconductor RAM) in some cases.

One of a source and a drain of the transistor M2 is connected to a first terminal of the capacitor CB. The other of the source and the drain of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. One of a source and a drain of the transistor M3 is connected to a wiring RBL. The other of the source and the drain of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be amplified.

The memory cell MC is not limited to the memory cell 1474, and the circuit structure can be changed as appropriate. For example, as in a memory cell 1475 illustrated in FIG. 29(E), the back gate of the transistor M2 may be connected not to the wiring BGL but to the wiring WOL in the memory cell MC. Alternatively, for example, the memory cell MC may be a memory cell including as single-gate transistor, that is, the transistor M2 not including a back gate, as in a memory cell 1476 illustrated in FIG. 29(F). Alternatively, for example, in the memory cell MC, the wiring WBL and the wiring RBL may be combined into one wiring BIL, as in a memory cell 1477 illustrated in FIG. 29(G).

In the case where the semiconductor device described in any of the above embodiments is used in the memory cell 1474 and the like, the transistor 200 can be used as the transistor M2. When an OS transistor is used as the transistor M2, the leakage current of the transistor M2 can be extremely low. That is, with the use of the transistor M2, written data can be retained for a long time, and thus the frequency of the refresh operation for the memory cell can be decreased. In addition, refresh operation of the memory cell can be unnecessary. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistors M2 and M3, the circuit of the memory cell array 1470 can be formed using only n-channel transistors.

Figure 29H:
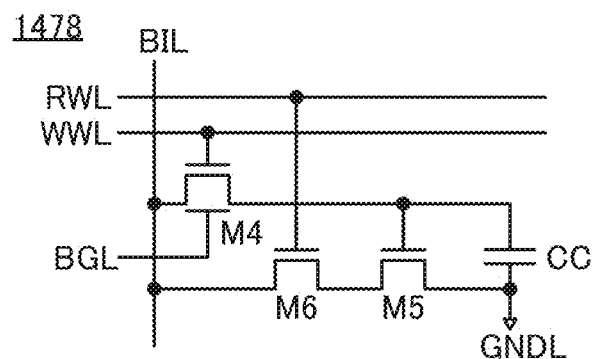

FIG. 29(H) illustrates an example of a gain-cell memory cell including three transistors and one capacitor. A memory cell 1478 illustrated in FIG. 29(H) includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 may not include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments, other examples, and the like.

Embodiment 6

In this embodiment, an example of a chip 1200 on which the semiconductor device of the present invention is mounted will be described with reference to FIG. 30. A plurality of circuits (systems) are mounted on the chip 1200. The technique for integrating a plurality of circuits (systems) on one chip as described above is referred to as system on chip (SoC) in some cases.

Figure 30A:
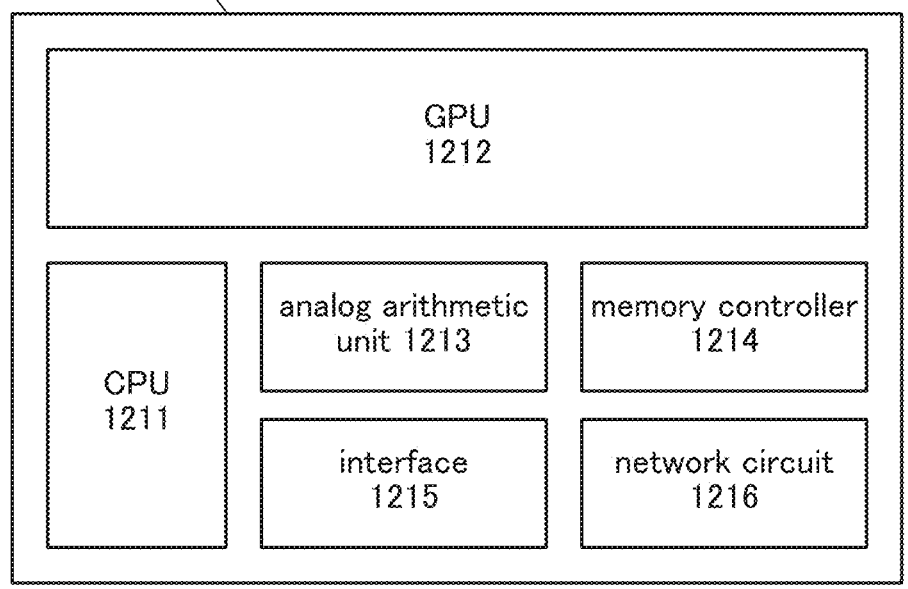
FIGS. 30A-30B Schematic diagrams of a semiconductor device of one embodiment of the present invention.

As illustrated in FIG. 30(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 30B:
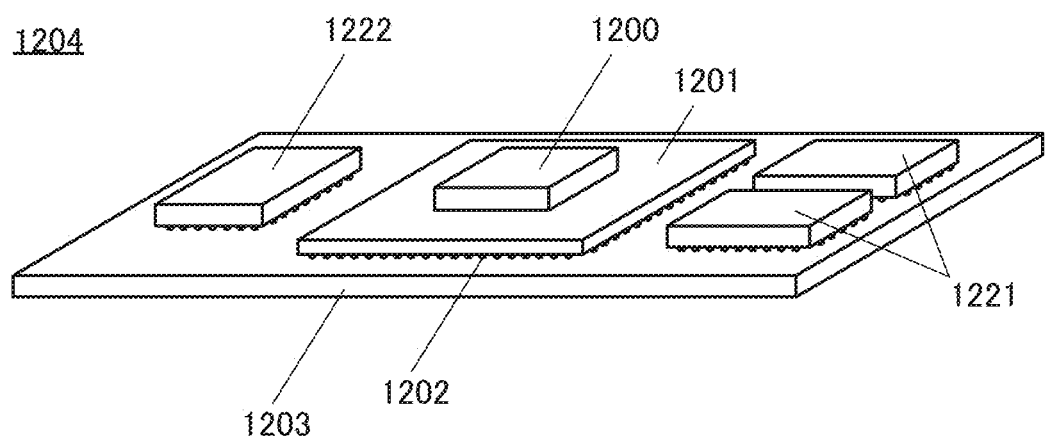

A bump (not illustrated) is provided on the chip 1200, and as illustrated in FIG. 30(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection to an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement a method such as a deep neural network (DNN), a convolutional neural network (CNN), a recurrent neural network (RNN), an autoencorder, a deep Boltzmann machine (DBM), or a deep belief network (DBN); thus, the chip 1200 can be used as an AI chip or the GPU module 1204 can be used as an AI system module.

The structure described in this embodiment can be used in an appropriate combination with the structures described in the other embodiments and other examples.

Embodiment 7

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 31 schematically illustrates some structure examples of removable memory devices. The semiconductor device described in the above embodiment is processed into a packaged memory chip and used in a variety of storage devices and removable memories, for example.

Figure 31A:
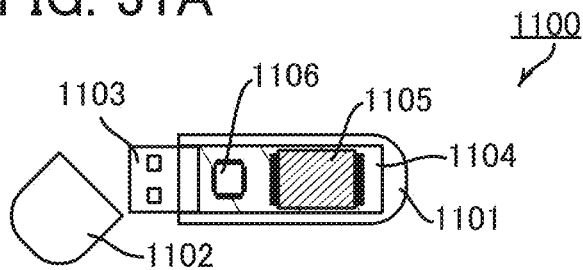
FIGS. 31A-31E Schematic diagrams of a memory device of one embodiment of the present invention.

FIG. 31(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like.

Figures 31B, 31C:
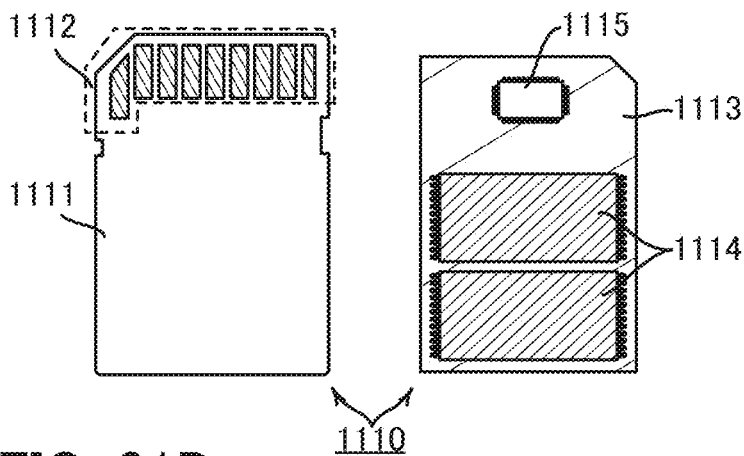

FIG. 31(B) is a schematic external view of an SD card, and FIG. 31(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figures 31D, 31E:
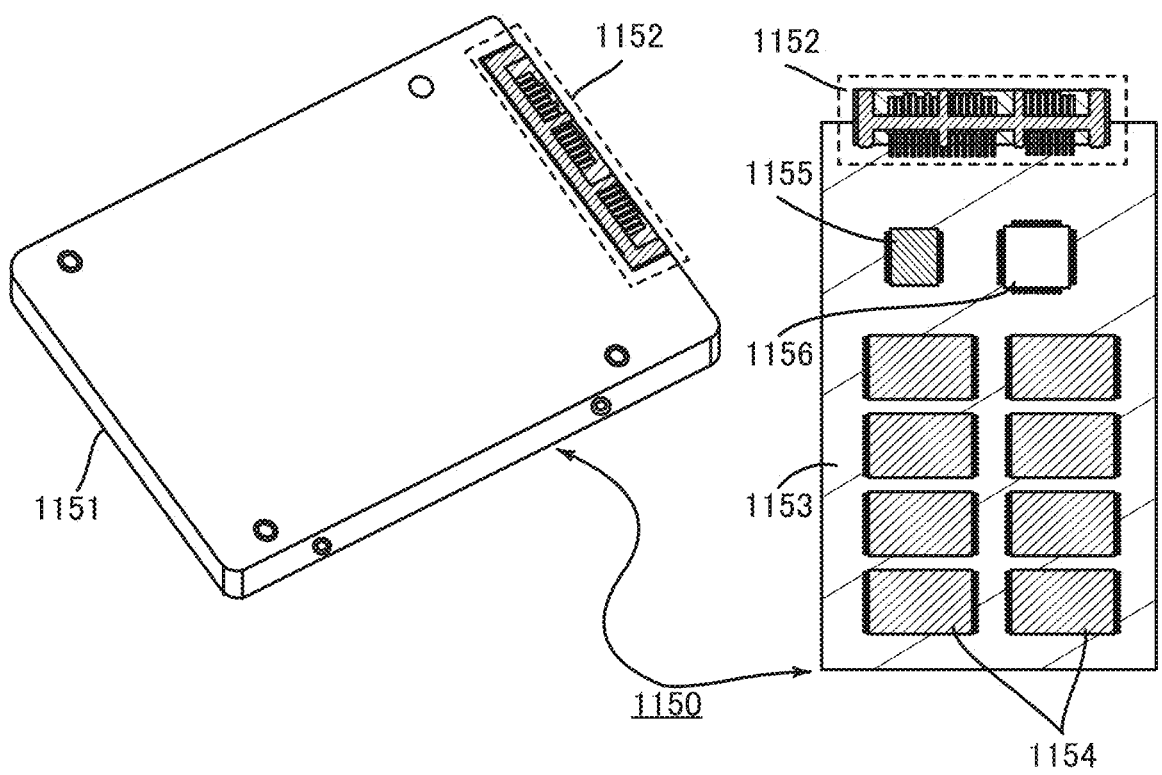

FIG. 31(D) is a schematic external view of an SSD, and FIG. 31(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments, other examples, and the like.

Embodiment 8

<Electronic Device>

A semiconductor device of one embodiment of the present invention can be used for a variety of electronic devices. FIG. 32 illustrates specific examples of the electronic devices using the semiconductor device of one embodiment of the present invention.

Figure 32A:
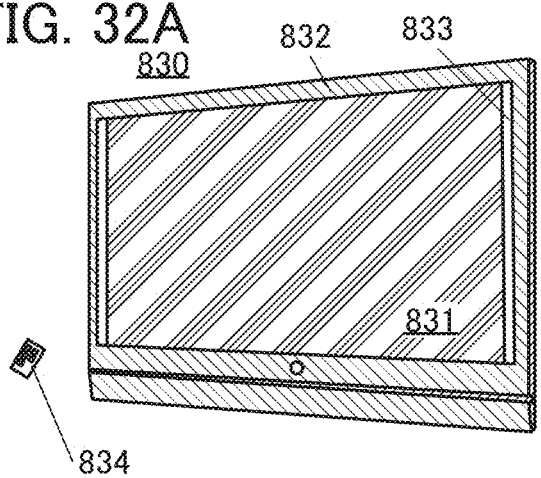

FIG. 32(A) illustrates a monitor 830. The monitor 830 includes a display portion 831, a housing 832, a speaker 833, and the like. Furthermore, an LED lamp, operation keys (including a power switch or an operation switch), a connection terminal, a variety of sensors, a microphone, and the like can be included. The monitor 830 can be controlled with a remote controller 834.

The monitor 830 can function as a television device by receiving airwaves.

Examples of the airwaves the monitor 830 can receive include ground waves and waves transmitted from a satellite. The example of the airwaves also include analog broadcasting, digital broadcasting, image-sound-only broadcasting, and sound-only broadcasting. For example, airwaves transmitted in a certain frequency band in a UHF band (higher than or equal to 300 MHz and lower than or equal to 3 GHz) or a VHF band (higher than or equal to 30 MHz and lower than or equal to 300 MHz) can be received. When a plurality of pieces of data received in a plurality of frequency bands is used, the transfer rate can be increased and more information can be obtained. Accordingly, the display portion 831 can display an image with a resolution exceeding the full high definition. An image with a resolution of, for example, 4K2K, 8K4K, 16K8K, or more can be displayed.

A structure may be employed in which an image to be displayed on the display portion 831 is generated using broadcasting data transmitted with a technology for transmitting data via a computer network such as the Internet, a LAN, or Wi-Fi (registered trademark). In this case, the monitor 830 does not need to include a tuner.

The monitor 830 can be used as a computer monitor when connected to a computer. Several people can see the monitor 830 connected to a computer at the same time; thus, the monitor 830 can be used for a conference system. The monitor 830 can also be used for a videoconference system by display of data in a computer via a network or connection of the monitor 830 itself to a network.

The monitor 830 can also be used as a digital signage.

The semiconductor device of one embodiment of the present invention can be used for, for example, a driver circuit or an image processing portion of the display portion.

When the semiconductor device of one embodiment of the present invention is used for the driver circuit or the image processing portion of the display portion, high-speed operation or signal processing can be achieved with low power consumption.

When an AI system using the semiconductor device of one embodiment of the present invention is used for the image processing portion of the monitor 830, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Figure 32B:
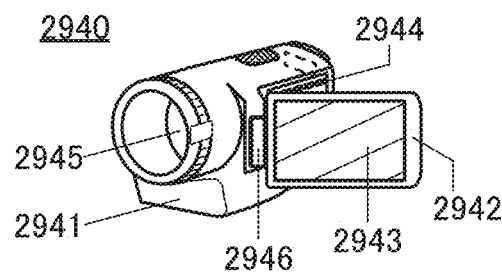

A video camera 2940 illustrated in FIG. 32(B) includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. A structure is employed in which the housing 2941 and the housing 2942 are connected to each other with the joint 2946, and the angle between the housing 2941 and the housing 2942 can be changed with the joint 2946. The orientation of an image displayed on the display portion 2943 may be changed and display and non-display of an image can be switched depending on the angle between the housing 2941 and the housing 2942.

The semiconductor device of one embodiment of the present invention can be used for, for example, a driver circuit or an image processing portion of the display portion. When the semiconductor device of one embodiment of the present invention is used for the driver circuit or the image processing portion of the display portion, high-speed operation or signal processing can be achieved with low power consumption.

When an AI system using the semiconductor device of one embodiment of the present invention is used for the image processing portion of the video camera 2940, imaging appropriate for the surroundings of the video camera 2940 can be achieved. Specifically, imaging can be performed with optimal exposure for the surrounding brightness. In the case of performing imaging with backlighting or imaging under different brightness conditions such as indoors and outdoors at the same time, high-dynamic-range (HDR) imaging can be performed.

Furthermore, the AI system can learn the user's habit and assist in performing imaging. Specifically, the AI system can learn the user's camera shaking habit and correct the camera shaking during imaging, so that blurring of the obtained image associated with camera shaking can be reduced as much as possible. In the case of using a zoom function during imaging, the orientation of the lens or the like can be controlled such that a subject is positioned at the center of an image all the time.

Figure 32C:
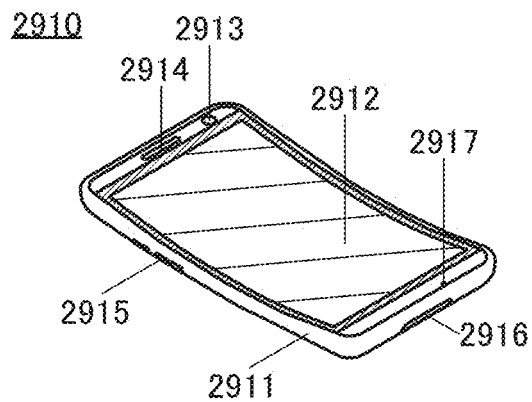

An information terminal 2910 illustrated in FIG. 32(C) includes a housing 2911, a display portion 2912, a microphone 2917, a speaker portion 2914, a camera 2913, an external connection portion 2916, operation switches 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

For example, a memory device using the semiconductor device of one embodiment of the present invention can retain control data, a control program, or the like of the information terminal 2910 for a long time.

When an AI system using the semiconductor device of one embodiment of the present invention is used for an image processing portion of the information terminal 2910, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Furthermore, the AI system can learn the user's habit and assist in operating the information terminal 2910. The information terminal 2910 into which the AI system is incorporated can predict touch input from the motion of the user's fingers, the user's sight line, or the like.

Figure 32D:
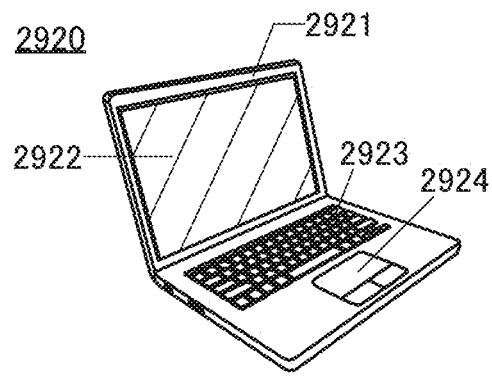

A laptop personal computer 2920 illustrated in FIG. 32(D) includes a housing 2921, a display portion 2922, a keyboard 2923, a pointing device 2924, and the like. The laptop personal computer 2920 also includes an antenna, a battery, and the like inside the housing 2921.

For example, a memory device using the semiconductor device of one embodiment of the present invention can retain control data, a control program, or the like of the laptop personal computer 2920 for a long time.

When an AI system using the semiconductor device of one embodiment of the present invention is used for an image processing portion of the laptop personal computer 2920, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Furthermore, the AI system can learn the user's habit and assist in operating the laptop personal computer 2920. The laptop personal computer 2920 into which the AI system is incorporated can predict touch input to the display portion 2922, from the motion of the user's fingers, the user's sit line, or the like. In inputting text, the AI system predicts input from the past input text data or a text or a diagram such as a photograph around the text, to assist conversion. Accordingly, input mistakes and conversion mistakes can be reduced as much as possible.

Figure 32E:
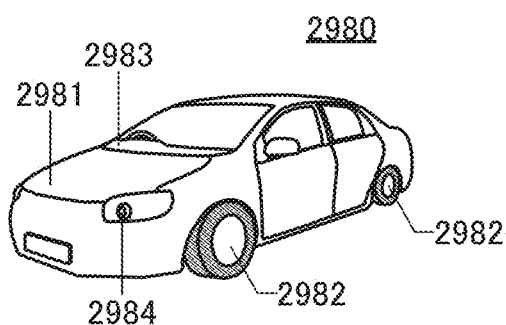
Figure 32F:
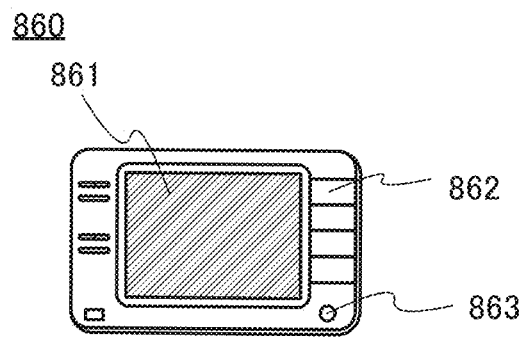

FIG. 32(E) is an external view illustrating an example of an automobile, and FIG. 32(F) illustrates a navigation device 860. An automobile 2980 includes a car body 2981, wheels 2982, a dashboard 2983, lights 2984, and the like. The automobile 2980 also includes an antenna, a battery, and the like. The navigation device 860 includes a display portion 861, operation buttons 862, and an external input terminal 863. The automobile 2980 and the navigation device 860 can be independent of each other; however, it is preferable that a structure be employed in which the navigation device 860 is incorporated into and linked to the automobile 2980.

For example, a memory device using the semiconductor device of one embodiment of the present invention can retain control data, a control program, or the like of the automobile 2980 or the navigation device 860 for a long time. When an AI system using the semiconductor device of one embodiment of the present invention is used for a control device or the like of the automobile 2980, the AI system can learn driver's driving skill and habit and assist in safe driving or driving involving efficient use of fuels such as gasoline or a battery. To assist in safe driving, the AI system learns not only driver's driving skill and habit, but also learns the behavior of the automobile such as the speed and movement of the automobile 2980, road information saved in the navigation device 860, and the like complexly; thus, driving lane departure can be prevented and collision with other automobiles, pedestrians, objects, and the like can be prevented. Specifically, when there is a sharp curve in the traveling direction, the navigation device 860 transmits the road information to the automobile 2980 so that the speed of the automobile 2980 can be controlled and steering can be assisted.

This embodiment can be implemented in an appropriate combination with the structures described in the other embodiments, other examples, and the like.

Example 1

A reduction in the carrier concentration of an oxide semiconductor due to introduction of nitrogen to the oxide semiconductor is described here. Specifically, Hall effect measurement was performed on an oxide semiconductor deposited in an atmosphere containing nitrogen, and the carrier concentration of the oxide semiconductor was calculated.

Sample B1 to Sample B4 fabricated are described below.

First, the oxide semiconductor was deposited to a thickness of 40 nm over a quartz substrate by a sputtering method. The oxide semiconductor was deposited under the following conditions: an In—Ga—Zn oxide target with In:Ga:Zn=3:1:2 [atomic ratio] was used, the pressure was 0.7 Pa, the distance between the substrate and the target was 60 nm, the direct-current power was 0.5 kW, and the substrate temperature was 200° C. Note that for Sample B1, the argon gas flow rate was 30 sccm and the oxygen gas flow rate was 15 sccm; for Sample B2, the argon gas flow rate was 30 sccm, the oxygen gas flow rate was 10 sccm, and the nitrogen flow rate was 5 sccm; for Sample B3, the argon gas flow rate was 30 sccm, the oxygen gas flow rate was 5 sccm, and the nitrogen flow rate was 10 sccm; and for Sample B4, the argon gas flow rate was 30 sccm and the nitrogen flow rate was 15 sccm.

Next, heat treatment was performed on Sample B1 to Sample B4 at 400° C. in an atmosphere containing nitrogen for one hour. Next, heat treatment was performed at 400° C. in an atmosphere containing oxygen for one hour.

Through the above process, Sample B1 to Sample B4 were fabricated.

Hall effect measurement was performed on Sample B1 to Sample B4 fabricated by the above method to calculate the carrier concentration of the oxide semiconductor. Here, the Hall effect measurement using the Van der Pauw method was performed. Note that ResiTest manufactured by TOYO Corporation was used for the Hall effect measurement.

Figure 33:
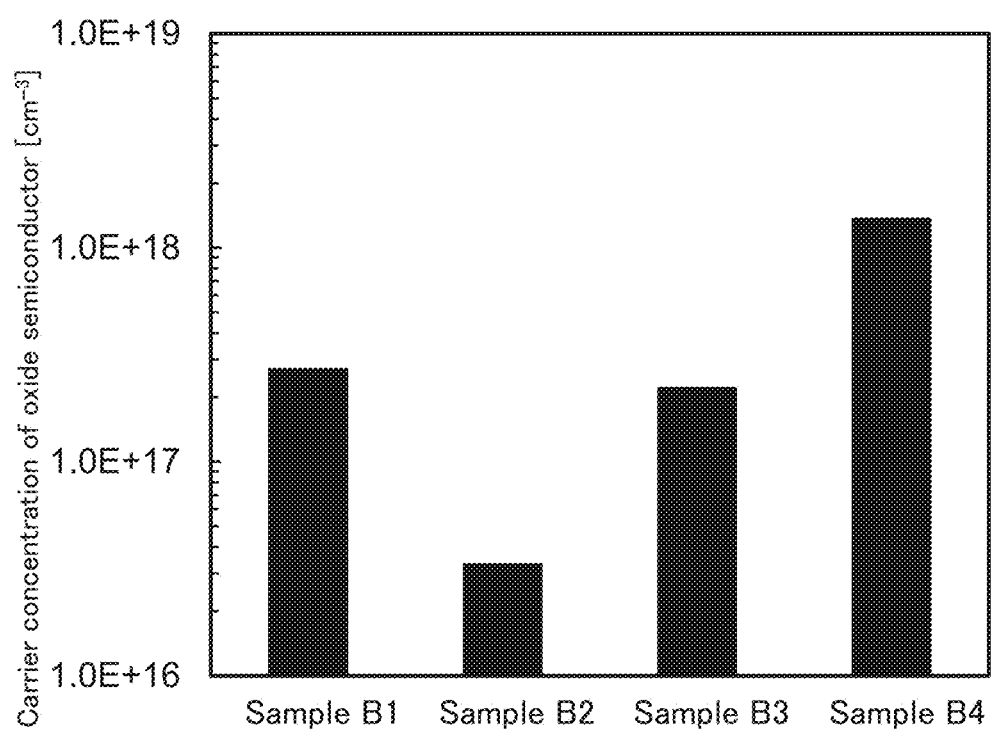
FIG. 33 A diagram showing the carrier concentrations of Sample B1 to Sample B4.
Figure 34A:
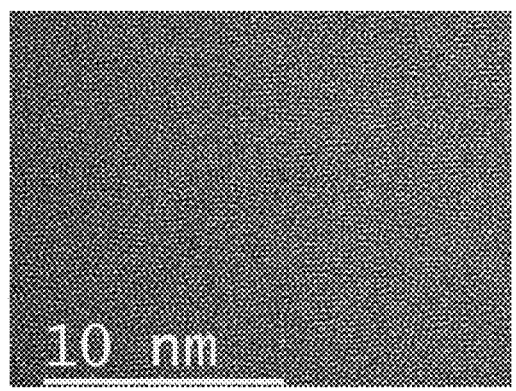
FIGS. 34A-34D Diagrams showing high-resolution cross-sectional TEM images of Sample C1.
Figure 34B:
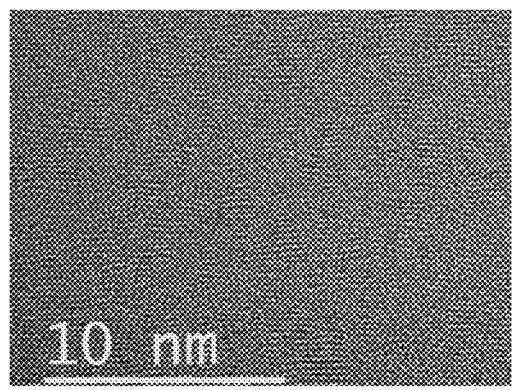
Figure 34C:
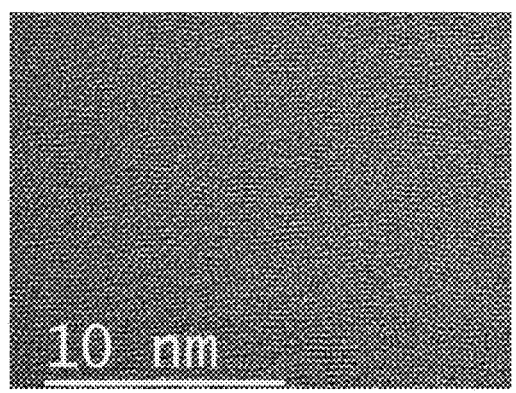
Figure 34D:
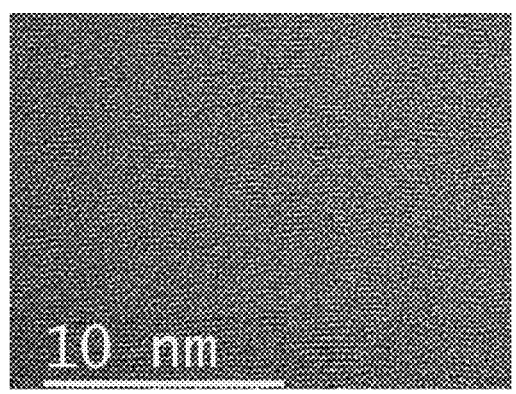
Figure 35A:
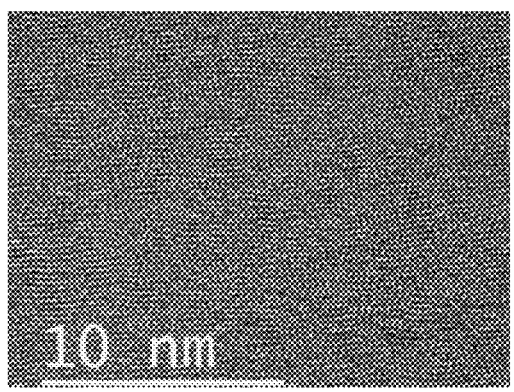
FIGS. 35A-35D Diagrams showing high-resolution cross-sectional TEM images of Sample C2.
Figure 35B:
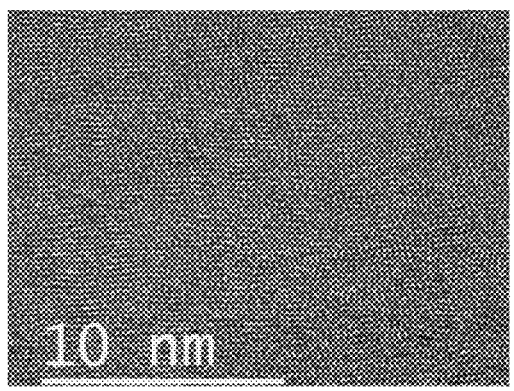
Figure 35C:
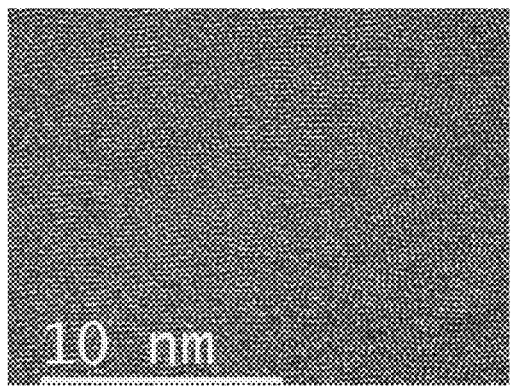
Figure 35D:
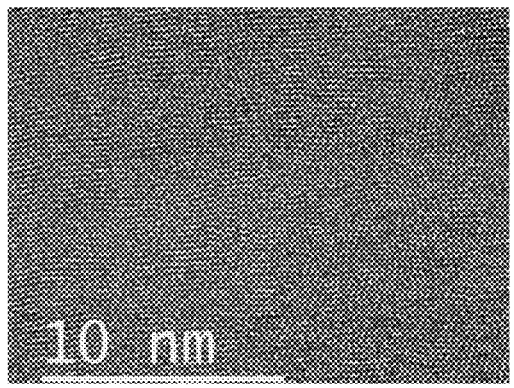
Figure 36A:
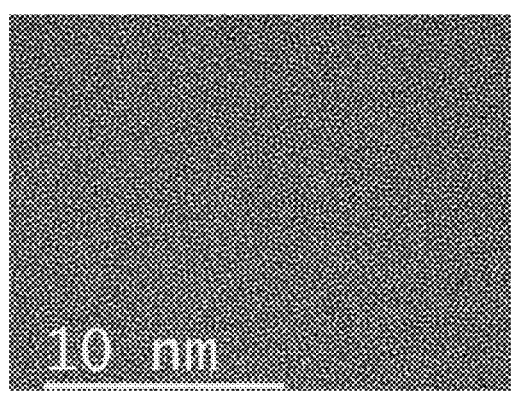
FIGS. 36A-36D Diagrams showing high-resolution cross-sectional TEM images of Sample C3.
Figure 36B:
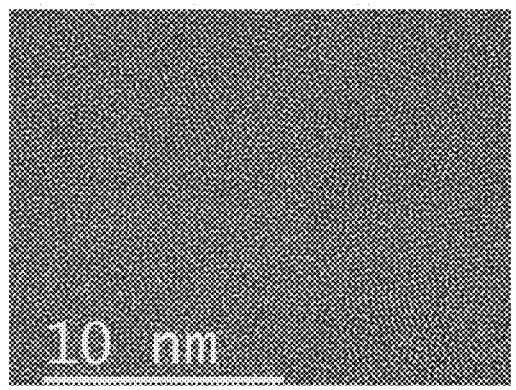
Figure 36C:
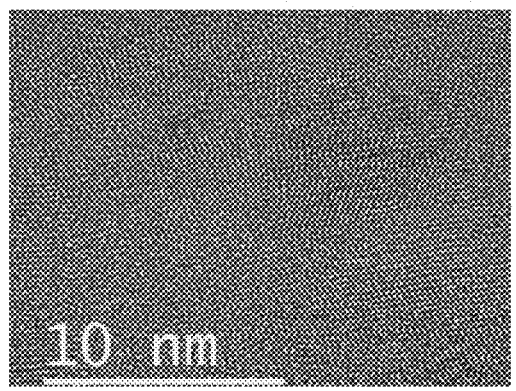
Figure 36D:
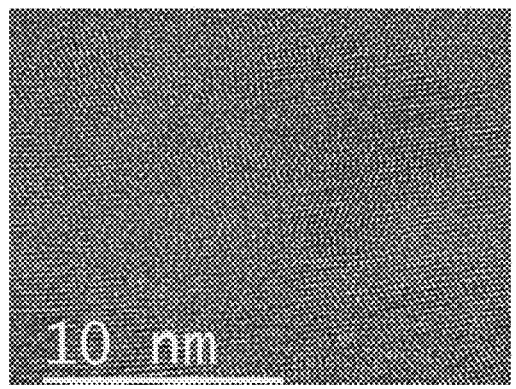

FIG. 33 shows the results of the Hall effect measurement on Sample B1 to Sample B4. The vertical axis represents the carrier concentration of the oxide semiconductor [$cm^{-3}$]. FIG. 33 reveals that the carrier concentrations in Sample B2 and Sample B3 were lower than that of Sample B1. It also reveals that the carrier concentration of Sample B4 was higher than that of Sample B1. Thus, the introduction of an appropriate amount of nitrogen into the oxide semiconductor enabled a reduction in the carrier concentration of the oxide semiconductor.

At least part of this example can be implemented in combination with the embodiments and the other example described in this specification as appropriate.

Example 2

Here, the structural stability of the oxide semiconductor into which nitrogen is introduced is described. Specifically, a high-resolution cross-sectional TEM image of an oxide semiconductor film deposited in an atmosphere containing nitrogen was obtained as a moving image in the time period before electron beam irradiation to its end, and a structural change of the oxide semiconductor film with respect to the cumulative electron dose was examined.

Sample C1 to Sample C3 fabricated are described below.

First, the oxide semiconductor was deposited to a thickness of 40 nm over a quartz substrate by a sputtering method. The oxide semiconductor was deposited under the following conditions: an In—Ga—Zn oxide target with In:Ga:Zn=3:1:2 [atomic ratio] was used, the pressure was 0.7 Pa, the distance between the substrate and the target was 60 nm, the direct-current power was 0.5 kW, and the substrate temperature was 200° C. Note that for Sample C1, the argon gas flow rate was 30 sccm and the oxygen gas flow rate was 15 sccm; for Sample C2, the argon gas flow rate was 30 sccm, the oxygen gas flow rate was 10 sccm, and the nitrogen flow rate was 5 sccm; and for Sample C3, the argon gas flow rate was 30 sccm and the nitrogen flow rate was 15 sccm.

In this manner, Sample C1 to Sample C3 were fabricated.

A high-resolution cross-sectional TEM image of Sample C1 to Sample C3 fabricated in the above method was obtained as a moving image in the time period before electron beam irradiation was performed and after 130 seconds elapsed while the electron beam irradiation was performed. Then, the high-resolution cross-sectional TEM image observed in the obtained moving image was converted into a still image. The converted still image was analyzed, and a structural change of the oxide semiconductor film with respect to the cumulative electron dose was examined. Note that JEM-ARM200F manufactured by JEOL Ltd. was used for the electron beam irradiation and the observation of the high-resolution cross-sectional TEM image. As the conditions of electron beam irradiation, the accelerating voltage was 200 kV and the current density was $3.0 \times 10^6$ $e^-/(nm^2 \cdot s)$. Here, the cumulative electron ($e^-$) dose is calculated from the product of the current density and the time for the electron beam irradiation.

FIG. 34 to FIG. 36 show the high-resolution cross-sectional TEM images of Sample C1 to Sample C3 with respect to the cumulative electron dose. FIG. 34 shows the high-resolution cross-sectional TEM images of Sample C1, FIG. 35 shows the high-resolution cross-sectional TEM images of Sample C2, and FIG. 36 shows the high-resolution cross-sectional TEM images of Sample C3. In addition, in FIG. 34 to FIG. 36, (A) of each drawing is a high-resolution cross-sectional TEM image right before the electron beam irradiation was performed, (B) of each drawing is a high-resolution cross-sectional TEM image after 40 seconds elapsed while the electron beam irradiation was performed, (C) of each drawing is a high-resolution cross-sectional TEM image after 80 seconds elapsed while the electron beam irradiation was performed, and (D) of each drawing is a high-resolution cross-sectional TEM image after 120 seconds elapsed while the electron beam irradiation was performed. In other words, in FIG. 34 to FIG. 36, the cumulative electron ($e^-$) dose is 0.0 $e^-/nm^2$ in (A) of each drawing, $1.2 \times 10^8$ $e^-/nm^2$ in (B) of each drawing, $2.4 \times 10^8$ $e^-/nm^2$ in (C) of each drawing, and $3.6 \times 10^8$ $e^-/nm^2$ in (D) of each drawing.

As shown in FIG. 34 and FIG. 35, no significant structural changes in the oxide semiconductor films of Sample C1 and Sample C2 were observed at a cumulative electron dose up to $3.6 \times 10^8$ $e^-/nm^2$. By contrast, a structural change in the oxide semiconductor film of Sample C3 was observed at a cumulative electron dose of $2.4 \times 10^8$ $e^-/nm^2$ (see FIG. 36(C)). Furthermore, a significant structural change in the oxide semiconductor film was observed at a cumulative electron dose of $3.6 \times 10^8$ $e^-/nm^2$ (see FIG. 36(D)). This demonstrates that the introduction of an appropriate amount of nitrogen into the oxide semiconductor prevents crystallization or damage to the crystalline structure due to electron beam irradiation during observation with an electron microscope.

At least part of this example can be implemented in combination with the embodiments and the other example described in this specification as appropriate.

REFERENCE NUMERALS

200: transistor, 203: conductor, 205: conductor, 205a: conductor, 205b: conductor, 210: insulator, 212: insulator, 214: insulator, 216: insulator, 220: insulator, 222: insulator, 224: insulator, 230: oxide, 230a: oxide, 230b: oxide, 230c: oxide, 230C: oxide film, 235: oxide, 235a: oxide, 235b: oxide, 240: conductor, 240a: conductor, 240A: conductor, 240b: conductor, 245: insulator, 245a: insulator, 245b: insulator, 246: conductor, 246a: conductor, 246b: conductor, 250: insulator, 250A: insulating film, 260: conductor, 260a: conductor, 260A: conductive film, 260b: conductor, 260B: conductive film, 270: insulator, 274: insulator, 274A: insulating film, 276: insulator, 276a: insulator, 276b: insulator, 280: insulator, 280A: insulating film, 282: insulator, 283: insulator, 284: insulator, 290: dummy gate.

The invention claimed is:

1. A semiconductor material that is an oxide comprising a plurality of metal elements and nitrogen,
   wherein the plurality of metal elements are indium, an element M, and zinc,
   wherein the element M is aluminum, gallium, yttrium, or tin, and
   wherein the nitrogen is taken into an oxygen vacancy or bonded to an atom of one of the plurality of metal elements.

2. The semiconductor material according to claim 1, wherein a carrier concentration of the oxide is lower than $5 \times 10^{17}$ $cm^{-3}$.

3. The semiconductor material according to claim 1, wherein a proportion of the number of atoms of the nitrogen in the oxide is lower than 1.2 atomic %.

4. The semiconductor material according to claim 1, wherein no structural change in the oxide is observed when the oxide is irradiated with an electron and when a cumulative electron dose of the electron is less than or equal to $3.6\times10^8$ e$^-$/nm$^2$.

5. The semiconductor material according to claim 1,
wherein the oxide comprises cerium.

6. A semiconductor device comprising a transistor,
wherein the transistor comprises:
  an oxide;
  a first insulator over the oxide; and
  a conductor over the first insulator,
wherein the oxide comprises a plurality of metal elements and nitrogen,
wherein the plurality of metal elements are indium, an element M, and zinc,
wherein the element M is aluminum, gallium, yttrium, or tin, and
wherein the nitrogen is taken into an oxygen vacancy or bonded to an atom of one of the plurality of metal elements.

7. The semiconductor device according to claim 6,
wherein a carrier concentration of the oxide is lower than $5\times10^{17}$ cm$^{-3}$.

8. The semiconductor device according to claim 6,
wherein a proportion of the number of atoms of the nitrogen in the oxide is lower than 1.2 atomic %.

9. A semiconductor device comprising a transistor,
wherein the transistor comprises a first oxide, a second oxide, a first conductor, a second conductor, a third conductor, a first insulator, and a second insulator,
wherein the first oxide comprises a first region, a second region, and a third region in contact with the first region and the second region,
wherein the first region overlaps with the first conductor,
wherein the second region overlaps with the second conductor,
wherein the third region comprises a region overlapping with the third conductor with the first insulator and the second oxide positioned therebetween,
wherein the second insulator comprises an opening that exposes a side surface of the first conductor, a side surface of the second conductor, and the third region,
wherein the third conductor is placed in the opening with the second oxide and the first insulator positioned therebetween,
wherein the first oxide comprises a plurality of metal elements and nitrogen,
wherein the plurality of metal elements are indium, an element M, and zinc,
wherein the element M is aluminum, gallium, yttrium, or tin, and
wherein the nitrogen is taken into an oxygen vacancy or bonded to an atom of one of the plurality of metal elements.

10. The semiconductor device according to claim 9,
wherein the first oxide comprises cerium.

11. The semiconductor device according to claim 9,
wherein a carrier concentration of the first oxide is lower than $5\times10^{17}$ cm$^{-3}$.

12. The semiconductor device according to claim 9,
wherein a proportion of the number of atoms of the nitrogen in the first oxide is lower than 1.2 atomic %.

13. The semiconductor device according to claim 9,
wherein no structural change in the first oxide is observed when the oxide is irradiated with an electron and when a cumulative electron dose of the electron is less than or equal to $3.6\times10^8$ e$^-$/nm$^2$.

14. A semiconductor device comprising a transistor,
wherein the transistor comprises a first oxide, a second oxide, a first conductor, a second conductor, a third conductor, a first insulator, a second insulator, and a third insulator,
wherein the first oxide comprises a first region, a second region, and a third region in contact with the first region and the second region,
wherein the first region overlaps with the first conductor,
wherein the second region overlaps with the second conductor,
wherein the third region comprises a region overlapping with the third conductor with the first insulator and the second oxide positioned therebetween,
wherein the second insulator overlaps with the first conductor and the second conductor with the third insulator positioned therebetween and comprises an opening that exposes a side surface of the first conductor, a side surface of the second conductor, and the third region,
wherein the third conductor is placed in the opening with the third insulator, the second oxide, and the first insulator positioned therebetween,
wherein the first oxide comprises a plurality of metal elements and nitrogen,
wherein the plurality of metal elements are indium, an element M, and zinc,
wherein the element M is aluminum, gallium, yttrium, or tin, and
wherein the nitrogen is taken into an oxygen vacancy or bonded to an atom of one of the plurality of metal elements.

15. The semiconductor device according to claim 14,
wherein the first oxide comprises cerium.

16. The semiconductor device according to claim 14,
wherein a carrier concentration of the first oxide is lower than $5\times10^{17}$ cm$^{-3}$.

17. A semiconductor device comprising a transistor,
wherein the transistor comprises a first oxide, a second oxide, a third oxide, a fourth oxide, a first conductor, a second conductor, a third conductor, a first insulator, and a second insulator,
wherein the first oxide comprises a first region, a second region, and a third region in contact with the first region and the second region,
wherein the first region overlaps with the first conductor with the third oxide positioned therebetween,
wherein the second region overlaps with the second conductor with the fourth oxide positioned therebetween,
wherein the third region comprises a region overlapping with the third conductor with the first insulator and the second oxide positioned therebetween,
wherein the second insulator comprises an opening that exposes the third region,
wherein a side surface of the opening and a side surface of the first conductor or the second conductor are on one plane,
wherein the third conductor is placed in the opening with the second oxide and the first insulator positioned therebetween,
wherein the first oxide comprises a plurality of metal elements and nitrogen,
wherein the plurality of metal elements are indium, an element M, and zinc,
wherein the element M is aluminum, gallium, yttrium, or tin, and wherein the nitrogen is taken into an oxygen vacancy or bonded to an atom of one of the plurality of metal elements.

18. The semiconductor device according to claim 17,
wherein the third oxide and the fourth oxide have a higher cerium content than the first oxide.

19. A semiconductor device comprising a transistor,
wherein the transistor comprises a first oxide, a second oxide, a third oxide, a fourth oxide, a first conductor, a second conductor, a third conductor, a first insulator, a second insulator, and a third insulator,
wherein the first oxide comprises a first region, a second region, and a third region in contact with the first region and the second region,
wherein the first region overlaps with the first conductor with the third oxide positioned therebetween,
wherein the second region overlaps with the second conductor with the fourth oxide positioned therebetween,
wherein the third region comprises a region overlapping with the third conductor with the first insulator and the second oxide positioned therebetween,
wherein the second insulator overlaps with the first conductor and the second conductor with the third insulator positioned therebetween and comprises an opening that exposes a side surface of the first conductor, a side surface of the second conductor, and the third region,
wherein the third conductor is placed in the opening with the third insulator, the second oxide, and the first insulator positioned therebetween,
wherein the first oxide comprises a plurality of metal elements and nitrogen,
wherein the plurality of metal elements are indium, an element M, and zinc,
wherein the element M is aluminum, gallium, yttrium, or tin, and
wherein the nitrogen is taken into an oxygen vacancy or bonded to an atom of one of the plurality of metal elements.

20. The semiconductor device according to claim 19,
wherein the third oxide and the fourth oxide have a higher cerium content than the first oxide.

* * * * *